(12) United States Patent
Kai et al.

(10) Patent No.: US 10,950,626 B2
(45) Date of Patent: *Mar. 16, 2021

(54) THREE-DIMENSIONAL MEMORY DEVICE CONTAINING ALTERNATING STACK OF SOURCE LAYERS AND DRAIN LAYERS AND VERTICAL GATE ELECTRODES

(71) Applicant: SANDISK TECHNOLOGIES LLC, Addison, TX (US)

(72) Inventors: James Kai, Santa Clara, CA (US); Johann Alsmeier, San Jose, CA (US); Murshed Chowdhury, Fremont, CA (US); Raiden Matsuno, Fremont, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 16 days.

This patent is subject to a terminal disclaimer.

(21) Appl. No.: 16/539,124

(22) Filed: Aug. 13, 2019

(65) Prior Publication Data

US 2021/0050360 A1    Feb. 18, 2021

(51) Int. Cl.

| | |
|---|---|
| *H01L 29/423* | (2006.01) |
| *H01L 29/66* | (2006.01) |
| *H01L 29/792* | (2006.01) |
| *H01L 29/732* | (2006.01) |
| *H01L 27/11582* | (2017.01) |
| *G11C 5/06* | (2006.01) |

(Continued)

(52) U.S. Cl.
CPC ...... *H01L 27/11582* (2013.01); *G11C 5/063* (2013.01); *H01L 27/1157* (2013.01); *H01L 27/11565* (2013.01)

(58) Field of Classification Search
CPC .......... H01L 21/8221; H01L 27/11524; H01L 27/11556; H01L 27/11565; H01L 27/1157; H01L 27/11575; H01L 27/11582; H01L 29/66666; H01L 29/66825; H01L 29/7827; H01L 29/78642; H01L 29/7889; H01L 29/7926
See application file for complete search history.

(56) References Cited

U.S. PATENT DOCUMENTS

| | | | |
|---|---|---|---|
| 8,823,076 B2 | 9/2014 | Lee et al. | |
| 8,853,765 B2 | 10/2014 | Lee et al. | |

(Continued)

OTHER PUBLICATIONS

Copending Application 16/539103.*

(Continued)

*Primary Examiner* — David C Spalla
(74) *Attorney, Agent, or Firm* — The Marbury Law Group PLLC

(57) ABSTRACT

A three-dimensional memory device includes an alternating stack of source layers and drain layers located over a substrate, gate electrodes vertically extending through each of the source layers and the drain layers of the alternating stack, memory films laterally surrounding a respective one of the gate electrodes, and semiconductor channels laterally surrounding a respective one of the memory films and connected to a respective vertically neighboring pair of a source layer and a drain layer. An array of memory openings can vertically extend through the alternating stack, and each of the gate electrodes can be located within a respective one of the memory openings.

20 Claims, 57 Drawing Sheets

(51) Int. Cl.
*H01L 27/11565* (2017.01)
*H01L 27/1157* (2017.01)

(56) References Cited

U.S. PATENT DOCUMENTS

| | | | |
|---|---|---|---|
| 8,981,457 | B2 | 3/2015 | Lee et al. |
| 9,171,857 | B2 | 10/2015 | Lee et al. |
| 9,355,727 | B1 | 5/2016 | Zhang et al. |
| 9,356,034 | B1 | 5/2016 | Yada et al. |
| 9,502,471 | B1 | 11/2016 | Lu et al. |
| 9,559,110 | B2 | 1/2017 | Lee |
| 9,576,971 | B2 | 2/2017 | Zhang et al. |
| 9,935,050 | B2 | 4/2018 | Dunga et al. |
| 9,941,299 | B1 | 4/2018 | Chen et al. |
| 10,008,511 | B2 | 6/2018 | Lee |
| 10,121,553 | B2 * | 11/2018 | Harari ............... G11C 16/3431 |
| 10,192,877 | B2 | 1/2019 | Norizuki et al. |
| 10,355,007 | B2 | 7/2019 | Costa et al. |
| 10,685,978 | B1 | 6/2020 | Lu et al. |
| 2002/0028541 | A1 * | 3/2002 | Lee ................. H01L 27/11556 438/149 |
| 2012/0206979 | A1 | 8/2012 | Shin et al. |
| 2013/0292630 | A1 | 11/2013 | Sasago et al. |
| 2014/0151638 | A1 | 6/2014 | Chang et al. |
| 2014/0151639 | A1 | 6/2014 | Chang et al. |
| 2014/0264482 | A1 | 9/2014 | Li et al. |
| 2015/0004765 | A1 | 1/2015 | Li et al. |
| 2015/0060997 | A1 | 3/2015 | Basu et al. |
| 2015/0117090 | A1 | 4/2015 | Kim et al. |
| 2016/0099329 | A1 | 4/2016 | Basu et al. |
| 2016/0322381 | A1 | 11/2016 | Liu et al. |
| 2017/0062523 | A1 | 3/2017 | Sekino et al. |
| 2017/0098660 | A1 * | 4/2017 | Ramaswamy .... H01L 29/78391 |
| 2017/0117389 | A1 | 4/2017 | Cheng et al. |
| 2017/0278859 | A1 | 9/2017 | Sharangpani et al. |
| 2017/0287926 | A1 | 10/2017 | Ariyoshi |
| 2018/0040623 | A1 | 2/2018 | Kanakamedala et al. |
| 2018/0040627 | A1 | 2/2018 | Kanakamedala et al. |
| 2018/0053694 | A1 | 2/2018 | Cheng et al. |
| 2018/0197876 | A1 | 7/2018 | Ge et al. |
| 2018/0331232 | A1 | 11/2018 | Frougier et al. |
| 2019/0067375 | A1 | 2/2019 | Karda et al. |
| 2019/0096904 | A1 | 3/2019 | Noguchi et al. |
| 2019/0139973 | A1 | 5/2019 | Zhou et al. |
| 2019/0157293 | A1 | 5/2019 | Jang et al. |
| 2019/0214395 | A1 | 7/2019 | Zhang et al. |
| 2019/0319100 | A1 | 10/2019 | Chen et al. |

OTHER PUBLICATIONS

Y. Hsiao et al., A critical examination of 3D stackable NAND Flash memory architectures by simulation study of the scaling capability, Proceedings of 2010 IEEE International Memory Workshop, 978-1-4244-6721-1, Date of Conference: May 16-19, 2010, Seoul, S. Korea.
C. Chen et al., A Highly Pitch Scalable 3D Vertical Gate (VG) NAND Flash Decoded by a Novel Self-Aligned Independently Controlled Double Gate (IDG) String Select Transistor (SSL), 2012 Symp. On VLSI Technology Digest of Technical Papers, pp. 91-92.
U.S. Appl. No. 15/971,293, filed May 4, 2018, SanDisk Technologies LLC.
U.S. Appl. No. 16/227,889, filed Dec. 20, 2018, SanDisk Technologies LLC.
U.S. Appl. No. 16/457,687, filed Jun. 27, 2019, SanDisk Technologies LLC.
U.S. Appl. No. 16/457,721, filed Jun. 28, 2019, SanDisk Technologies LLC.
U.S. Appl. No. 16/249,300, filed Jan. 16, 2019, SanDisk Technologies LLC.
U.S. Appl. No. 16/291,673, filed Mar. 4, 2019, SanDisk Technologies LLC.
U.S. Appl. No. 16/454,458, filed Jun. 27, 2019, SanDisk Technologies LLC.
U.S. Appl. No. 16/454,475, filed Jun. 27, 2019, SanDisk Technologies LLC.
U.S. Appl. No. 16/456,736, filed Jun. 28, 2019, SanDisk Technologies LLC.
Notification of Transmittal of the International Search Report and Written Opinion of the International Search Authority for International Patent Application No. PCT/US2020/023529, dated Jul. 8, 2020, 10 pages.
Kai, J. et al., "Three-Dimensional Memory Device Containing Alternating Stack of Source Layers and Drain Layers and Vertical Gate Electrodes," U.S. Appl. No. 16/539,103, filed Aug. 13, 2019.
USPTO Office Communication, Non-Final Office Action for U.S. Appl. No. 16/539,103, dated Sep. 28, 2020, 37 pages.

* cited by examiner

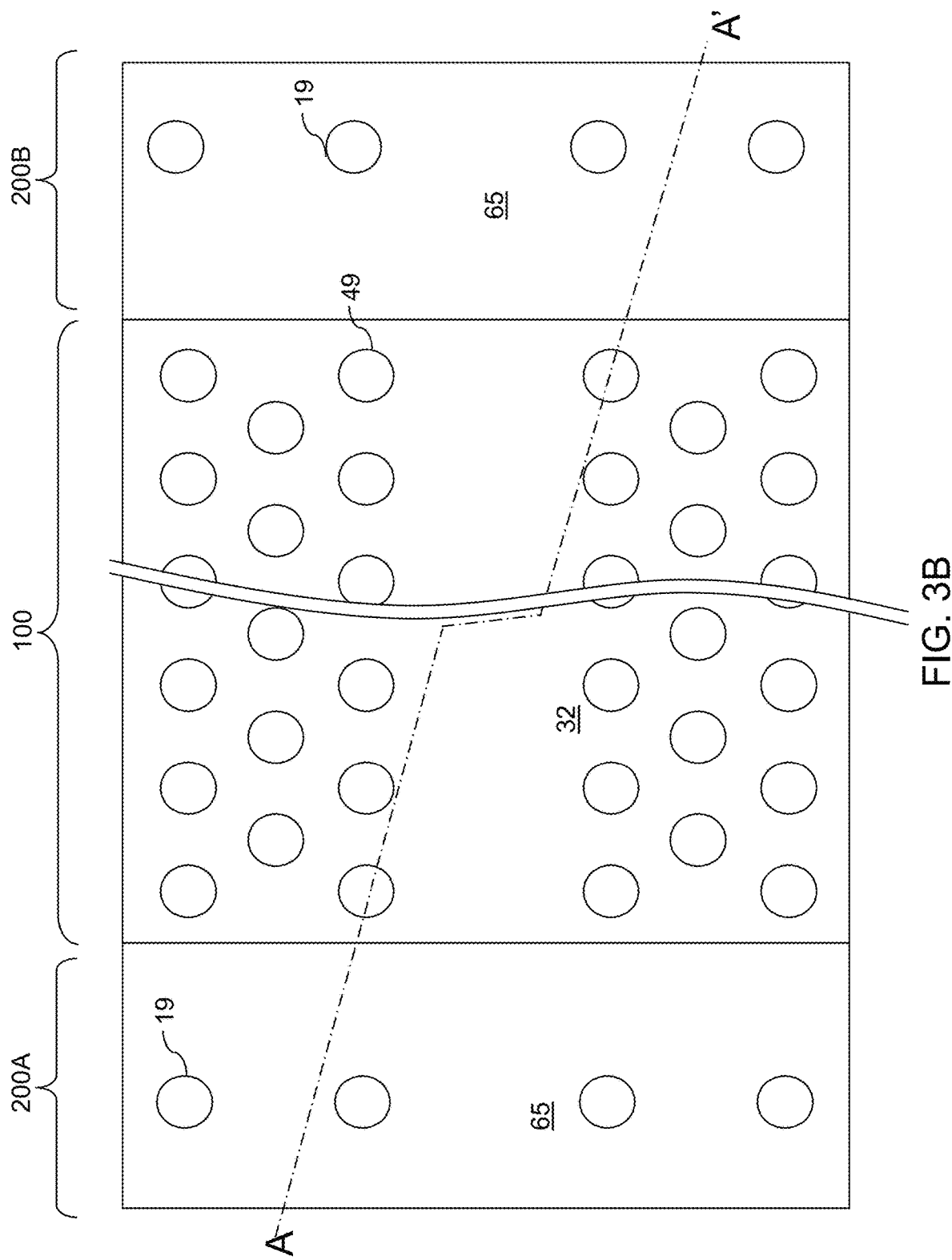

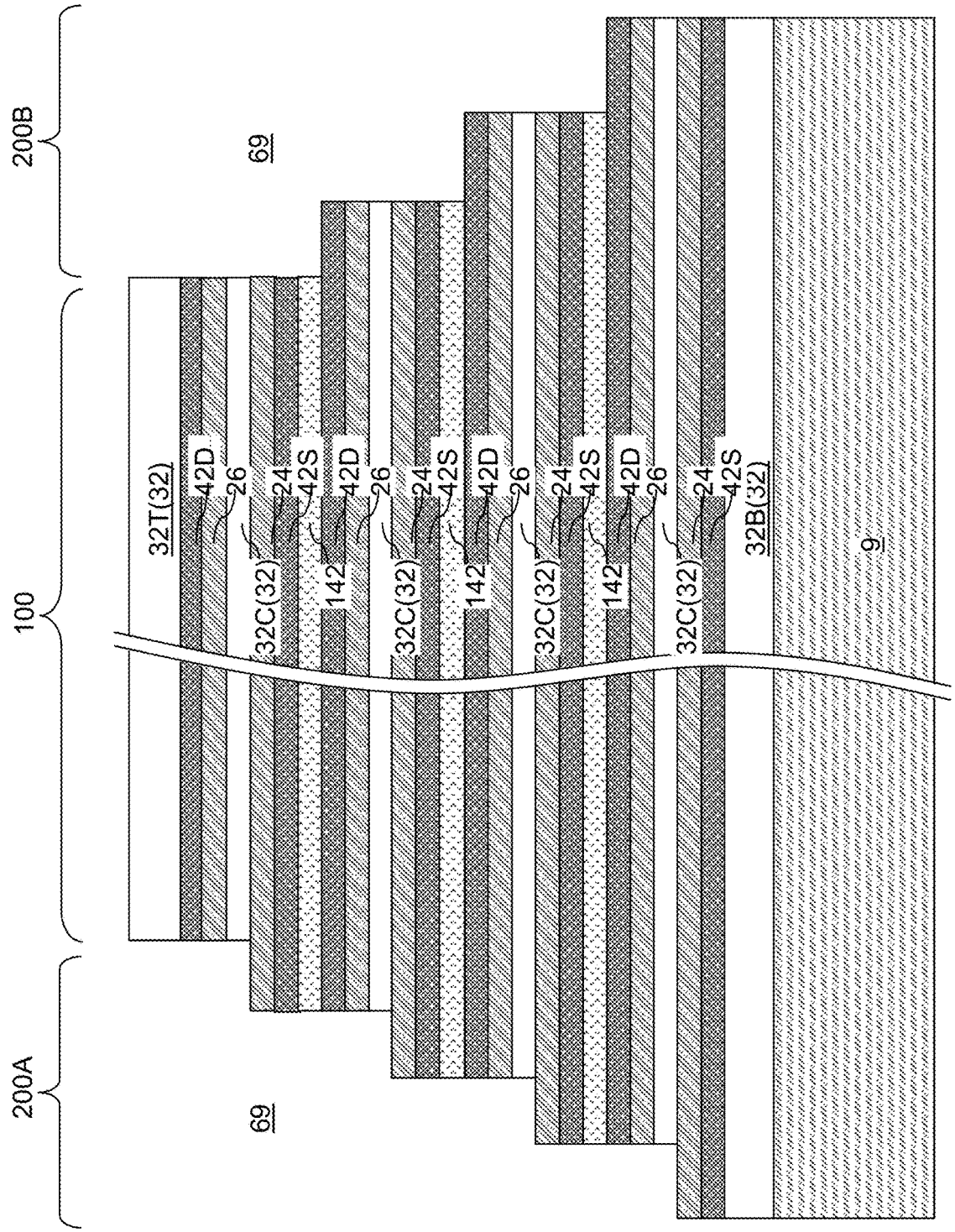

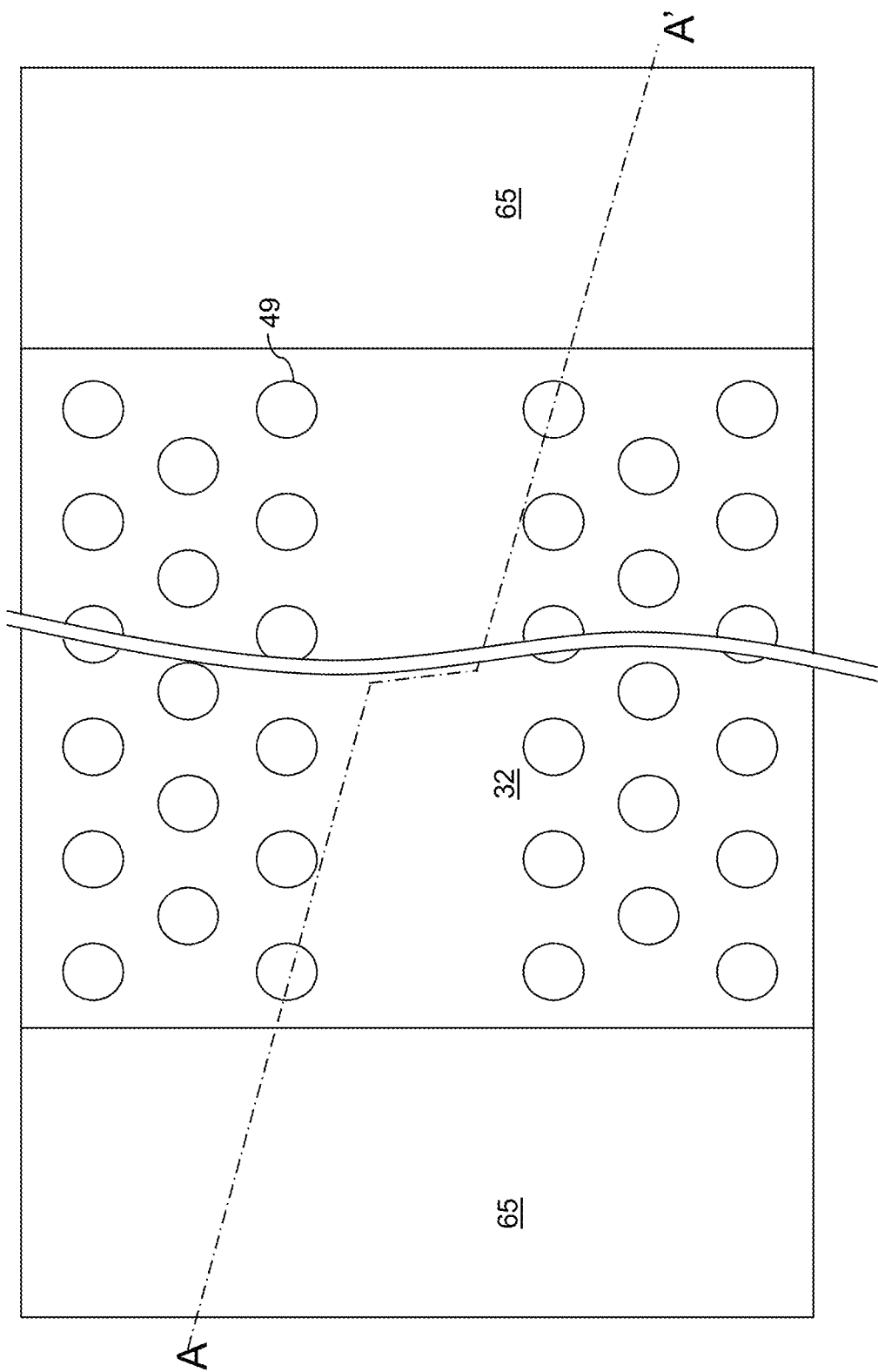

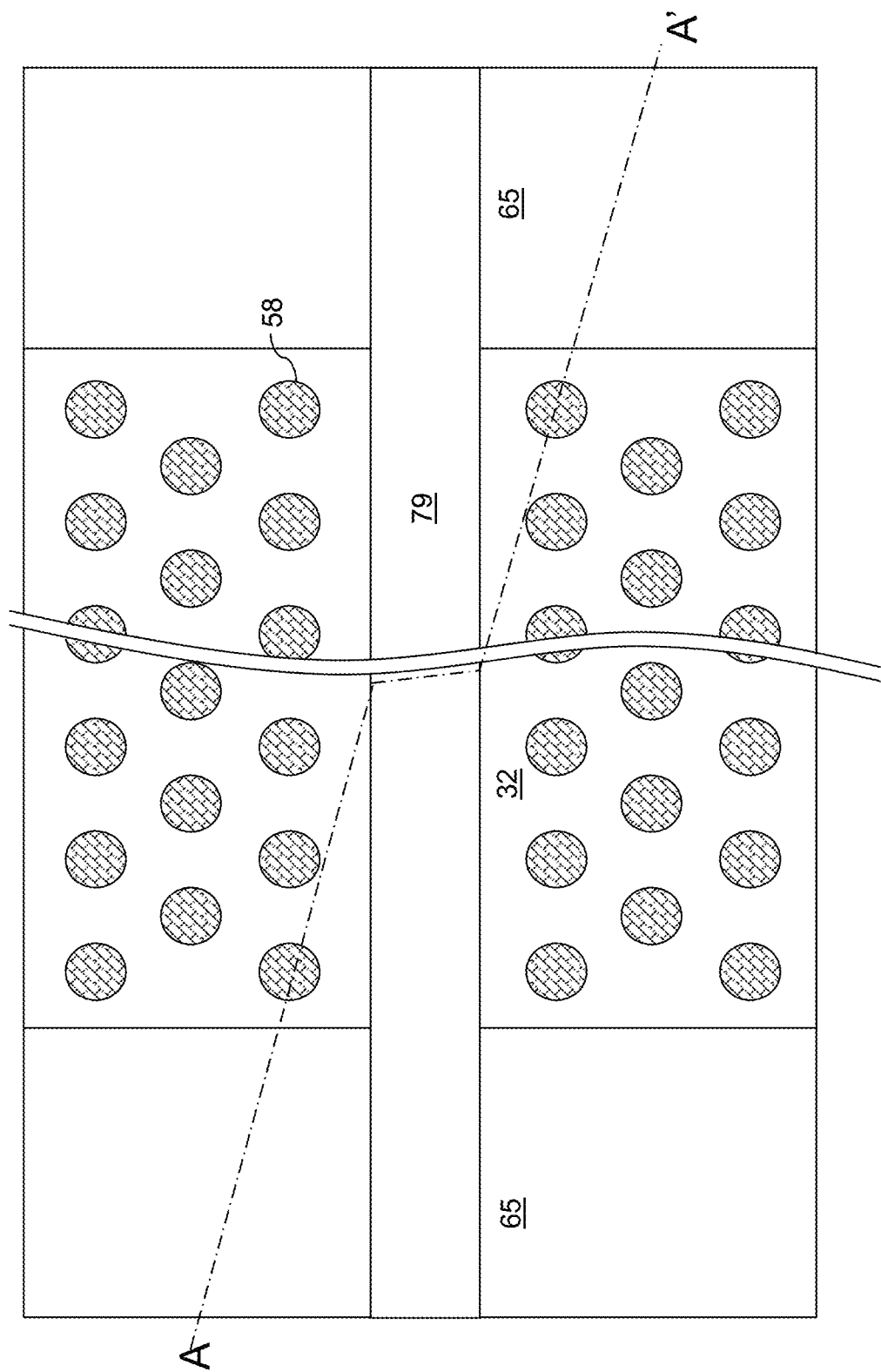

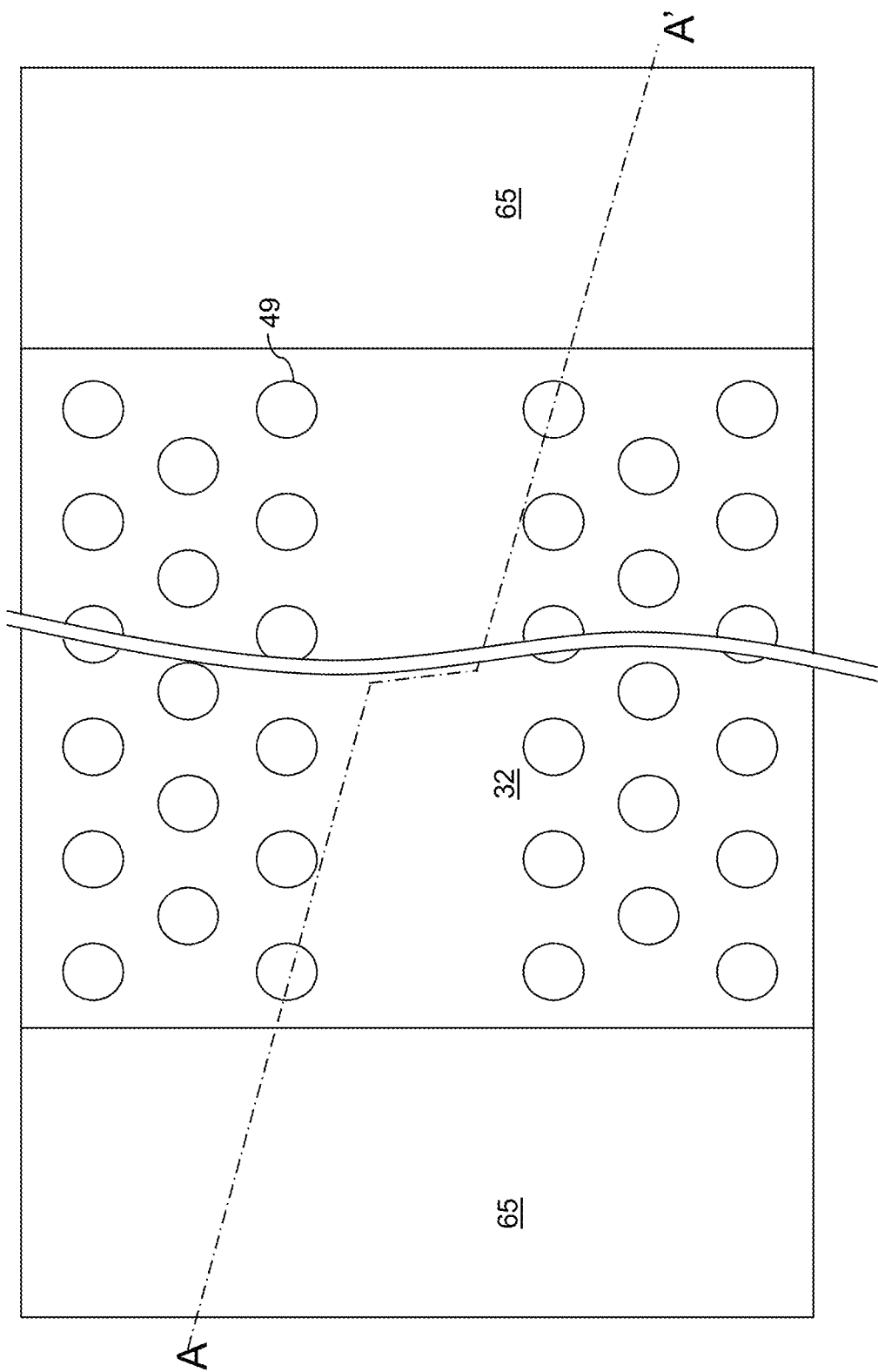

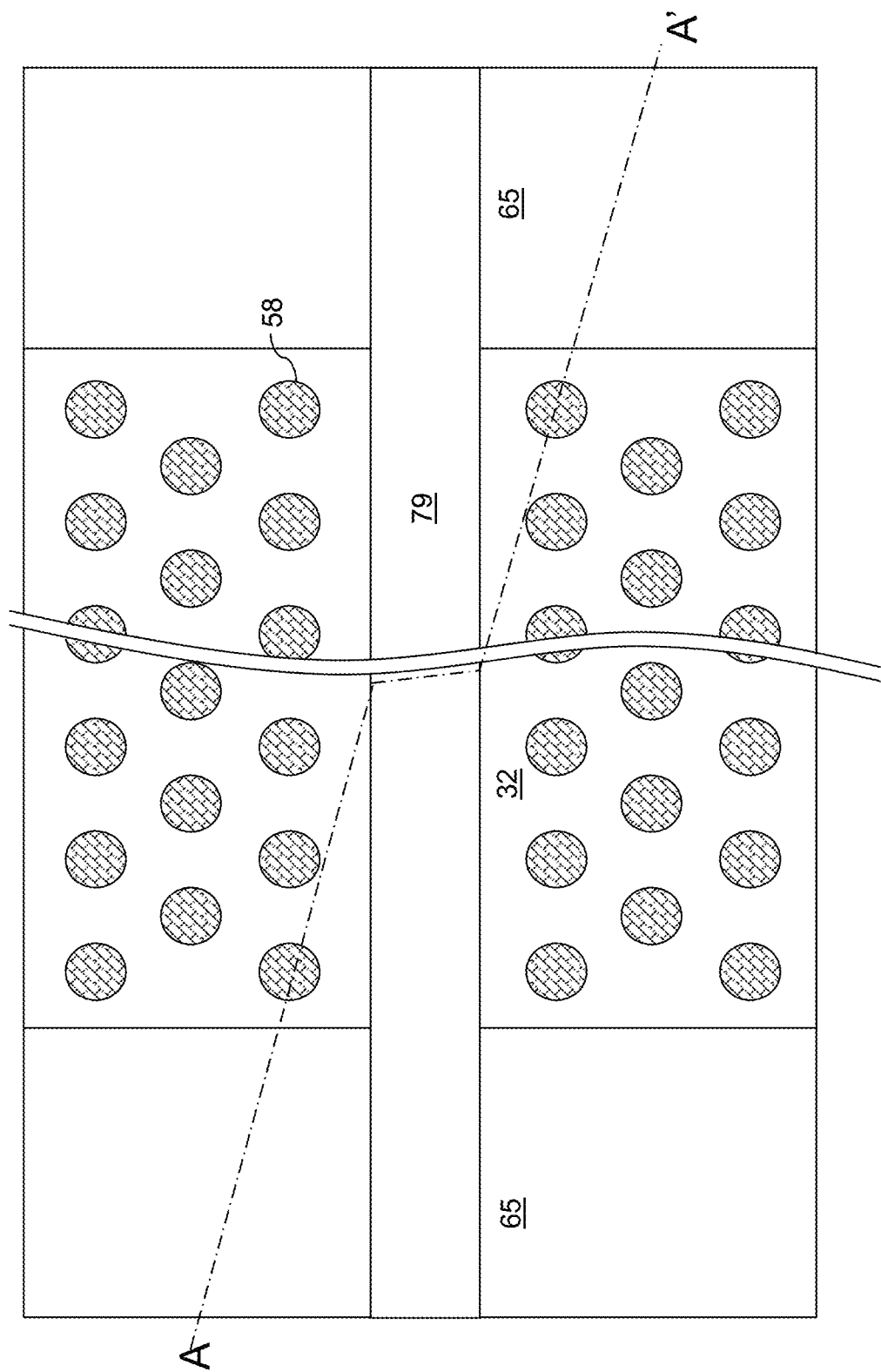

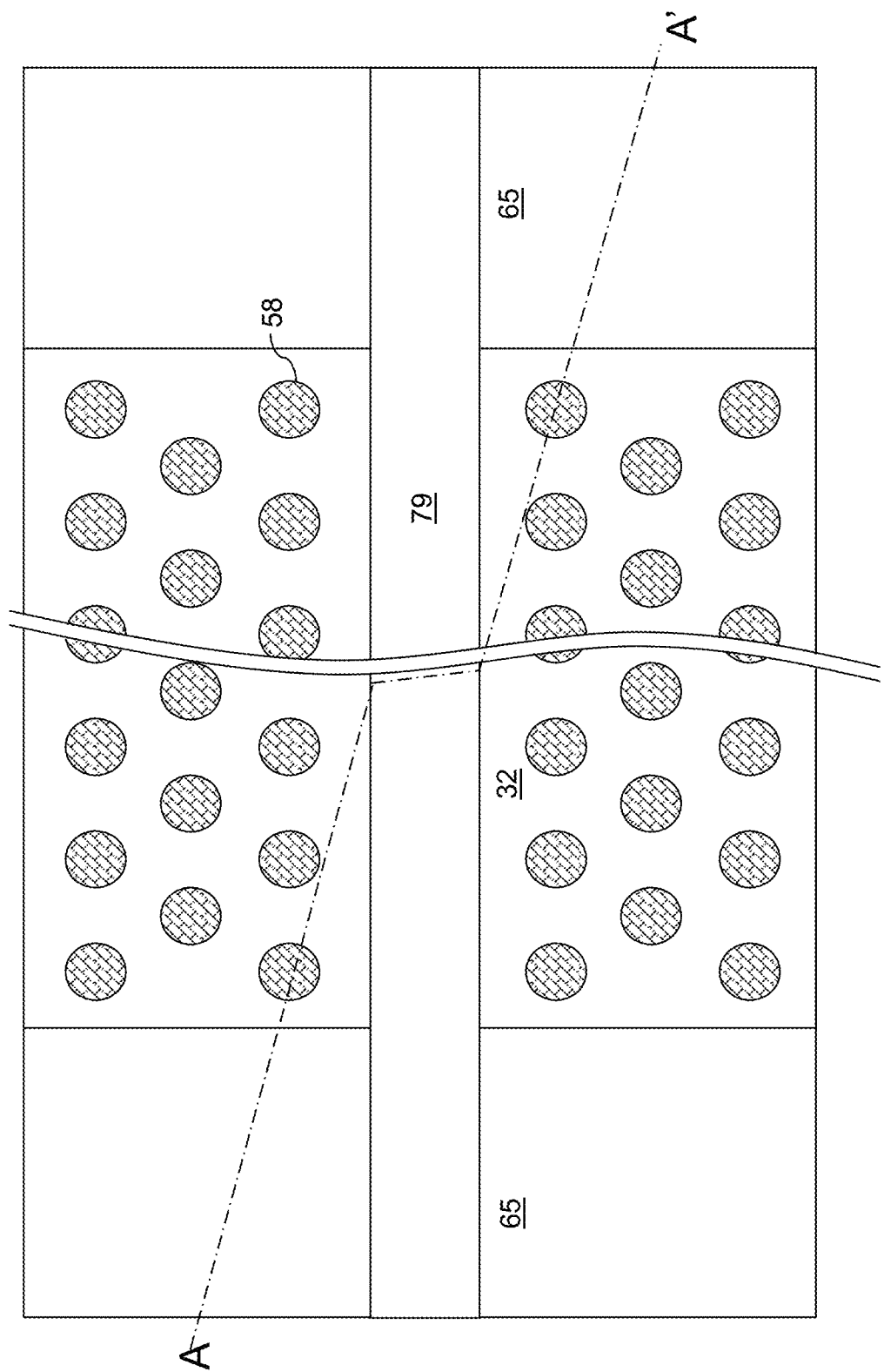

US 10,950,626 B2

THREE-DIMENSIONAL MEMORY DEVICE CONTAINING ALTERNATING STACK OF SOURCE LAYERS AND DRAIN LAYERS AND VERTICAL GATE ELECTRODES

FIELD

The present disclosure relates generally to the field of semiconductor devices, and particular to a three-dimensional memory device containing an alternating stack of source layers and drain layers and vertical gate electrodes and methods of manufacturing the same.

BACKGROUND

A typical three-dimensional NAND memory device includes an alternating stack of word lines and insulating layers located over a substrate. Vertical semiconductor channels surrounded by memory films containing a charge storage layer located between blocking and tunneling dielectric layers extend vertically in memory openings through the alternating stack. Bit lines are electrically connected to drain regions located at the top of the semiconductor channels, while a source line or interconnect is electrically connected to source regions located at a bottom part of the vertical semiconductor channels.

SUMMARY

According to an aspect of the present disclosure, a three-dimensional memory device comprises an alternating stack of source layers and drain layers located over a substrate, gate electrodes vertically extending through each of the source layers and the drain layers of the alternating stack, memory films, each laterally surrounding a respective one of the gate electrodes, and semiconductor channels, each laterally surrounding a respective one of the memory films and contacting sidewalls of a respective vertically neighboring pair of a source layer of the source layers and a drain layer of the drain layers.

According to another aspect of the present disclosure, a method of forming a three-dimensional memory device comprises forming an alternating stack of doped semiconductor source layers and doped semiconductor drain layers over a substrate, forming memory openings vertically extending through the alternating stack, forming a continuous semiconductor channel layer in each memory opening, wherein semiconductor channels are formed on sidewalls of a respective vertically neighboring pair of a doped semiconductor source layer of the doped semiconductor source layers and a doped semiconductor drain layer of the doped semiconductor drain layers, forming memory films over the semiconductor channels, and forming gate electrodes over the memory films, wherein each of the gate electrodes vertically extends through each of the doped semiconductor source layers and the doped semiconductor drain layers of the alternating stack.

According to an aspect of the present disclosure, a three-dimensional memory device comprises an alternating stack of source layers and drain layers located over a substrate, an array of memory openings vertically extending through the alternating stack, gate electrodes, each gate electrode located in one of the array of memory openings and vertically extending through each of the source layers and the drain layers of the alternating stack, memory films, each located in one of the array of memory openings and laterally surrounding a respective one of the gate electrodes, and vertical stacks of semiconductor channels laterally surrounding a respective one of the memory films, wherein each of the vertical semiconductor channels contacts horizontal surfaces of a respective vertically neighboring According to another aspect of the present disclosure, a method of forming a three-dimensional memory device comprises forming an alternating stack of doped semiconductor source layers and doped semiconductor drain layers over a substrate, forming memory openings vertically extending through the alternating stack, forming a memory film and a gate electrode in each memory opening, wherein the memory film and the gate electrode vertically extend through each of the doped semiconductor source layers and the doped semiconductor drain layers of the alternating stack, and forming a vertical stack of semiconductor channels on horizontal surfaces of a respective vertically neighboring pair of a doped semiconductor source layer of the doped semiconductor source layers and a doped semiconductor drain layer of the doped semiconductor drain layers prior to, or after, formation of the memory film and the gate electrode, wherein each vertical stack of semiconductor channels laterally surrounds the respective memory film and the respective gate electrode.

BRIEF DESCRIPTION OF THE DRAWINGS

FIG. 3B is a top-down view of the first exemplary structure of FIG. 3A. The vertical plane A-A' is the plane of the cross-section for FIG. 3A.

FIG. 11 is a schematic vertical cross-sectional view of the second exemplary structure after formation of stepped surfaces according to the second embodiment of the present disclosure.

FIG. 12B is a top-down view of the second exemplary structure of FIG. 12A. The vertical plane A-A' is the plane of the cross-section for FIG. 12A.

FIG. 15B is a top-down view of the second exemplary structure of FIG. 15A. The vertical plane A-A' is the plane of the cross-section for FIG. 15A.

FIG. 24B is a top-down view of the third exemplary structure of FIG. 24A. The vertical plane A-A' is the plane of the cross-section for FIG. 24A.

FIG. 29B is a top-down view of the third exemplary structure of FIG. 29A. The vertical plane A-A' is the plane of the cross-section for FIG. 29A.

FIG. 38B is a top-down view of the fourth exemplary structure of FIG. 38A. The vertical plane A-A' is the plane of the cross-section for FIG. 38A.

DETAILED DESCRIPTION

Figure 1:
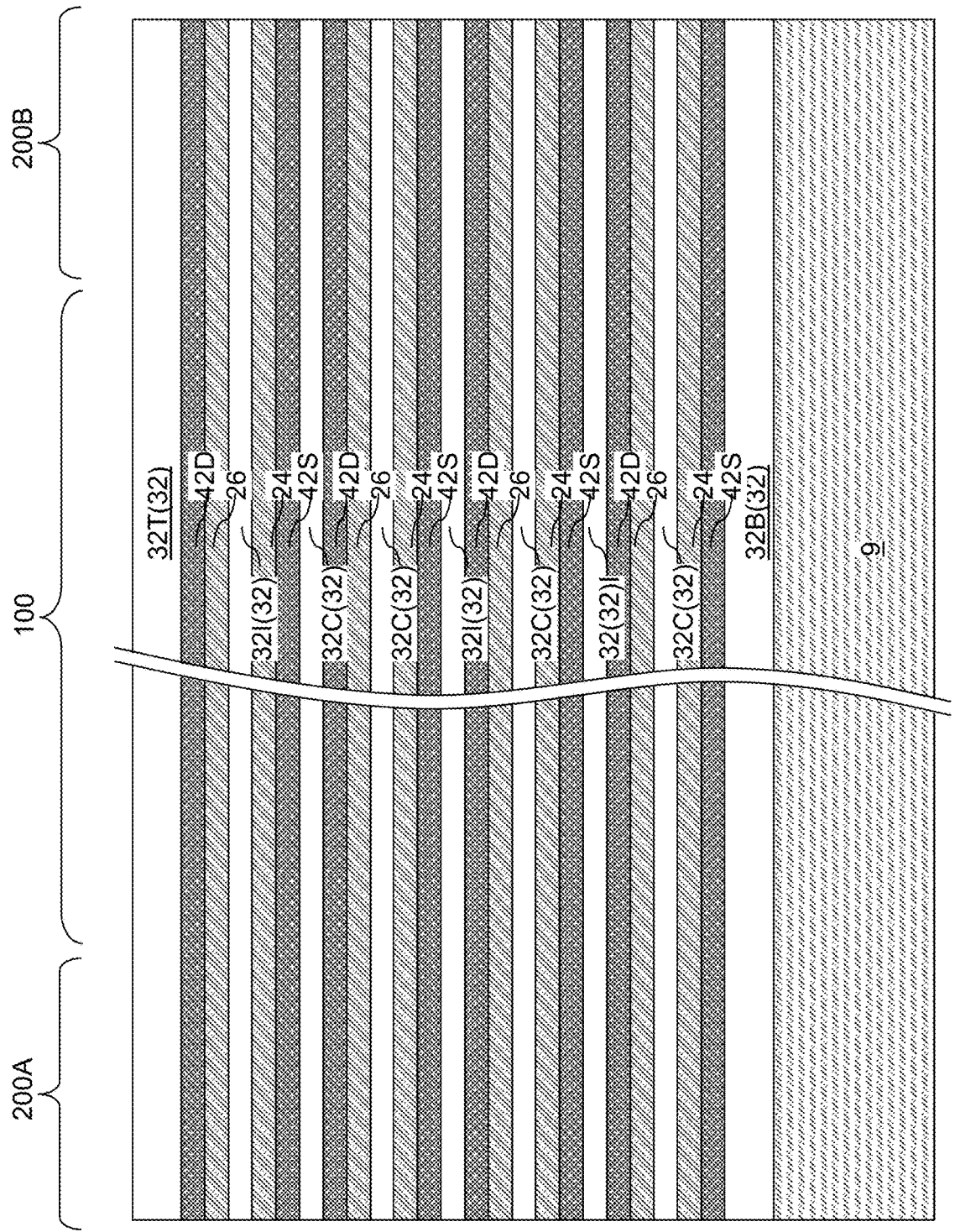
FIG. 1 is a schematic vertical cross-sectional view of a first exemplary structure after formation of multiple instances of a unit layer stack including a source sacrificial material layer, a doped semiconductor source layer, a channel-level insulating layer, a doped semiconductor drain layer, a drain sacrificial material layer, and an inter-transistor-level insulating layer over a substrate according to a first embodiment of the present disclosure.

As discussed above, the embodiments of the present disclosure are directed to three-dimensional memory devices containing an alternating stack of horizontal source lines, source layers, drain layers and bit lines, and vertical gate electrodes surrounded by a memory film and semiconductor channel extending through the alternating stack, and methods of manufacturing the same, the various aspects of which are described below. The three-dimensional memory devices of the embodiments of the present disclosure provide a simpler electrical connection to the source lines, the drain lines, and the words lines. The semiconductor channel width may be increased in such devices, which provides a tighter threshold voltage distribution and permits the use of higher cell current for faster memory speed. Some embodiments further provide electrical isolation between adjacent semiconductor channels.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be formed by forming a bottommost insulating layer 32B over a substrate 9, and by forming multiple instances of a unit layer stack including an optional source sacrificial material layer 42S, a doped semiconductor source layer 24, a channel-level insulating layer 32C (which is also referred to as a first insulating layer), a doped semiconductor drain layer 26, an optional drain sacrificial material layer 42D, and an inter-transistor-level insulating layer 32I (which is also referred to as a second insulating layer) over the bottommost insulating layer 32B. In an alternative configuration, one or both of the optional source sacrificial material layers 42S and/or the optional drain sacrificial material layer 42D may be omitted. As used herein, a "unit layer stack" refers to a layer stack of multiple layers that functions as a unit of repetition within a structure in which multiple instances of the layer stack is repeated. A topmost insulating layer 32T may be formed in lieu of the inter-transistor-level insulating layer 32I for the topmost instance of the unit layer stack (42S, 24, 32C, 26, 42D, 32I). The total number of repetitions of the unit layer stack (42S, 24, 32C, 26, 42D, 32I) can be the same as the total number of levels of vertical field effect transistors to be subsequently formed, which can be the same as the total number of levels of memory elements to be subsequently formed. As used herein, a "level" refers to a volume of a device located between a horizontal plane including a top surface of an element of the device and a horizontal plane including a bottom surface of the element of the device.

Therefore, a channel-level insulating layer 32C is an insulating layer that is formed between a horizontal plane including a top surface of a semiconductor channel to be subsequently formed and a horizontal plane including a bottom surface of the semiconductor channel is to be subsequently formed. An inter-transistor-level insulating layer 32I is an insulating layer that is formed between a horizontal plane including a top surface of an inter-transistor gap to be subsequently formed and a horizontal plane including a bottom surface of the inter-transistor gap is to be subsequently formed. The number of repetitions of the unit layer stack in the multiple instances of the unit layer stack may be in a range from 2 to 1,024, such as from 8 to 128, although lesser and greater numbers of repetitions can also be employed.

While the present disclosure is described employing an embodiment in which the unit layer stack includes a layer stack in which the optional source sacrificial material layer 42S, the doped semiconductor source layer 24, the channel-level insulating layer 32C, the doped semiconductor drain layer 26, the optional drain sacrificial material layer 42D, and the inter-transistor-level insulating layer 32I are arranged from bottom to top, an embodiment is expressly contemplated herein in which the layer stack is arranged from top to bottom in reverse order from that shown in FIG. 1. Generally, the positions of source elements (42S, 24) can be exchanged with the positions of the drain elements (42D, 26) because source regions and drain regions can be symmetric in field effect transistors.

The channel-level insulating layers 32C, the inter-transistor-level insulating layers 32I, the bottommost insulating layer 32B, and the topmost insulating layers 32T are collectively referred to as insulating layers 32. Each of the insulating layers 32 includes a respective insulating material such as a doped silicate glass, undoped silicate glass (e.g., silicon oxide), or organosilicate glass. The material composition of the channel-level insulating layers 32C may be the same as, or may be different from, the material composition of the inter-transistor-level insulating layers 32I. In one embodiment, each of the insulating layers 32 has a same dielectric material composition throughout. Alternatively, the channel-level insulating layers 32C can have a first dielectric material composition throughout, and the inter-transistor-level insulating layers 32I can have a second dielectric material composition that is different from the first dielectric material composition. The thickness of each channel-level insulating layer 32C can be in a range from 5 nm to 50 nm, and the thickness of each inter-transistor-level insulating layers 32I can be in a range from 5 nm to 50 nm, although lesser and greater thicknesses can also be employed.

The doped semiconductor source layers 24 and the doped semiconductor drain layers 26 include a doped semiconductor material such as doped polysilicon or doped amorphous silicon that can be subsequently annealed to form doped polysilicon. The conductivity type of the doped semiconductor source layers 24 and the doped semiconductor drain layers 26 is herein referred to as a first conductivity type, which can be p-type or n-type.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The atomic concentration of dopants of the first conductivity type in the doped semiconductor source layers 24 and the doped semiconductor drain layers 26 can be in a range from $5.0 \times 10^{19}/cm^3$ to $2.0 \times 10^{21}/cm^3$, although lesser and greater atomic concentrations can also be employed. The thickness of each doped semiconductor source layer 24 can be in a range from 5 nm to 50 nm, and the thickness of each and the thickness of each doped semiconductor drain layer 26 can be in a range from 5 nm to 50 nm, although lesser and greater thicknesses can also be employed.

The source sacrificial material layers 42S and the drain sacrificial material layers 42D are optional layers that may, or may not, be present. The source sacrificial material layers 42S and the drain sacrificial material layers 42D include a material that can be removed selective to the materials of the insulating layers 32, the doped semiconductor source layers 24, and the doped semiconductor drain layers 26. For example, if the insulating layers 32 include a doped silicate glass, undoped silicate glass, or organosilicate glass, then the source sacrificial material layers 42S and the drain sacrificial material layers 42D can include silicon nitride, undoped amorphous silicon, or a silicon-germanium alloy. The thickness of each source sacrificial material layer 42S can be in a range from 5 nm to 50 nm, and the thickness of each and the thickness of each drain sacrificial material layer 42D can be in a range from 5 nm to 50 nm, although lesser and greater thicknesses can also be employed.

The multiple instances of the unit layer stack can include a first alternating stack of doped semiconductor source layers 24 and doped semiconductor drain layers 26 that are interlaced with a second alternating stack of a channel-level insulating layer 32C and an inter-transistor-level insulating layer 32I. In case the source sacrificial material layers 42S and the drain sacrificial material layers 42D are omitted, each doped semiconductor source layer 24 constitutes a source layer that functions as a source region for a respective two-dimensional array of vertical field effect transistors, and doped semiconductor drain layer 26 constitutes a drain layer that functions as a drain region for a respective two-dimensional array of vertical field effect transistors. In case the source sacrificial material layers 42S and the drain sacrificial material layers 42D are included, each contiguous combination of a doped semiconductor source layer 24 and a metallic source layer that subsequently replaces a source sacrificial material layer 42S constitutes a source layer that functions as a source region for a respective two-dimensional array of vertical field effect transistors, and each contiguous combination of a doped semiconductor drain layer 26 and a metallic drain layer that subsequently replaces a drain sacrificial material layer 42D constitutes a drain layer that functions as a drain region for a respective two-dimensional array of vertical field effect transistors.

Insulating layers (32C, 32I) are formed between each vertically neighboring pair of a respective doped semiconductor source layer 24 of the doped semiconductor source layers 24 and a respective doped semiconductor drain layer 26 of the doped semiconductor drain layers 26. The channel-level insulating layers 32C are formed between a respective vertically neighboring pair of a doped semiconductor source layer 24 and a doped semiconductor drain layer 26.

In one embodiment, each of the source-level sacrificial material layers 42S is formed underneath a respective one of the doped semiconductor source layers 24, and each of drain-level sacrificial material layers 42D is formed over a respective one of the doped semiconductor drain layers 26. The first exemplary structure can include at least one memory array region 100 in which a three-dimensional array of memory elements is to be subsequently formed, and staircase regions (200A, 200B) in which stepped surfaces of the multiple instances of the unit layer stack (42S, 24, 32C, 26, 42D, 32I) are to be subsequently formed. The staircase regions may include a source side staircase region 200A and a drain side staircase region 200B.

Figure 2:
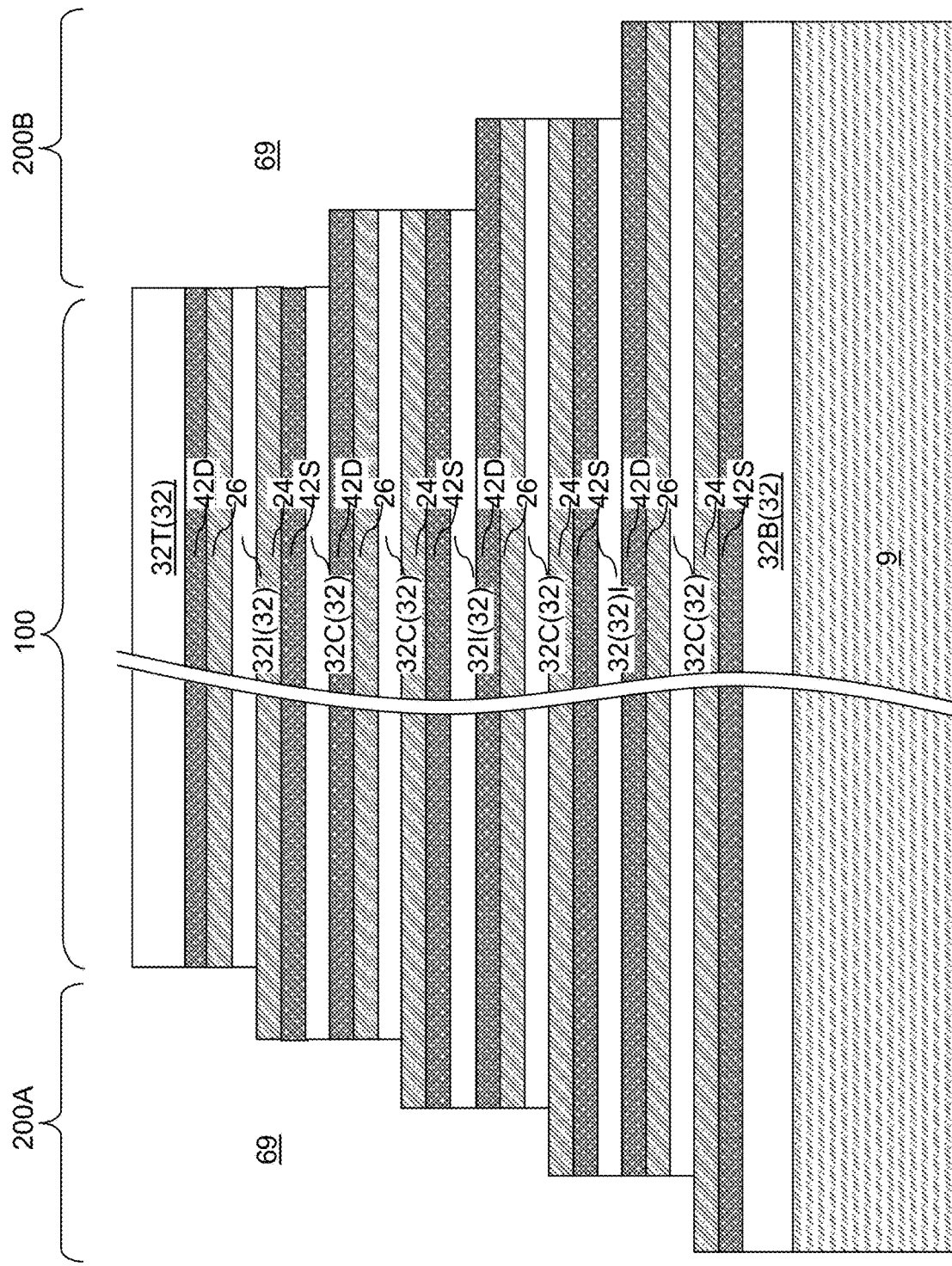
FIG. 2 is a schematic vertical cross-sectional view of the first exemplary structure after formation of stepped surfaces according to the first embodiment of the present disclosure.

Referring to FIG. 2, the multiple instances of the unit layer stack (42S, 24, 32C, 26, 42D, 32I) can be patterned for form stepped surfaces in the staircase regions (200A, 200B). For example, a trimmable mask layer (not shown) can be formed over the first exemplary structure, and can be patterned to cover each memory array region 100 and proximal portions of the staircase regions (200A, 200B) such that the edges of the trimmable mask layer are formed at location at which outermost vertical steps of stepped surfaces are to be subsequently formed. An anisotropic etch process can be performed to etch through one unit layer stack (42S, 24, 32C, 26, 42D, 32I) within areas that are not covered by the trimmable mask layer. The trimmable mask layer can be isotropically trimmed so that edges of the trimmable mask layer are formed at which second outermost vertical steps of the stepped surfaces are to be subsequently formed. An anisotropic etch process can be performed to etch through one unit layer stack (42S, 24, 32C, 26, 42D, 32I) within areas that are not covered by the trimmable mask layer. The isotropic trimming process for the trimmable mask layer and the anisotropic etch process can be repeatedly performed to form stepped surfaces within each of the staircase regions (200A, 200B).

In one embodiment, stepped surfaces in a pair of staircase regions (200A, 200B) located on each side of a memory array region 100 can be vertically offset such that one type of surfaces are physically exposed in one of the staircase regions (200A, 200B) and another type of surfaces are physically exposed in another of the staircase regions (200A, 200B). For example, horizontal surfaces of doped semiconductor source layers 24 can be physically exposed in the source side staircase region 200A adjacent to one side of the memory array region 100, and horizontal surfaces of drain-level sacrificial material layers 42D can be physically exposed in the drain side staircase region 200B adjacent to the opposite side of the memory array region 100. The vertical offset between the horizontal steps in each pair of staircase regions (200A, 200B) located on opposite sides of the same memory array region 100 can be the same as the thickness of one half of the unit layer stack (42S, 24, 32C, 26, 42D, 32I), such as the sum of the thickness of an optional source sacrificial material layer 42S, the thickness of a doped semiconductor source layer 24, and the thickness of a channel-level insulating layer 32C, or the sum of the thickness of a doped semiconductor drain layer 26, the thickness of an optional drain sacrificial material layer 42D, and the thickness of an inter-transistor-level insulating layer 32I. In this case, an etch mask layer (not shown) such as a patterned photoresist layer can cover the memory array region 100 and one of the staircase regions (e.g., 200A), and vertically recess the other staircase region (e.g., 200B) by the thickness of one half of the unit layer stack (42S, 24, 32C, 26, 42D, 32I).

Stepped cavities 69 having stepped bottom surfaces can be formed in the staircase regions (200A, 200B). The lateral extent of each type of layer within the multiple instances of the unit layer stack (42S, 24, 32C, 26, 42D, 32I) can decrease with a vertical distance from the substrate 9 upon patterning the stepped surfaces on the multiple instances of the unit layer stack (42S, 24, 32C, 26, 42D, 32I). As a consequence, the doped semiconductor source layers 24 in the alternating stack of doped semiconductor source layers 24 and the doped semiconductor drain layers 26 have different lateral extents that decrease with a vertical distance from the substrate 9. Likewise, the doped semiconductor drain layers 26 in the alternating stack of doped semiconductor source layers 24 and the doped semiconductor drain layers 26 have different lateral extents that decrease with a vertical distance from the substrate 9. The trimmable mask layer can be removed after forming the topmost vertical steps.

Figure 3A:
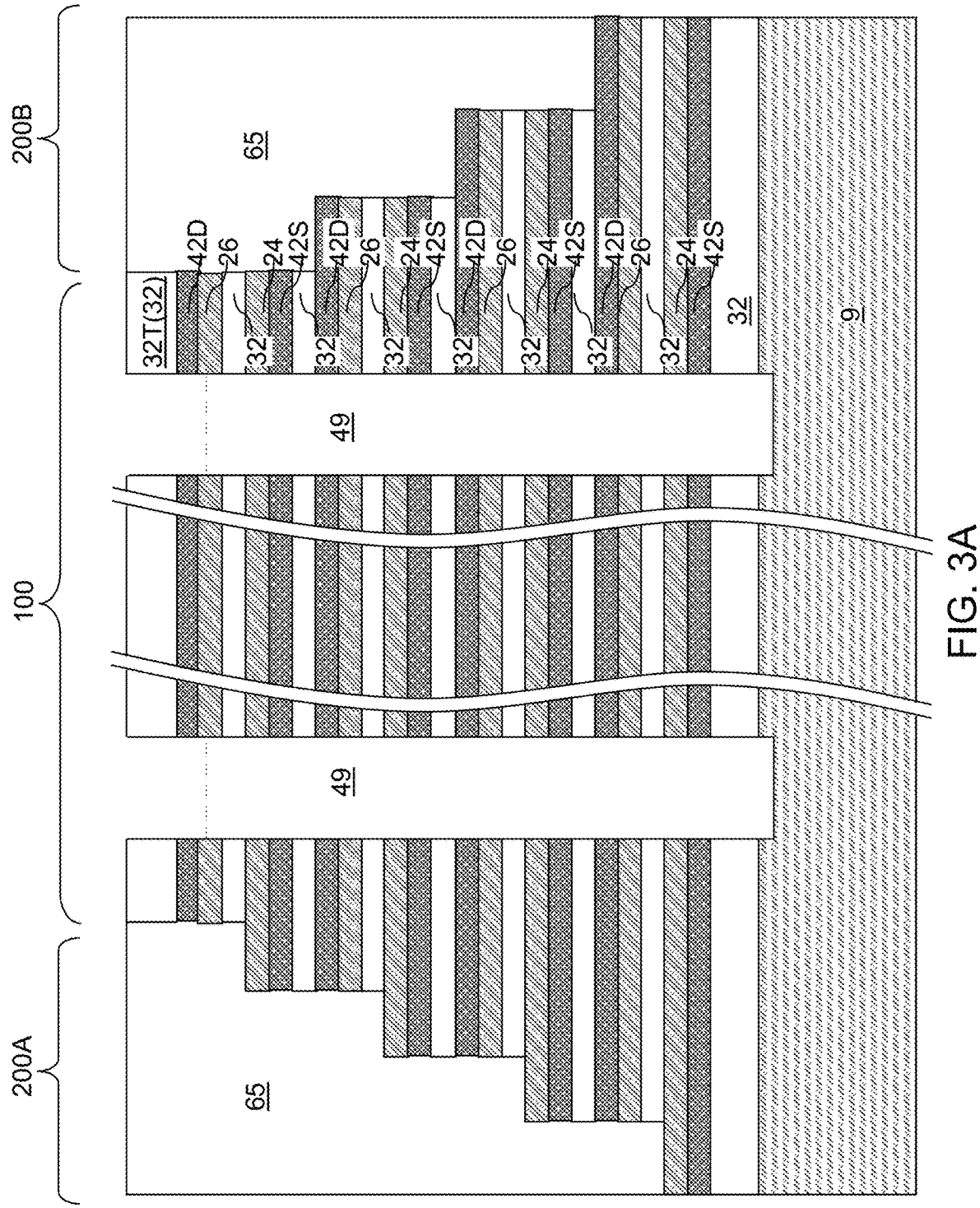
FIG. 3A is a schematic vertical cross-sectional view of the first exemplary structure after formation of retro-stepped dielectric material portions and an array of memory openings according to the first embodiment of the present disclosure.

Referring to FIGS. 3A and 3B, a retro-stepped dielectric material portion 65 (i.e., an insulating fill material portion) can be formed in each stepped cavity 69 by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). Each remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

A lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and an optional second set of openings formed over the staircase regions (200A, 200B). The pattern in the lithographic material stack can be transferred through the topmost insulating layer 32T or the retro-stepped dielectric material portion 65, the multiple instances of the unit layer stack (42S, 24, 32C, 26, 42D, 32I), and the bottommost insulating layer 32B by at least one anisotropic etch that employs the patterned lithographic material stack as an etch mask. Portions of the multiple instances of the unit layer stack (42S, 24, 32C, 26, 42D, 32I) located in the memory array region 100 and underlying the first set of openings in the patterned lithographic material stack are etched to form memory openings 49. As used herein, a "memory opening" refers to a structure in which memory elements, such as a memory stack structure, is subsequently formed. The memory openings 49 are formed through the topmost insulating layer 32T and the entirety of the multiple instances of the unit layer stack (42S, 24, 32C, 26, 42D, 32I) in the memory array region 100. Portions of the multiple instances of the unit layer stack (42S, 24, 32C, 26, 42D, 32I) and the retro-stepped dielectric layer 65 located in the staircase regions (200A, 200B) and underlying the second set of openings in the patterned lithographic material stack are etched to form optional support openings 19 shown in FIG. 3B.

The memory openings 49 extend through the entirety of the multiple instances of the unit layer stack (42S, 24, 32C, 26, 42D, 32I). The chemistry of the anisotropic etch process employed to etch through the materials of the multiple instances of the unit layer stack (42S, 24, 32C, 26, 42D, 32I) can alternate to optimize etching of the respective materials in the multiple instances of the unit layer stack (42S, 24, 32C, 26, 42D, 32I). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 can extend from the top surface of the multiple instances of the unit layer stack (42S, 24, 32C, 26, 42D, 32I) to at least the horizontal plane including the topmost surface of the substrate 9. Each of the memory openings 49 may include a sidewall (or a plurality of sidewalls) that extends substantially perpendicular to the topmost surface of the substrate 9. A two-dimensional array of memory openings 49 can be formed in the memory array region 100 through the multiple instances of the unit layer stack (42S, 24, 32C, 26, 42D, 32I). Thus, the two-dimensional array of memory openings 49 can be formed through the alternating stack of the doped semiconductor source layers 24 and the doped semiconductor drain layers 26. In one embodiment, the two-dimensional array of memory openings 49 can be formed as clusters of periodic two-dimensional arrays such as hexagonal arrays.

Figure 4:
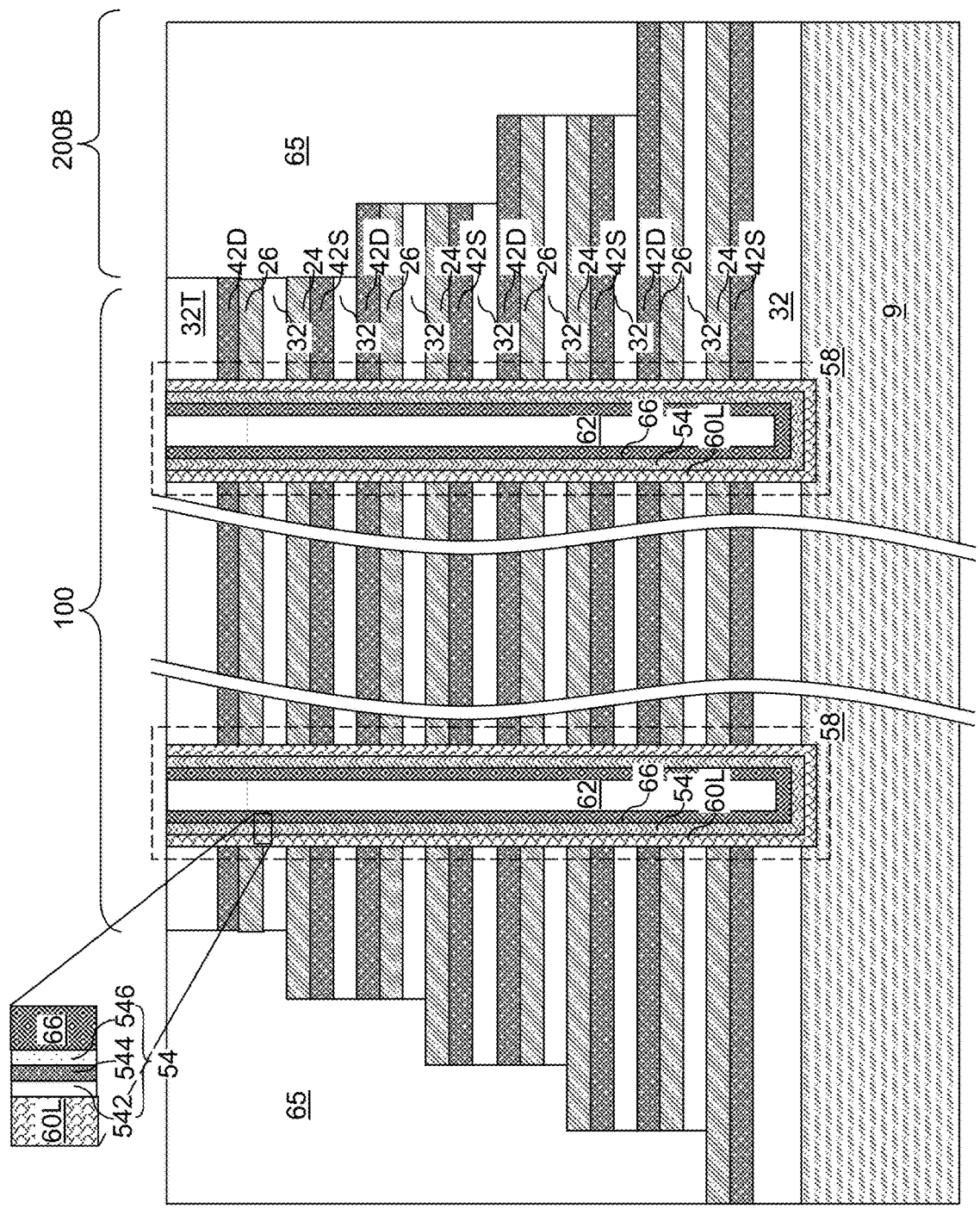
FIG. 4 is a schematic vertical cross-sectional view of the first exemplary structure after formation of memory opening fill structures according to the first embodiment of the present disclosure.

Referring to FIG. 4, continuous material layers can be sequentially deposited in each of the memory openings 49 and each of the support openings 19 (if present). The continuous material layers can include a continuous semiconductor channel layer, a continuous memory film, a continuous conductive material layer, and an optional dielectric fill material layer. Excess portions of the continuous material layers can be removed from above the horizontal plane including the top surface of the topmost insulating layers 32T and the top surfaces of the retro-stepped dielectric material portions by a planarization process. The planarization process can employ chemical mechanical planarization (CMP) and/or at least one recess etch process. Each portion of the continuous material layers that remain in a memory opening 49 constitutes a memory opening fill structure 58. Each portion of the continuous material layers that remain in a support opening 49 constitutes a support pillar 20 (shown in FIG. 6B).

Each memory opening fill structure 58 includes a continuous semiconductor channel layer 60L, a memory film 54, a gate electrode 66, and an optional dielectric core 62. Each continuous semiconductor channel layer 60L is a remaining portion of the continuous semiconductor channel layer after the planarization process. Each memory film 54 is a remaining portion of the continuous memory film after the planarization process. Each gate electrode 66 is a remaining portion of the continuous conductive material layer after the planarization process. Each gate electrode 66 may be a control gate electrode of a NAND memory device. The gate electrode 66 may be electrically connected to an overlying word line that will be formed in a subsequent step. Each dielectric core 62 is a remaining portion of the dielectric fill material layer.

The continuous semiconductor channel layer 60L includes a semiconductor material having a doping of a second conductivity type, which is the opposite of the first conductivity type. For example, if the first conductivity type is n-type, the second conductivity type is p-type, and vice versa. The semiconductor material in the continuous semiconductor channel layer 60L can include silicon, a silicon-germanium alloy, or a compound semiconductor material. The atomic concentration of dopants of the second conductivity type in the continuous semiconductor channel layer 60L can be in a range from $1.0 \times 10^{14}/cm^3$ to $3.0 \times 10^{17}/cm3$, although lesser and greater atomic concentrations can also be employed. The thickness of the continuous semiconductor channel layer 60L can be in a range from 1 nm to 30 nm, such as from 3 nm to 10 nm, although lesser and greater thicknesses can also be employed.

The memory film 54 includes at least one material layer that can store data bits in the form of trapped electrical charges or polarization. In one embodiment, the memory film each of the memory films comprises a layer stack including, from outside to inside, a tunneling dielectric layer 542 contacting the semiconductor channel layer 60L, a blocking dielectric layer 546 contacting the gate electrode 66, and a charge storage layer 544 located between and contacting the tunneling dielectric layer 542 and the blocking dielectric layer 546. The tunneling dielectric layer 542 can include a tunneling dielectric material such as a silicon oxide layer or an ONO stack (i.e., a stack of a silicon oxide layer, a silicon nitride layer, and a silicon oxide layer). The charge storage layer 544 can include a charge storage material such as silicon nitride or charge storage nanoparticles embedded in a dielectric material. The blocking dielectric layer 546 can include a blocking dielectric material such as silicon oxide and/or a dielectric metal oxide, such as aluminum oxide. In another embodiment, each of the memory films 54 comprises a ferroelectric material layer (not shown) and at least one optional dielectric material layer (such as a silicon oxide layer) that can contact the continuous semiconductor channel layer 60L or the gate electrode 66. The ferroelectric material layer may comprise hafnium oxide ($HfO_2$) or hafnium zirconium oxide ($Hf_xZr_{1-x}O_2$), where $0.01 < x < 0.99$. The ferroelectric material layer can include a suitable dopant such as Al, Zr, Y, Gd, La, Sr, and/or Si in order to enhance ferroelectric properties.

Each gate electrode 66 includes a conductive material such as a metallic material. For example, each gate electrode 66 can include a layer stack of a metallic nitride liner (e.g., barrier layer) including a conductive metallic nitride (such as TiN, TaN, or WN) and a metal fill layer including a metal (such as W, Co, Mo, Ru, Cu, or an alloy thereof).

Each optional dielectric core 62 includes a dielectric fill material such as silicon oxide. In one embodiment, the dielectric cores 62 can include a dielectric material that has a higher etch rate than the topmost insulating layer 32T in an etch process. For example, the dielectric cores 62 can include borosilicate glass, organosilicate glass, or phosphosilicate glass, and the topmost insulating layer 32T can include densified undoped silicate glass. In this case, the material of the dielectric cores 62 can be subsequently recessed relative to the material of the topmost insulating layer 32T.

Each portion of a continuous semiconductor channel layer 60L that extends from a bottom surface of a doped semiconductor source layer 24 to a top surface of a doped semiconductor drain layer 26 constitutes a semiconductor channel. Each continuous semiconductor channel layer 60L includes a vertical stack of semiconductor channels. Each of the semiconductor channels is formed on cylindrical sidewalls of a respective vertically neighboring pair of a doped semiconductor source layer 24 and a doped semiconductor drain layer 26. Each of the semiconductor channels is also formed on a cylindrical sidewall of a respective one of the channel-level insulating layer 32C. In the first embodiment, each vertical stack of semiconductor channels is formed as a continuous semiconductor channel layer 60L that extends through each doped semiconductor source layer 24 and each doped semiconductor drain layer 26 within the alternating stack of the doped semiconductor source layers 24 and the doped semiconductor drain regions 26. Each of the semiconductor channels is connected to a respective vertically neighboring pair of a doped semiconductor source layer 24 and a doped semiconductor drain layer 26. Each continuous semiconductor channel layer 60L extends through each doped semiconductor source layer 24 and each doped semiconductor drain layer 26 within the alternating stack of the doped semiconductor source layers 24 and the doped semiconductor drain layers 26.

A memory film 54 is formed on each of the vertical stacks of semiconductor channels, and a gate electrode 66 is formed on each of the memory films 54. Each of the gate electrodes 66 vertically extends through each of the doped semiconductor source layers 24 and the doped semiconductor drain layers 26 of the alternating stack. Each gate electrode 66 extends through each doped semiconductor source layer 24 and each doped semiconductor drain layer 26 within the alternating stack of the doped semiconductor source layers 24 and the doped semiconductor drain layers 26.

Each continuous semiconductor channel layer 60L includes a hollow cylindrical portion and a bottom cap portion that adjoins a bottom periphery of the cylindrical portion. Each memory film 54 includes a hollow cylindrical portion and a bottom cap portion that adjoins a bottom periphery of the cylindrical portion. Each gate electrode 66 can include a hollow cylindrical portion and a bottom cap portion that adjoins a bottom periphery of the cylindrical portion. The gate electrodes 66 can be vertically spaced from the substrate 9 by horizontal portions of the memory films 54. Each of the gate electrodes 66 can laterally surround a respective dielectric core 62 if the gate electrodes 66 include the hollow cylindrical portion. Alternatively, the dielectric core 62 may be omitted if the gate electrodes 66 comprise a filled cylinder. While cylinders and cylindrical portions that fill cylindrical memory openings 49 are described above, other shapes that fill memory openings 49 may be formed if the memory openings have a shape other than cylindrical (e.g., if the memory openings 49 have a polygonal horizontal cross sectional shape).

Figure 5:
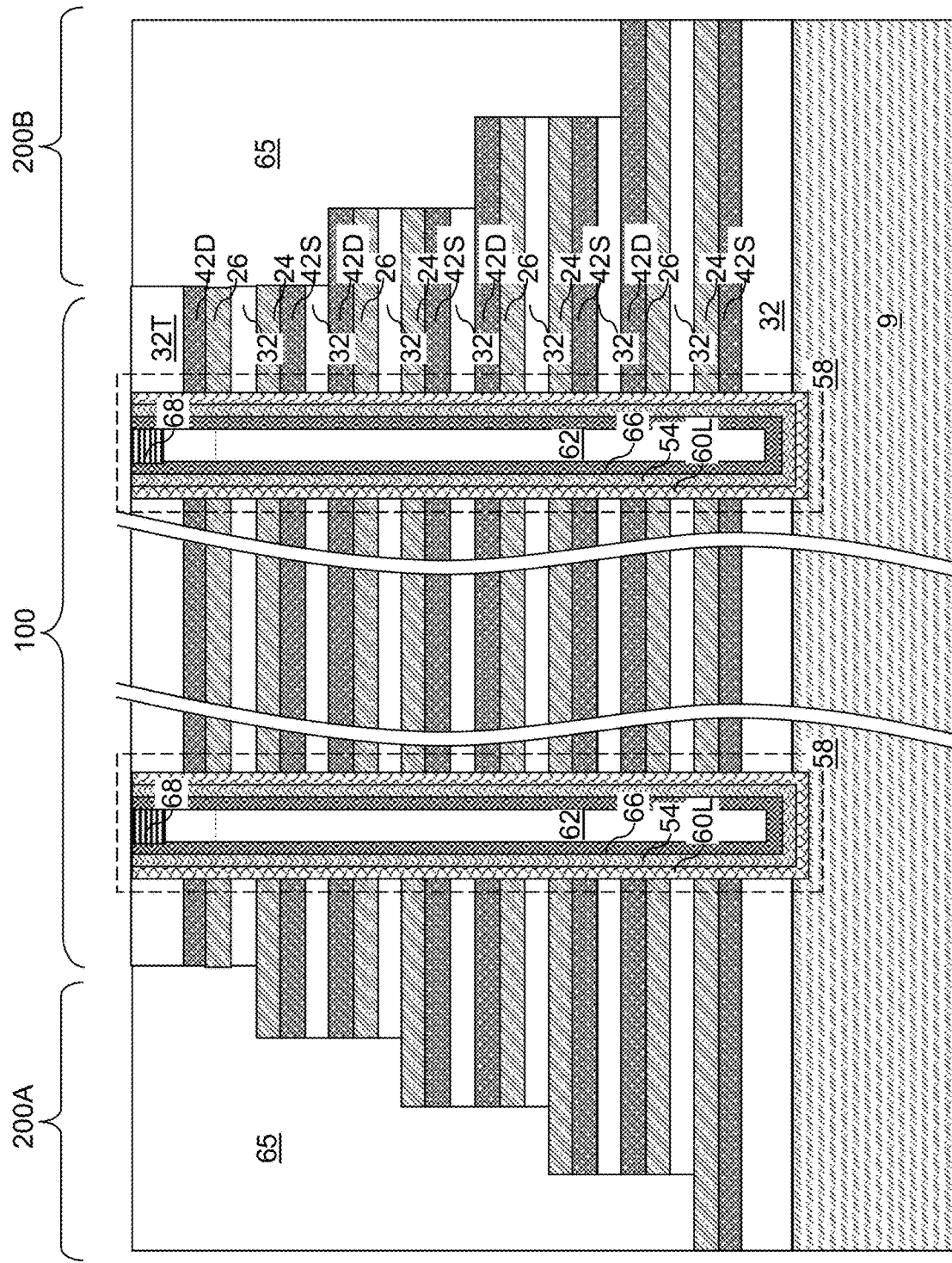
FIG. 5 is a schematic vertical cross-sectional view of the first exemplary structure after formation of contact pad structures according to the first embodiment of the present disclosure.

Referring to FIG. 5, top portions of the dielectric cores 62 can be vertically recessed to form cavity regions. A conductive material such as a metallic material can be deposited in the cavity regions. Excess portions of the conductive material can be removed from above the horizontal plane including the top surface of the topmost insulating layer 32T. Each remaining portion of the conductive material constitutes a contact pad structure 68.

In one embodiment, the contact pad structures 68 can include a layer stack of a metallic nitride liner (TaN, TiN, or WN) and a conductive fill material such as a metallic material (such as W, Ru, Co, or Mo), a doped semiconductor material, and/or a metal silicide material. Each contact pad structure 68 contacts a top end of a respective gate electrode 66, and is laterally spaced from a respective continuous semiconductor channel layer 60L by a respective memory film 54. Alternatively, if the gate electrodes 66 comprise a filled cylinder, then the contact pad structure 68 may be omitted.

Figure 6A:
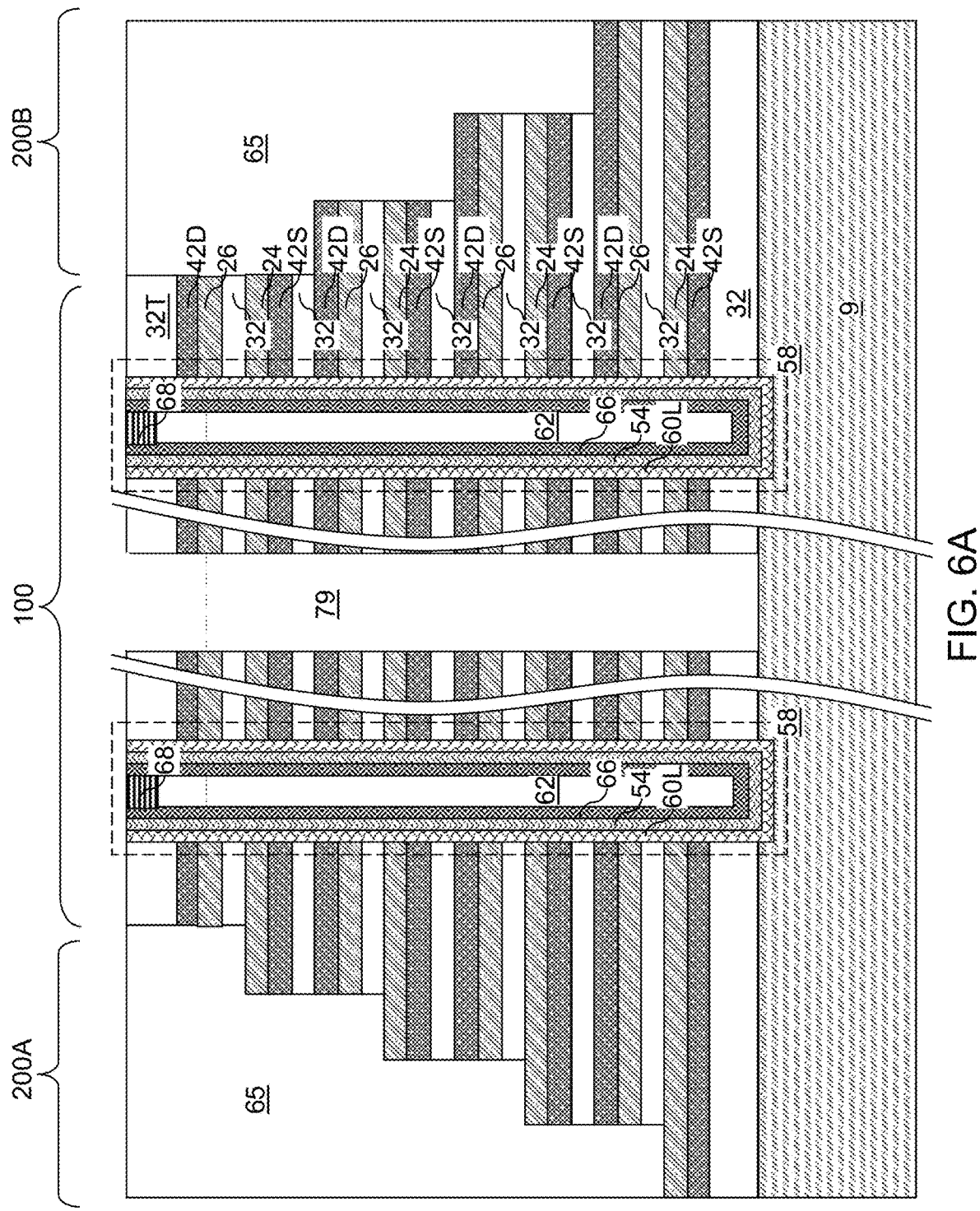
FIG. 6A is a schematic vertical cross-sectional view of the first exemplary structure after formation of a backside trench according to the first embodiment of the present disclosure.
Figure 6B:
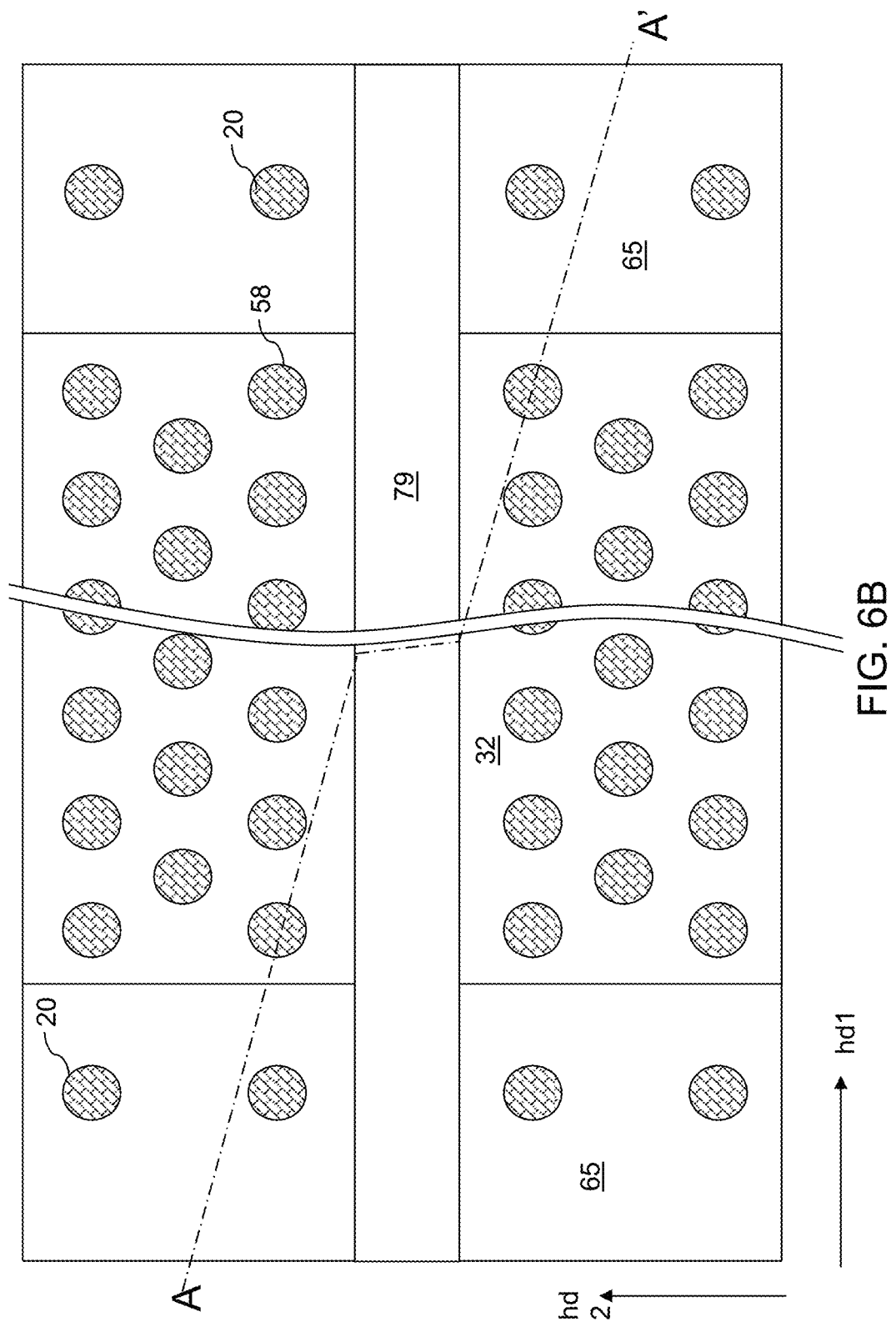
FIG. 6B is a top-down view of the first exemplary structure of FIG. 6A. The vertical plane A-A' is the plane of the cross-section for FIG. 6A.

Referring to FIGS. 6A and 6B, a photoresist layer (not shown) can be applied over the topmost insulating layer 32T, and is lithographically patterned to form openings in areas between clusters of memory opening fill structures 58 and support pillars 20. The support pillars 20 are not shown in subsequent figures for simplicity. The pattern in the photoresist layer can be transferred through the topmost insulating layer 32T and the multiple instances of the unit layer stack (42S, 24, 32C, 26, 42D, 32I) employing an anisotropic etch to form backside trenches 79, which vertically extend from the top surface of the topmost insulating layer 32T at least to the top surface of the substrate 9, and laterally extend through the memory array region 100 and the staircase regions (200A, 200B).

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 58 can be arranged in rows that extend along the first horizontal direction hd1.

Each backside trench 79 can have a uniform width that is invariant along the lengthwise direction (i.e., along the first horizontal direction hd1). Multiple rows of memory opening fill structures 58 can be located between a neighboring pair of backside trenches 79. The photoresist layer can be removed, for example, by ashing.

Figure 7:
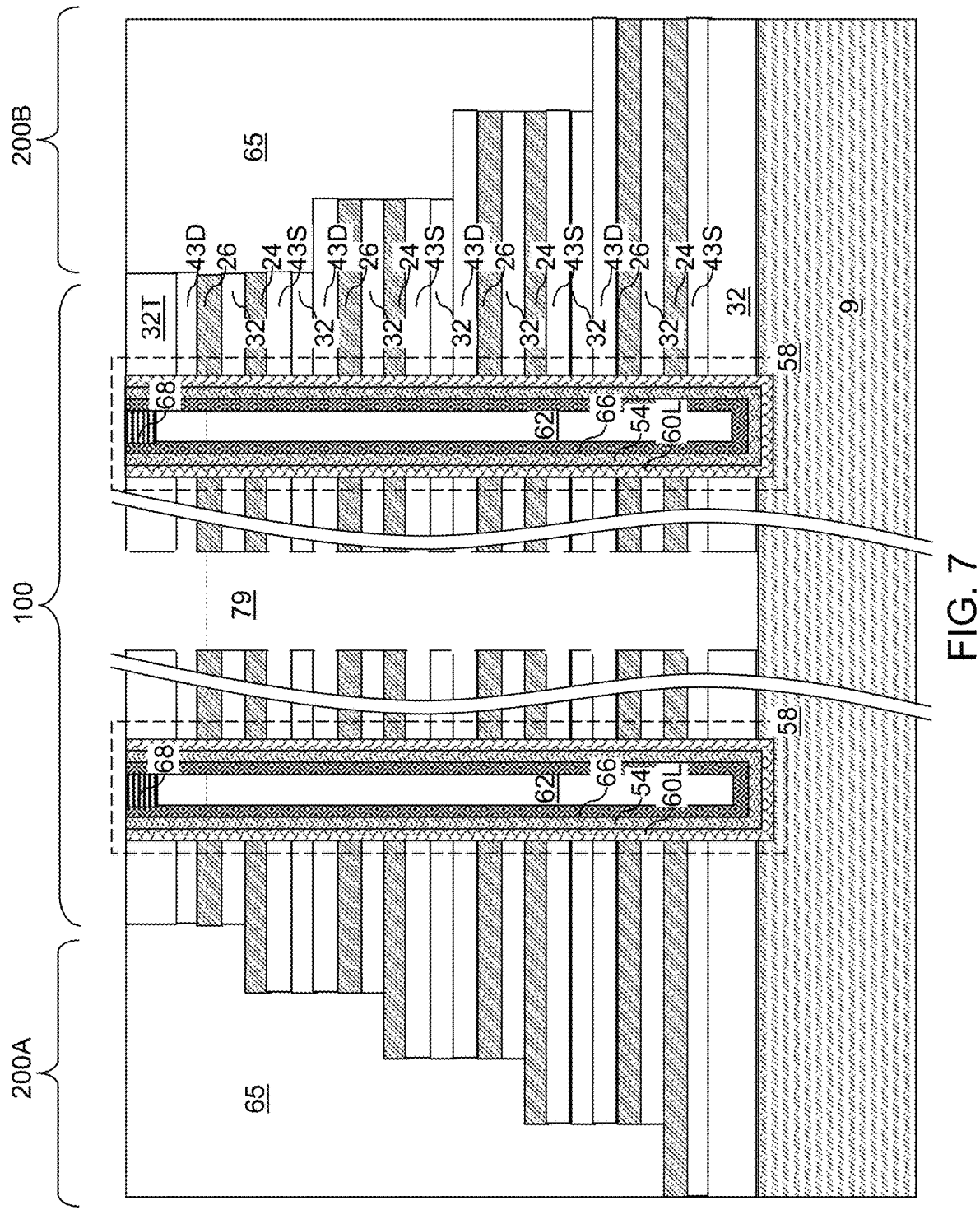
FIG. 7 is a schematic vertical cross-sectional view of the first exemplary structure after formation of source-level backside recesses and drain-level backside recesses according to the first embodiment of the present disclosure.

Referring to FIG. 7, an etchant that selectively etches the materials of the source sacrificial material layer 42S and drain sacrificial material layers 42D with respect to the materials of the insulating layers 32, the doped semiconductor source layers 24, the doped semiconductor drain layers 26, the retro-stepped dielectric material portions 65, and the continuous semiconductor channel layers 60L can be introduced into the backside trenches 79, for example, employing an etch process. Source-level backside recesses 43S and drain-level backside recesses 43D are formed in volumes from which the source sacrificial material layer 42S and drain sacrificial material layers 42D are removed, respectively. In one embodiment, the source sacrificial material layer 42S and drain sacrificial material layers 42D can include silicon nitride, and the materials of the insulating layers 32 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source sacrificial material layer 42S and drain sacrificial material layers 42D are removed. The memory openings in which the memory opening fill structures 58 are formed are herein referred to as front side openings or front side cavities in contrast with the source-level backside recesses 43S and the drain-level backside recesses 43D. Each of the plurality of source-level backside recesses 43S and the drain-level backside recesses 43D can extend substantially parallel to the top surface of the substrate 9. In one embodiment, each backside recess (43S, 43D) can have a uniform height throughout.

Figure 8:
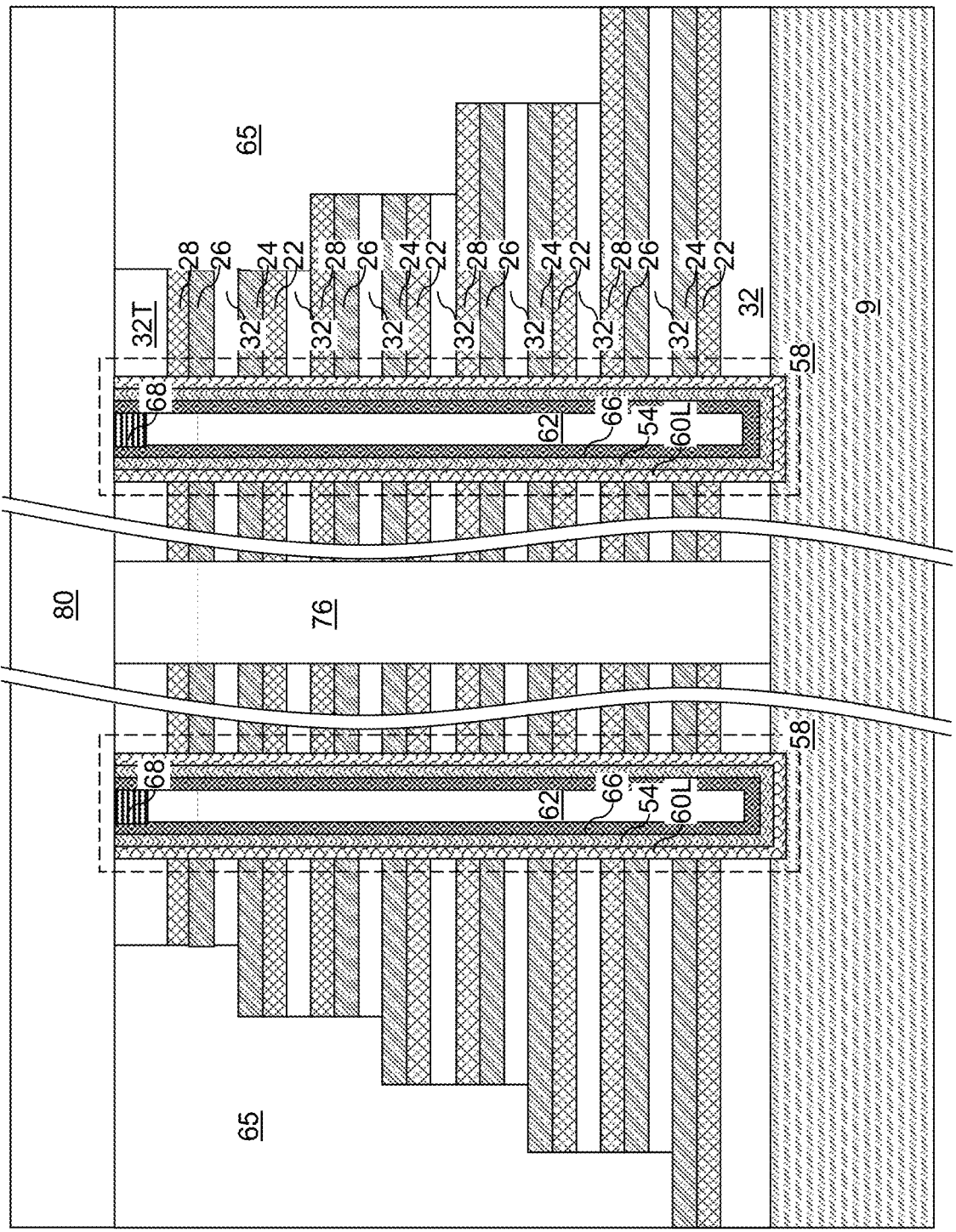
FIG. 8 is a schematic vertical cross-sectional view of the first exemplary structure after formation of metallic source layers, metallic drain layers, and a backside trench fill structure according to the first embodiment of the present disclosure.

Referring to FIG. 8, at least one metallic material can be deposited in the source-level backside recesses 43S and the drain-level backside recesses 43D through the backside trenches 79. The at least one metallic material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. The at least one metallic material fills all volumes of the source-level backside recesses 43S and the drain-level backside recesses 43D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers (i.e., electrically conductive source lines) 22. Remaining portions of the at least one metallic material that fills the drain-level backside recesses 43D constitute metallic drain layers (i.e., electrically conductive bit lines) 28. Each contiguous combination of a doped semiconductor source layer 24 and a metallic source layer 22 constitutes a source layer (22, 24) that functions as a source region and source line for a respective two-dimensional array of vertical field effect transistors. Each contiguous combination of a doped semiconductor drain layer 26 and a metallic drain layer 28 constitutes a drain layer (26, 28) that functions as a drain region and bot line for a respective two-dimensional array of vertical field effect transistors.

As discussed above, the source sacrificial material layer 42S and the drain-level sacrificial material layers 42D are optional elements that may be omitted. In case the source sacrificial material layer 42S and the drain-level sacrificial material layers 42D are present, the source sacrificial material layer 42S and the drain-level sacrificial material layers 42D are replaced with the metallic source layers 22 and the metallic drain layers 28 (i.e., source lines and bit lines), respectively. In this case, each of the source layers (22, 24) comprises a vertical stack of a doped semiconductor source layer 24 and a metallic source layer 22, and each of the drain layers (26, 28) comprises a vertical stack of a doped semiconductor drain layer 26 and a metallic drain layer 28. In case the source sacrificial material layer 42S and the drain-level sacrificial material layers 42D are omitted, each of the source layers consists of a doped semiconductor source layer 24 and each drain layer consists of a doped semiconductor drain layer 26. In this case, the doped semiconductor source layer 24 functions both as sources region and a source line, and doped semiconductor drain layer 26 functions both as drain regions and a bit line. It is understood that processing steps employed to replace the source sacrificial material layer 42S and the drain-level sacrificial material layers 42D with the metallic source layers 22 and the metallic drain layers 28, respectively, are omitted in all such embodiments.

Insulating layers (32C, 32I) are located between each vertically neighboring pair of a source layer (22, 24) and drain layer (26, 28). In one embodiment, the insulating layers (32C, 32I) can have a same dielectric material composition throughout, which may be the composition of a doped silicate glass, undoped silicate glass, or organosilicate glass. In another embodiment, the channel-level insulating layers 32C may have a different composition than the inter-transistor-level insulating layers 32I. In one embodiment, each semiconductor channel contacts a cylindrical sidewall of a respective channel-level insulating layer 32C located between a respective vertically neighboring pair of a source layer (22, 24) and a drain layer (26, 28).

A dielectric material such as silicon oxide can be deposited in each backside trench to form backside trench fill structures 76. Portions of the dielectric material that is deposited over the topmost insulating layer 32T can constitute a contact-level dielectric layer 80. Each backside trench fill structure 76 can vertically extend through the multiple instances of a unit layer stack including a metallic source layer 22, a doped semiconductor source layer 24, a channel-level insulating layer 32C, a doped semiconductor drain layer 26, a metallic drain layer 28, and an inter-transistor-level insulating layer 32I.

Figure 9A:
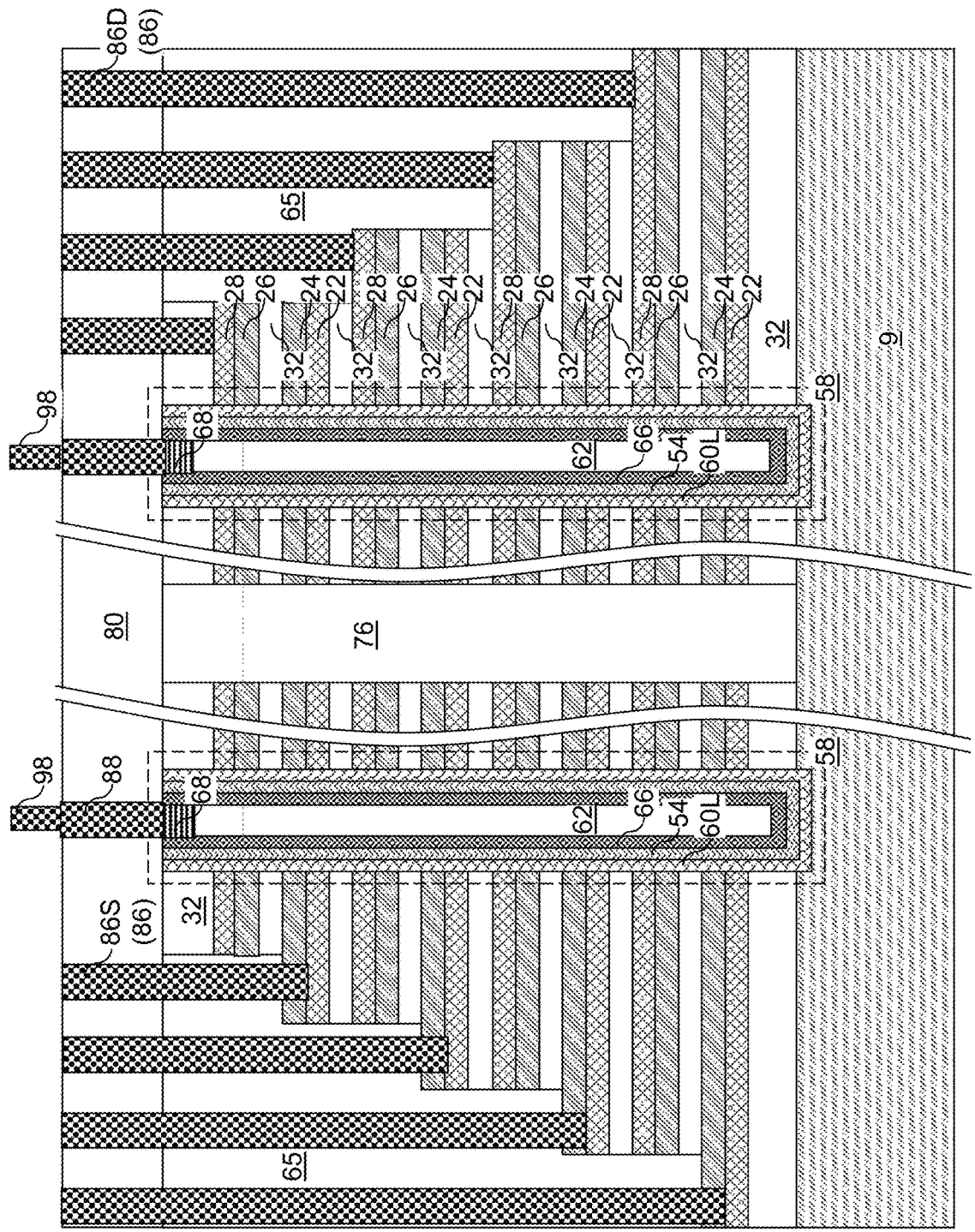
FIG. 9A is a schematic vertical cross-sectional view of the first exemplary structure after formation of contact via structures according to the first embodiment of the present disclosure.
Figure 9B:
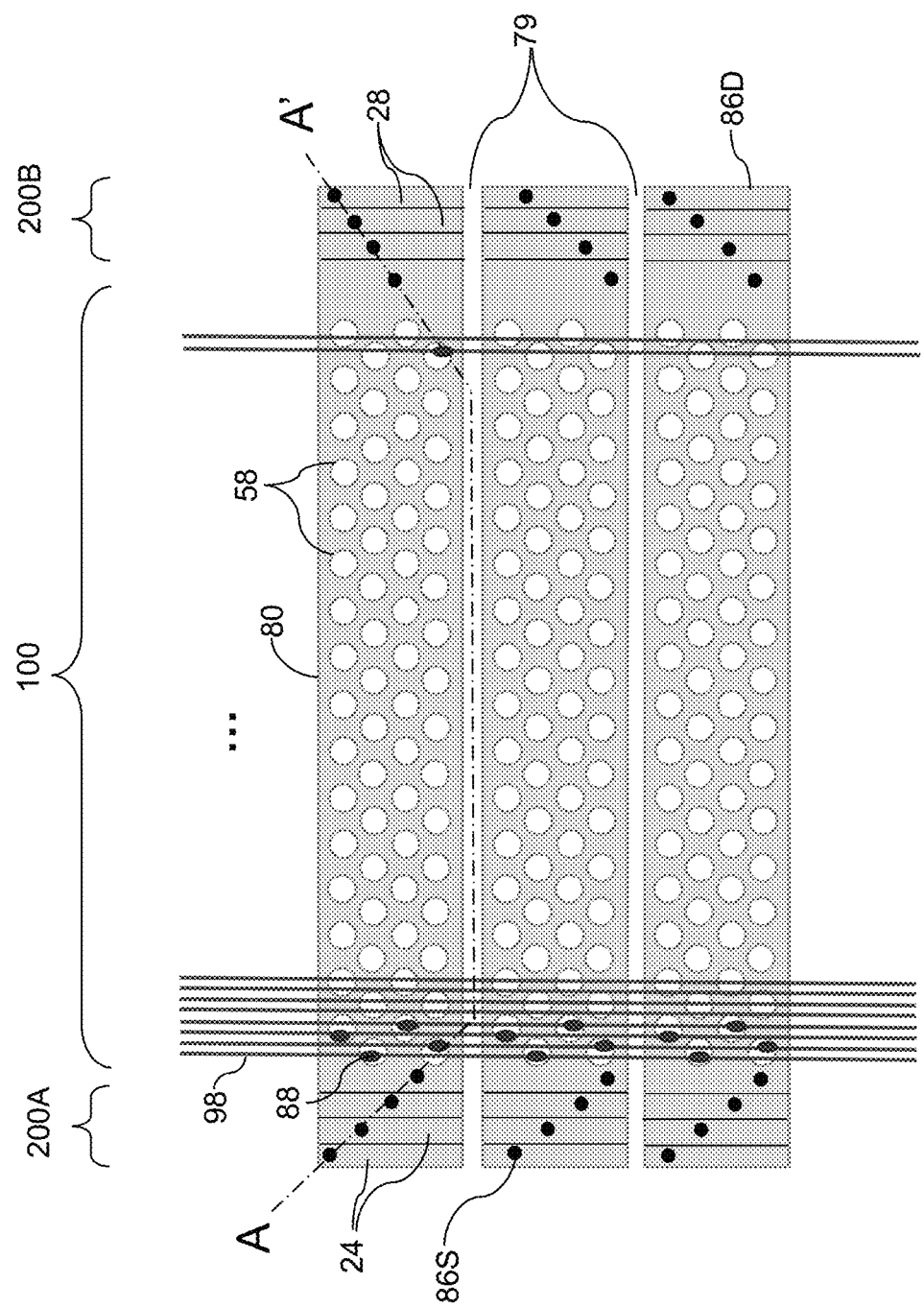
FIG. 9B is a top, partial see-through, view of the first exemplary structure of FIG. 9A. The vertical plane A-A' is the plane of the cross-section for FIG. 9A.

Referring to FIGS. 9A and 9B, contact via structures (88, 86) can be formed through the contact-level dielectric layer 80 and optionally through a retro-stepped dielectric material portion 65. The contact via structures (88, 86) include word line contact via structures 88 each of which contacts a respective one of the contact pad structures 68, and is electrically connected to a respective gate electrode 66. Further, the contact via structures (88, 86) include layer contact via structures 86 (e.g., 86S, 86D) that contact a respective one of the source layers (22, 24) and the drain layers (26, 28) within the respective staircase regions (200A, 200B). Specifically, each of the layer contact via structures (86S, 86D) can contact a horizontal surface of a respective one of the source layers (22, 24) or one of the drain layers (26, 28) exposed in the stepped surfaces in the staircase regions (200A, 200B). Word lines 98 are then formed over the contact-level dielectric layer 80 (and over gate electrodes 66, the source layers (22, 24) and the drain layers (26, 28)) and in electrical contact with the gate electrodes 66 through the contact via structures 88 and the optional contact pad structures 68. The word lines 98 are arranged as a two-dimensional array that extends along the horizontal direction that is perpendicular to the lengthwise direction of the backside trenches 79, as shown in FIG. 9B. The locations of the memory opening fill structures 58 are shown schematically as clear circles, while the locations of the backside trenches 79 are shown schematically as clear lines in FIG. 9B.

Each vertical stack of semiconductor channels is formed as, and remain after formation of the contact via structures (86, 88) as, portions of a continuous semiconductor channel layer 60L that extends through each source layer (22, 24) and each drain layer (26, 28) within the alternating stack of source layers (22, 24) and drain layers (26, 28). The layer contact via structures 86 includes source layer contact via structures 86S and drain layer contact via structures 86D. Each source layer contact via structure 86S contacts a respective one of the source layers (22, 24). Each drain layer contact via structure 86D contacts a respective one of the drain layers (26, 28).

In one embodiment, the source layers (22, 24) in the alternating stack of source layers (22, 24) and drain layers (26, 28) have different lateral extents that decrease with a vertical distance from the substrate 9, and the drain layers (26, 28) in the alternating stack of source layers (22, 24) and drain layers (26, 28) have different lateral extents that decrease with a vertical distance from the substrate 9. A first retro-stepped dielectric material portion 65 contacts horizontal surfaces of the source layers (22, 24) in the alternating stack and laterally surrounds the source layer contact via structures 86S. A second retro-stepped dielectric material portion 65 contacts horizontal surfaces of the drain layers (26, 28) in the alternating stack and laterally surrounds the drain layer contact via structures 86D.

Figure 10:
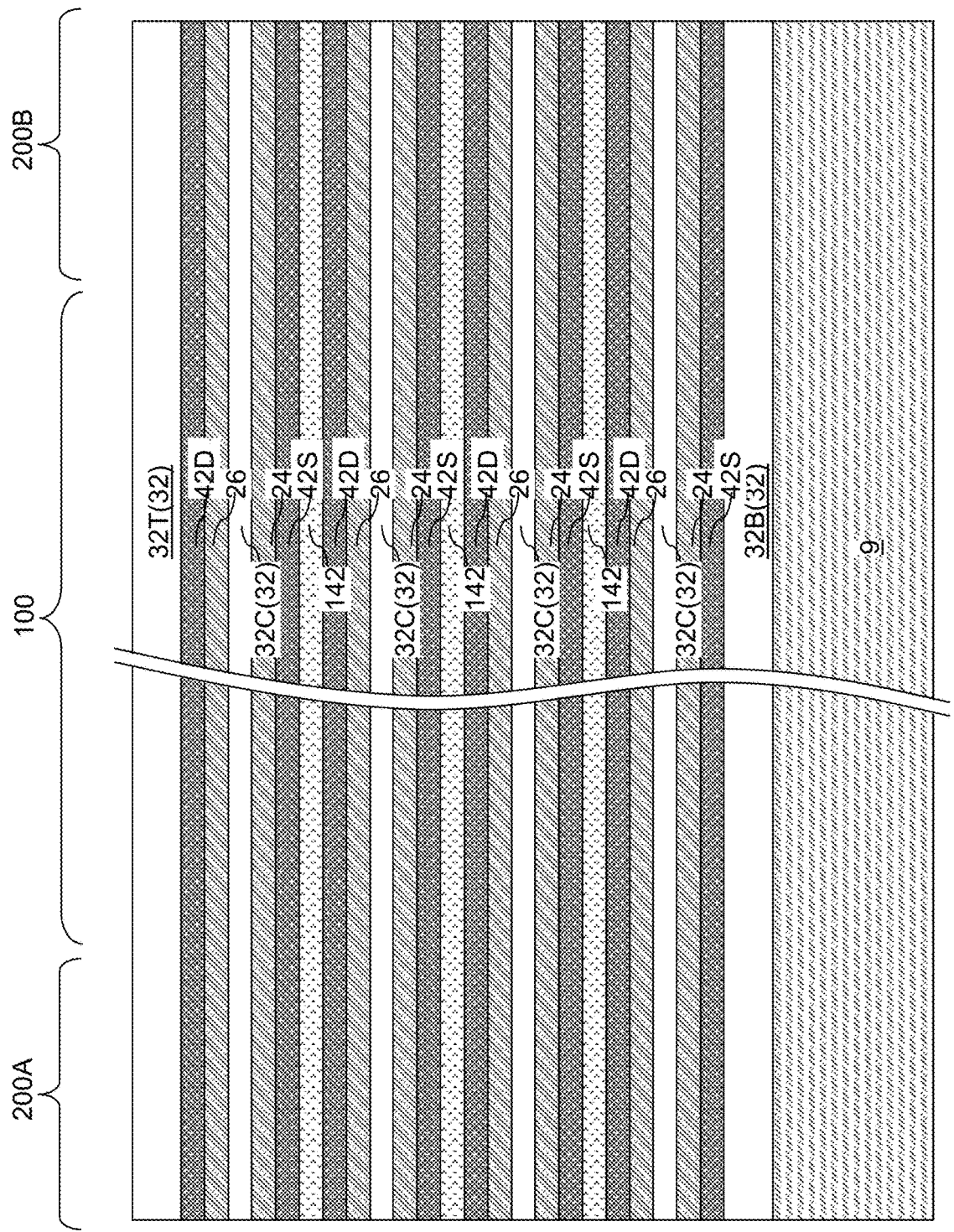
FIG. 10 is a schematic vertical cross-sectional view of a second exemplary structure after formation of multiple instances of a unit layer stack including a source sacrificial material layer, a doped semiconductor source layer, an insulating layer, a doped semiconductor drain layer, a drain sacrificial material layer, and an inter-transistor-level sacrificial material layer over a substrate according to a second embodiment of the present disclosure.

Referring to FIG. 10, a second exemplary structure according to a second embodiment of the present disclosure can be derived from the first exemplary structure of FIG. 1 by replacing the inter-transistor-level insulating layers 32I with sacrificial material layers, which are herein referred to as inter-transistor-level sacrificial material layers 142. Thus, each instance of the unit layer stack within the multiple instances of the unit layer stack includes a source sacrificial material layer 42S, a doped semiconductor source layer 24, a channel-level insulating layer 32C, a doped semiconductor drain layer 26, a drain sacrificial material layer 42D, and an inter-transistor-level sacrificial material layer 142.

The source sacrificial material layers 42S and the drain sacrificial material layers 42D include a sacrificial material that can be removed selective to the material of the channel-level insulating layers 32C, the bottommost insulating layer 32, and the topmost insulating layer 32T, and selective to the material of the inter-transistor-level sacrificial material layers 142. For example, the channel-level insulating layers 32C, the bottommost insulating layer 32, and the topmost insulating layer 32T can include undoped silicate glass, a doped silicate glass, or organosilicate glass; the inter-transistor-level sacrificial material layers 142 can include a material such as a dielectric metal oxide (e.g., aluminum oxide), a silicon-germanium alloy having an atomic concentration of germanium greater than 20%, a polymer material, or a metallic material that is different from the metallic materials to be employed for metallic source layers and metallic drain layers that subsequently replace the source sacrificial material layers 42S and the drain sacrificial material layers 42D; and the source sacrificial material layers 42S and the drain sacrificial material layers 42D can include silicon nitride. Each inter-transistor-level sacrificial material layer 142 can have a thickness in a range from 5 nm to 50 nm, although lesser and greater thicknesses can also be employed. In an alternative configuration, one or both of the source sacrificial material layers 42S and/or the drain sacrificial material layer 42D may be omitted.

The multiple instances of the unit layer stack include an alternating stack of doped semiconductor source layers 24 and doped semiconductor drain layers 26. Channel-level insulating layers 32C can be provided between each vertically neighboring pair of an underlying doped semiconductor source layer 24 and an overlying doped semiconductor drain layer 26. Inter-transistor-level sacrificial material layers 142 are formed between vertically neighboring pairs of an overlying doped semiconductor source layer 24 and an underlying doped semiconductor drain layer 26.

Referring to FIG. 11, the processing steps of FIG. 2 can be performed to form stepped cavities 69 in the staircase regions (200A, 200B). Stepped surfaces are formed in the staircase regions (200A, 200B). Steps of the anisotropic etch processes for forming the stepped surfaces can be modified to provide an etch chemistry that effectively etches the inter-transistor-level sacrificial material layers 142.

Figure 12A:
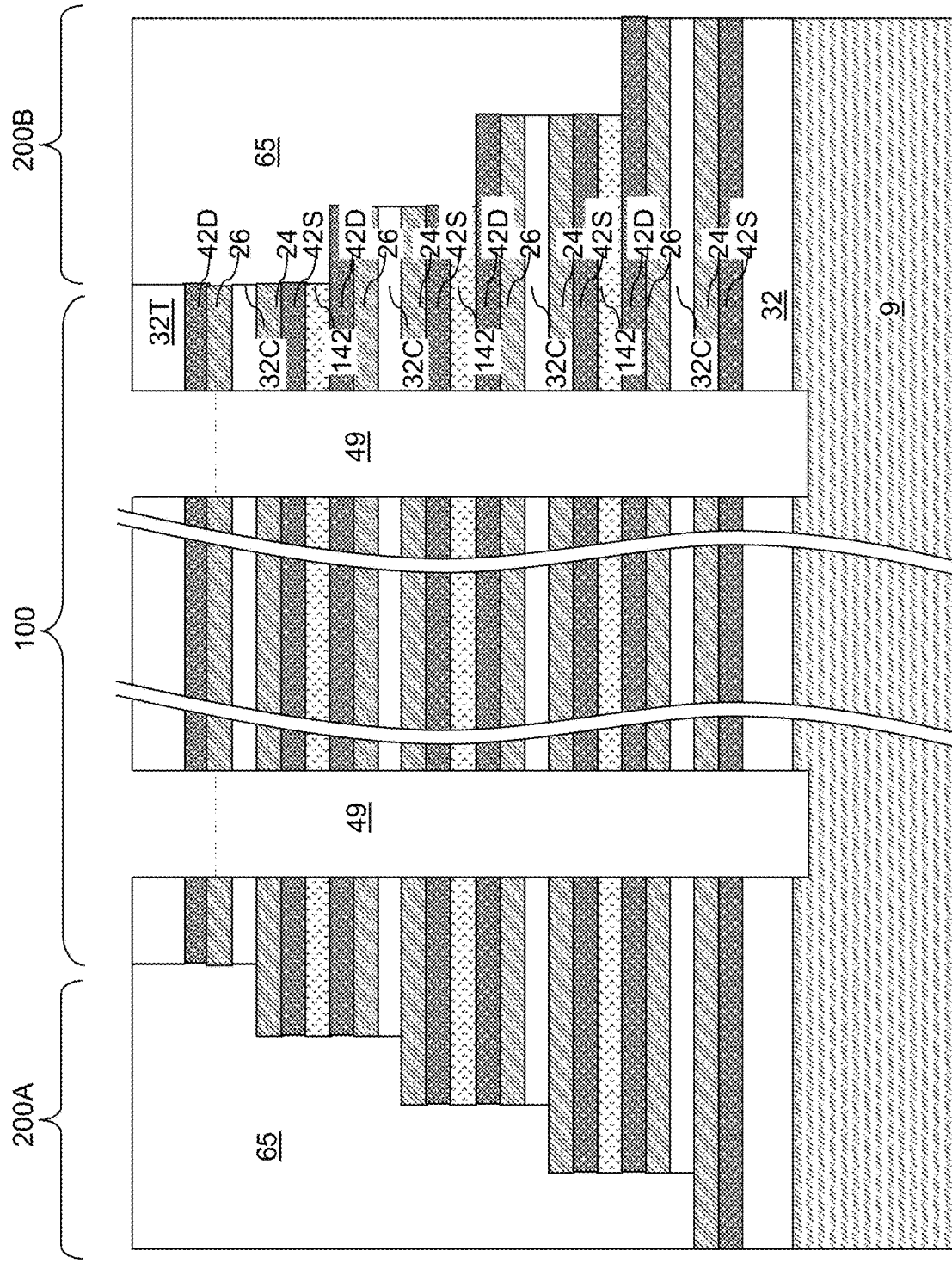
FIG. 12A is a schematic vertical cross-sectional view of the second exemplary structure after formation of retro-stepped dielectric material portions and an array of memory openings according to the second embodiment of the present disclosure.

Referring to FIGS. 12A and 12B, the processing steps of FIGS. 3A and 3B can be performed to form memory openings 49 through each layer in the multiple instances of the unit layer stack. As discussed above, the unit layer stack of the second exemplary structure can include a source sacrificial material layer 42S, a doped semiconductor source layer 24, a channel-level insulating layer 32C, a doped semiconductor drain layer 26, a drain sacrificial material layer 42D, and an inter-transistor-level sacrificial material layer 142. Steps of the anisotropic etch processes for forming the memory openings 49 can be modified to provide an etch chemistry that effectively etches the inter-transistor-level sacrificial material layers 142.

Figure 13:
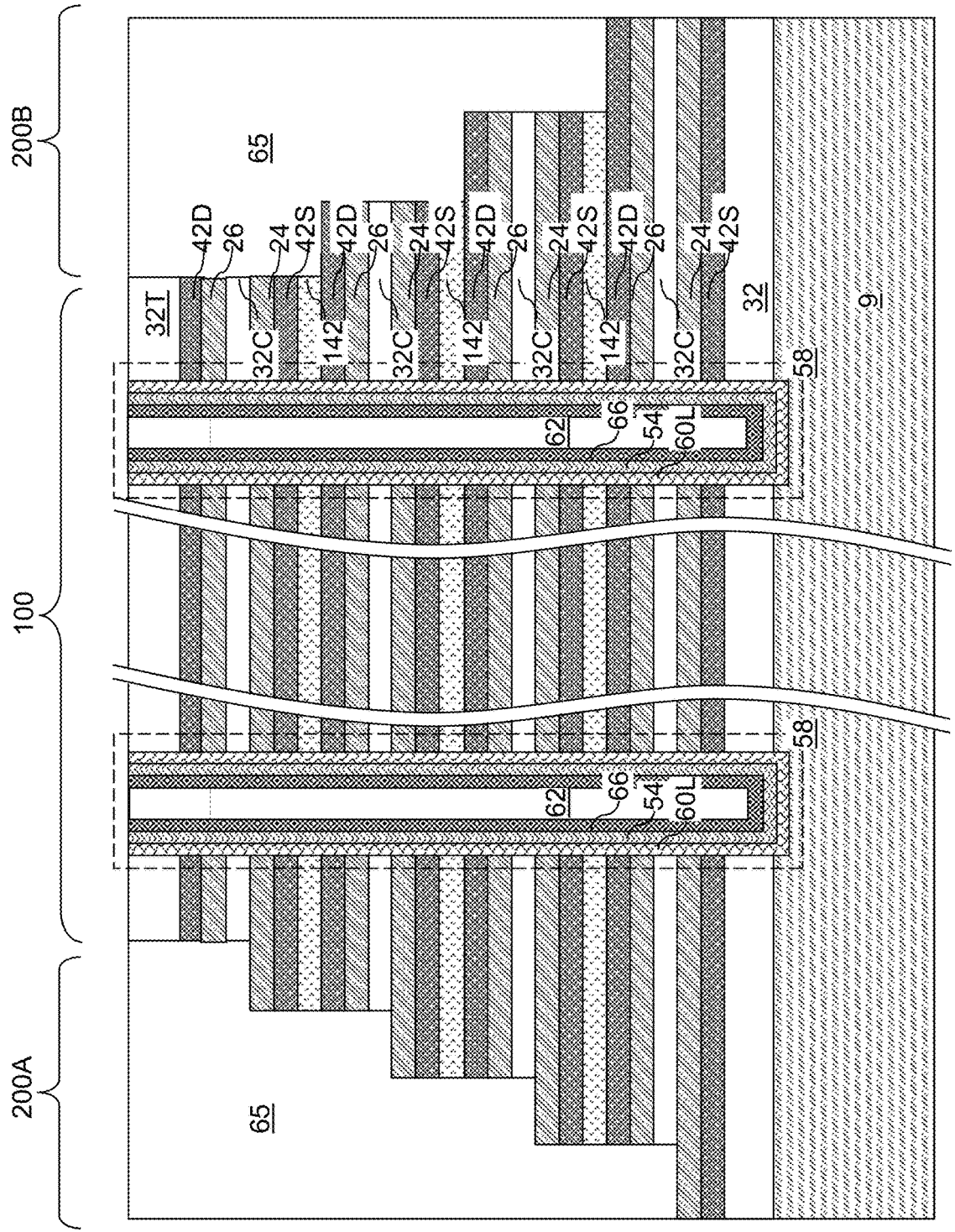
FIG. 13 is a schematic vertical cross-sectional view of the second exemplary structure after formation of memory opening fill structures according to the second embodiment of the present disclosure.

Referring to FIG. 13, the processing steps of FIG. 4 can be performed to form memory opening fill structures 58. Each of the memory opening fill structures 58 of the second exemplary structure can have a same set of elements as the memory opening fill structures 58 of FIG. 4.

Figure 14:
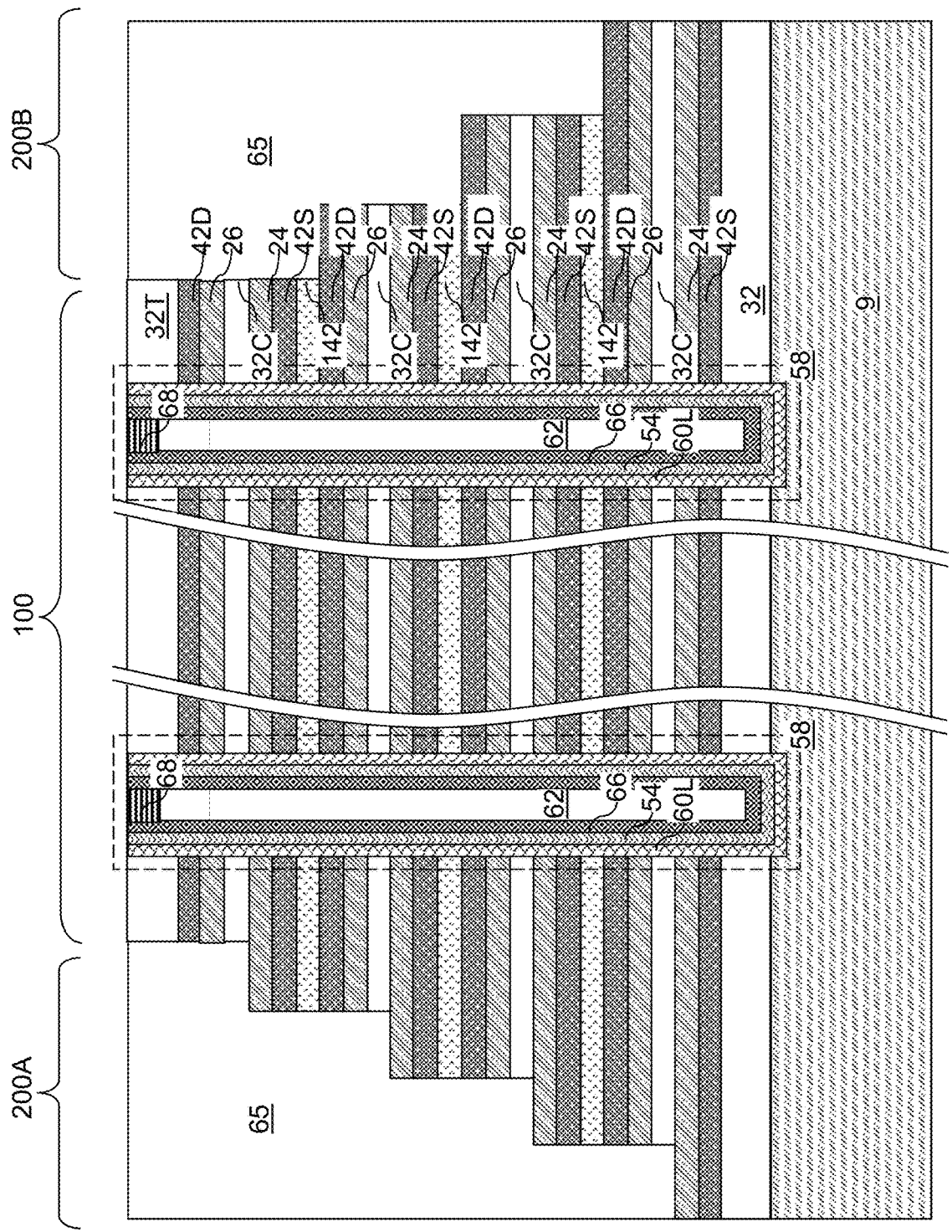
FIG. 14 is a schematic vertical cross-sectional view of the second exemplary structure after formation of contact pad structures according to the second embodiment of the present disclosure.

Referring to FIG. 14, the processing steps of FIG. 5 can be performed to form contact pad structures 68. Each memory opening fill structure 58 can include a respective contact pad structure 68 that contacts a top end of a respective one of the gate electrodes 66.

Figure 15A:
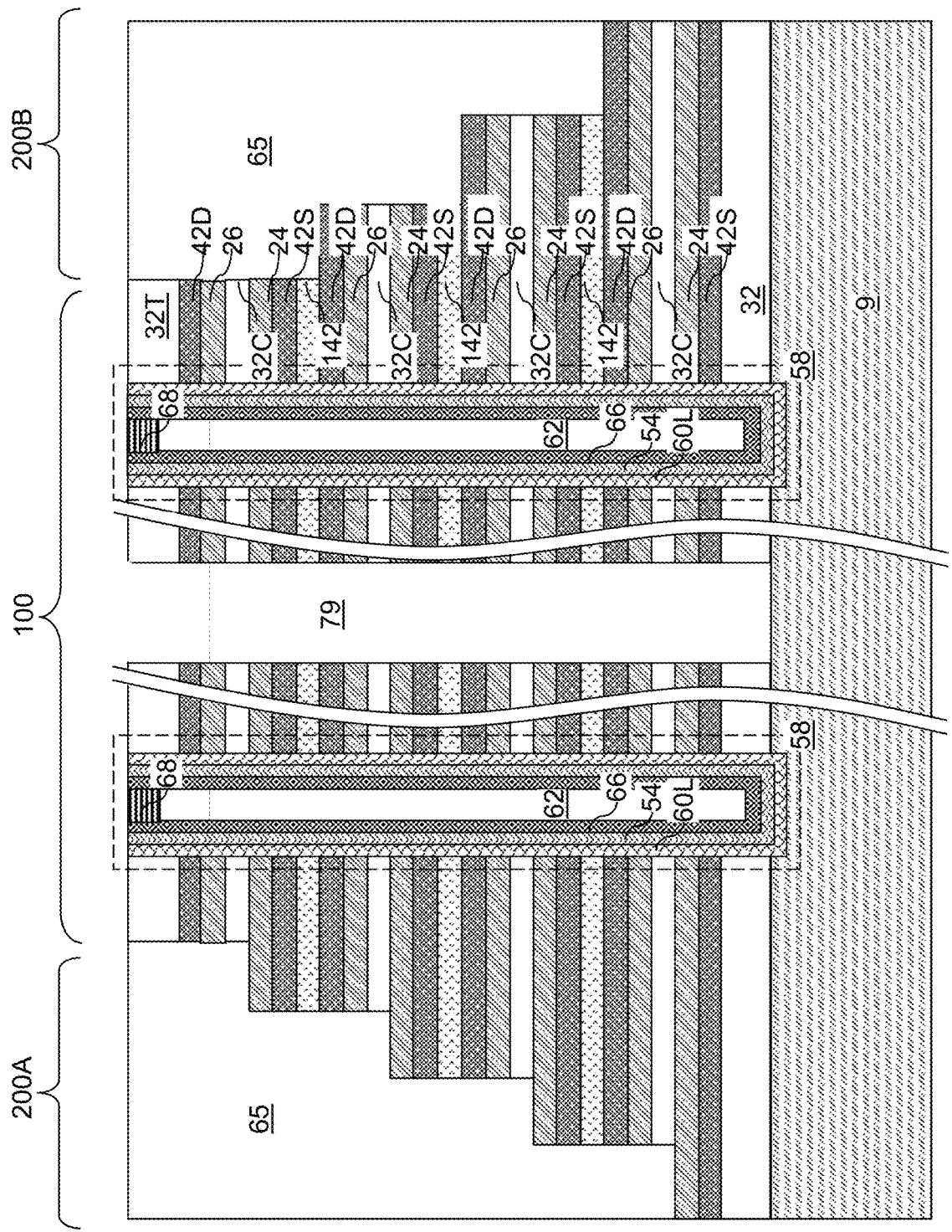
FIG. 15A is a schematic vertical cross-sectional view of the second exemplary structure after formation of a backside trench according to the second embodiment of the present disclosure.

Referring to FIGS. 15A and 15B, the processing steps of FIGS. 6A and 6B can be performed to form backside trenches 79 through the multiple instances of the unit layer stack. Steps of the anisotropic etch processes for forming the backside trenches 79 can be modified to provide an etch chemistry that effectively etches the inter-transistor-level sacrificial material layers 142.

Figure 16:
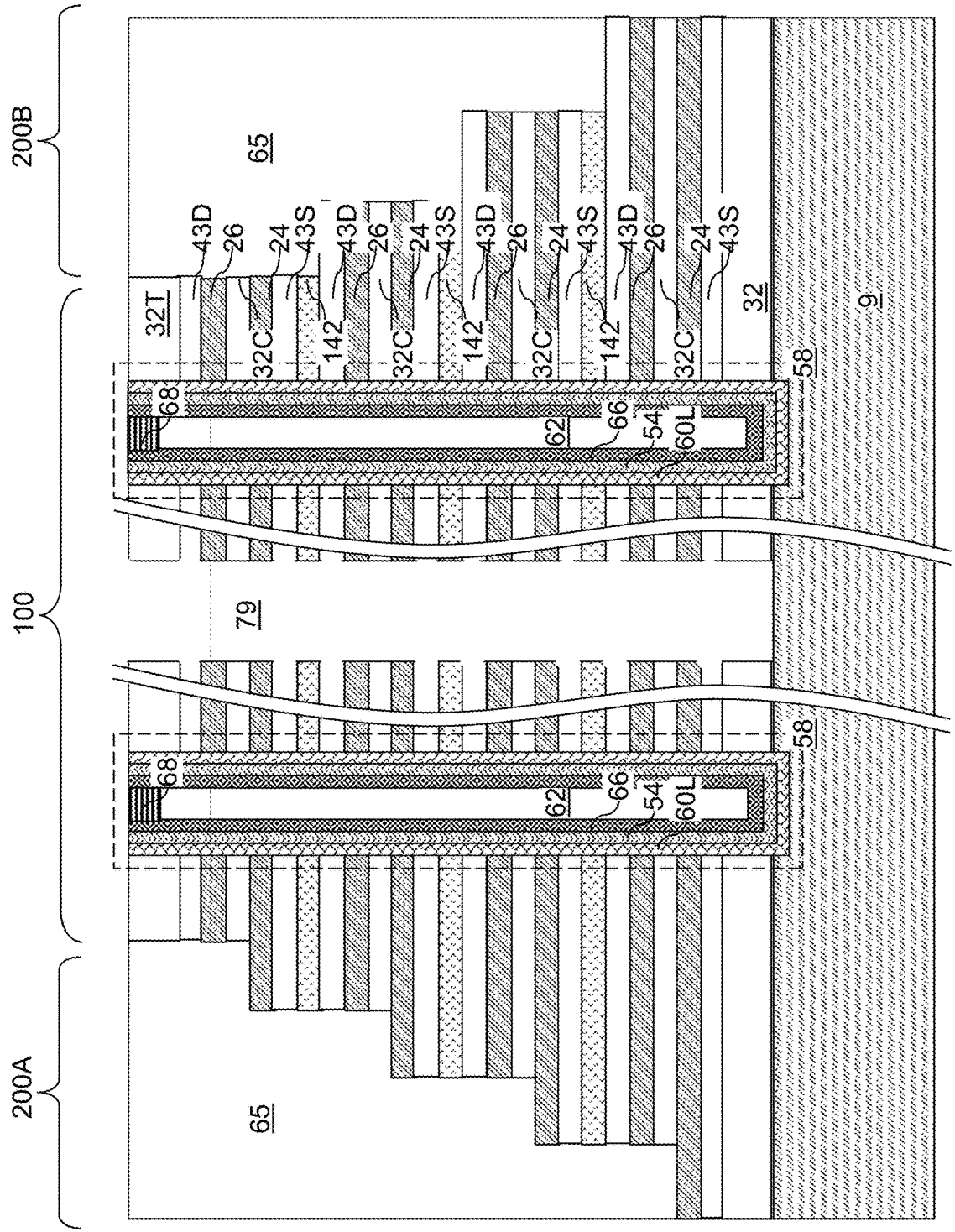
FIG. 16 is a schematic vertical cross-sectional view of the second exemplary structure after formation of source-level backside recesses and drain-level backside recesses according to the second embodiment of the present disclosure.

Referring to FIG. 16, an etchant that selectively etches the materials of the source sacrificial material layer 42S and drain sacrificial material layers 42D with respect to the materials of the insulating layers 32, the inter-transistor-level sacrificial material layers 142, the doped semiconductor source layers 24, the doped semiconductor drain layers 26, the retro-stepped dielectric material portions 65, and the continuous semiconductor channel layers 60L can be introduced into the backside trenches 79, for example, employing an etch process. Source-level backside recesses 43S and drain-level backside recesses 43D are formed in volumes from which the source sacrificial material layer 42S and drain sacrificial material layers 42D are removed, respectively. In one embodiment, the source sacrificial material layer 42S and drain sacrificial material layers 42D can include silicon nitride; the inter-transistor-level sacrificial material layers 142 can include a material such as a dielectric metal oxide (e.g., aluminum oxide), a silicon-germanium alloy having an atomic concentration of germanium greater than 20%, a polymer material, or a metallic material that is different from the metallic materials to be employed for metallic source layers and metallic drain layers that subsequently replace the source sacrificial material layers 42S and the drain sacrificial material layers 42D; and the materials of the channel-level insulating layers 32 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials.

Figure 17:
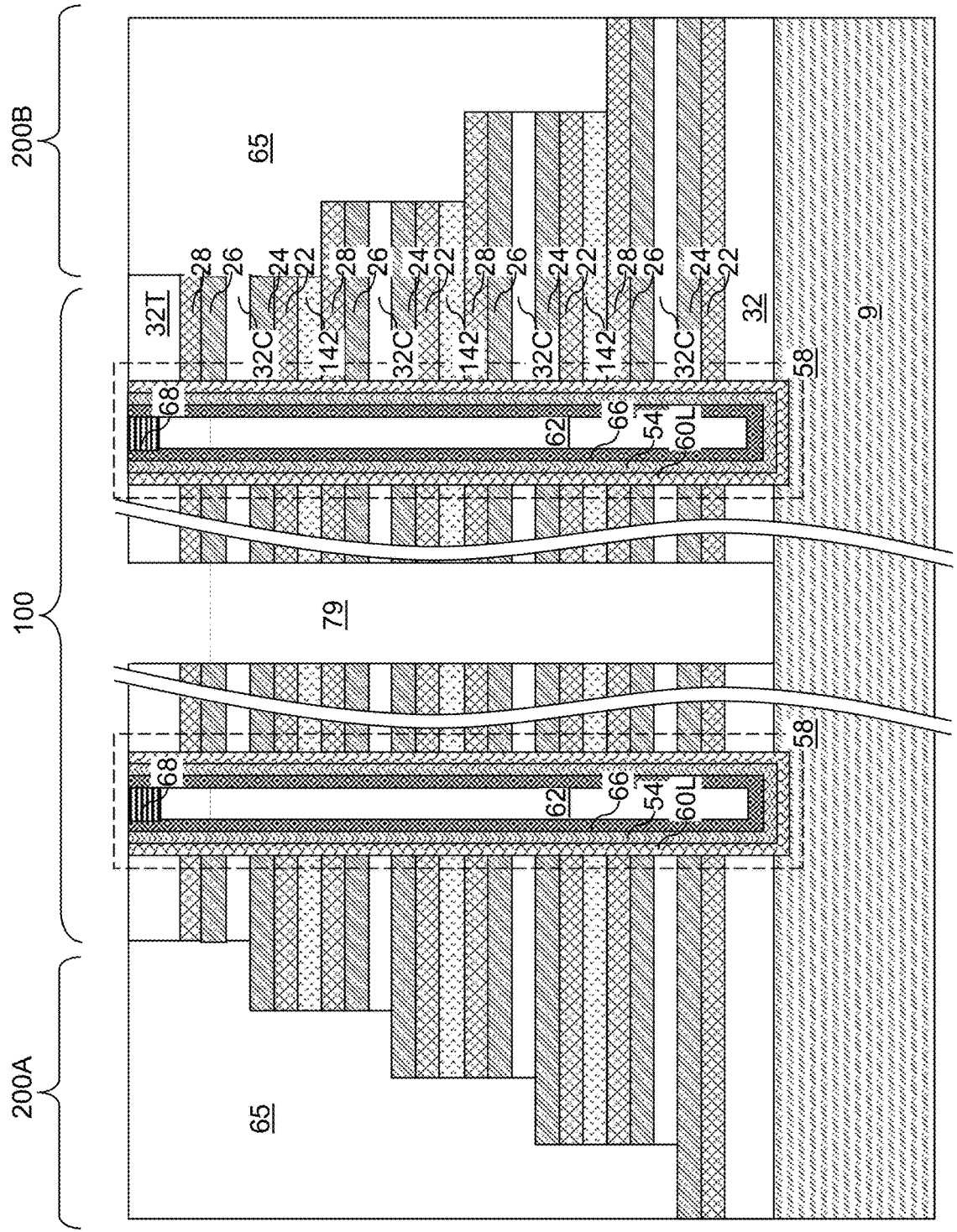
FIG. 17 is a schematic vertical cross-sectional view of the second exemplary structure after formation of metallic source layers and metallic drain layers according to the second embodiment of the present disclosure.

Referring to FIG. 17, at least one metallic material can be deposited in the source-level backside recesses 43S and the drain-level backside recesses 43D. The at least one metallic material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. The at least one metallic material fills all volumes of the source-level backside recesses 43S and the drain-level backside recesses 43D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22. Remaining portions of the at least one metallic material that fills the drain-level backside recesses 43D constitute metallic drain layers 28. Each contiguous combination of a doped semiconductor source layer 24 and a metallic source layer 22 constitutes a source layer (22, 24) that functions as source regions and a source line for a respective two-dimensional array of vertical field effect transistors. Each contiguous combination of a doped semiconductor drain layer 26 and a metallic drain layer 28 constitutes a drain layer (26, 28) that functions as drain regions and a bit line for a respective two-dimensional array of vertical field effect transistors.

The source sacrificial material layer 42S and the drain-level sacrificial material layers 42D are optional elements that may be omitted. In case the source sacrificial material layer 42S and the drain-level sacrificial material layers 42D are present, the source sacrificial material layer 42S and the drain-level sacrificial material layers 42D are replaced with the metallic source layers 22 and the metallic drain layers 28, respectively. In this case, each of the source layers (22, 24) comprises a vertical stack of a doped semiconductor source layer 24 and a metallic source layer 22, and each of the drain layers (26, 28) comprises a vertical stack of a doped semiconductor drain layer 26 and a metallic drain layer 28. In case the source sacrificial material layer 42S and the drain-level sacrificial material layers 42D are omitted, each of the source layers consists of a doped semiconductor source layer 24 or a doped semiconductor drain layer 26.

Figure 18:
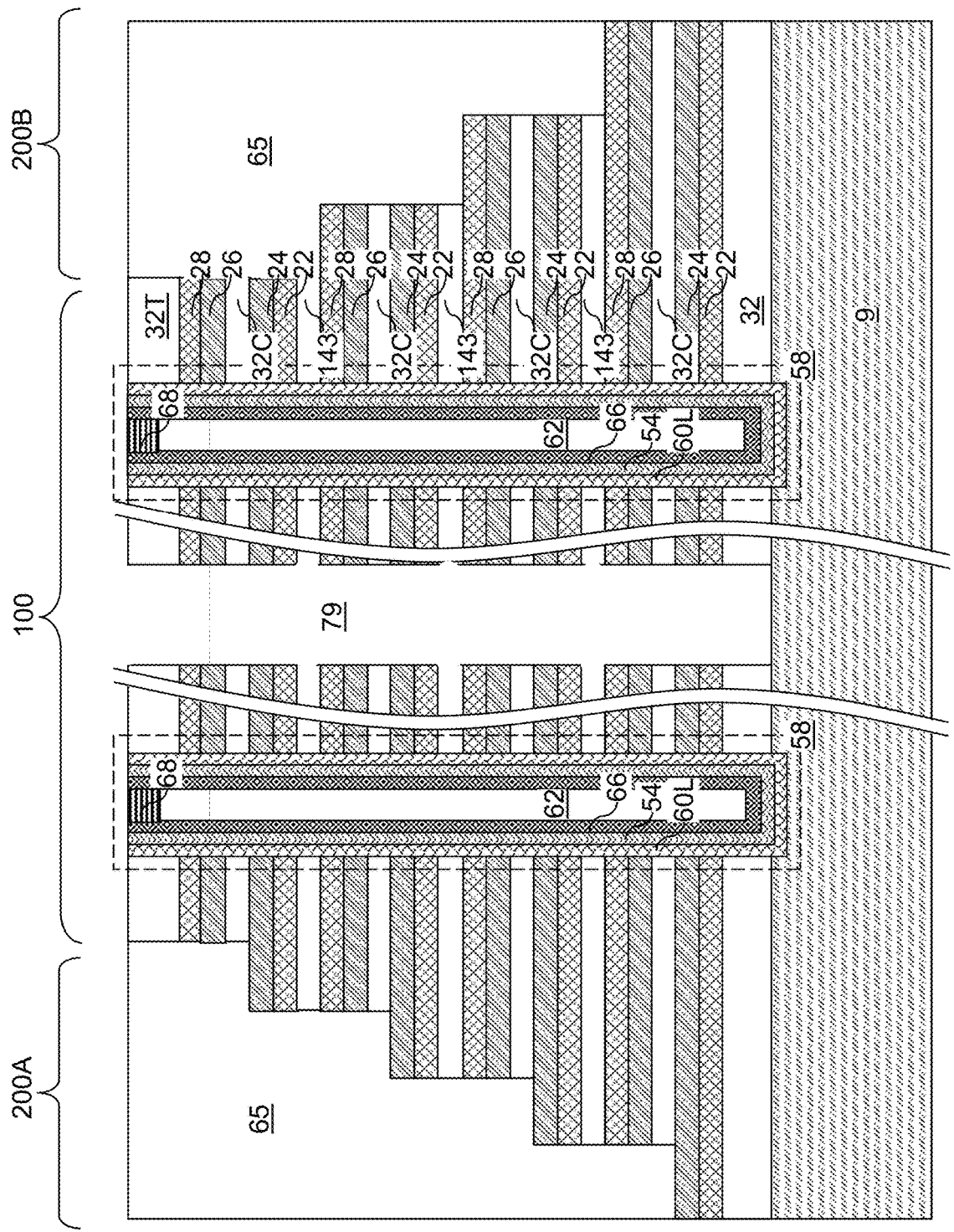
FIG. 18 is a vertical cross-sectional view of the second exemplary structure after formation of inter-transistor backside recesses according to the second embodiment of the present disclosure.

Referring to FIG. 18, inter-transistor backside recesses 143 can be formed by removing the inter-transistor-level sacrificial material layers 142 selective to the materials of the doped semiconductor source layers 24, the doped semiconductor drain layers 26, the channel-level insulating layers 32C, the metallic source layers 22, and the metallic drain layers 28. In one embodiment, the inter-transistor-level sacrificial material layers 142 can include a material such as a dielectric metal oxide (e.g., aluminum oxide), a silicon-germanium alloy having an atomic concentration of germanium greater than 20%, a polymer material, or a metallic material that is different from the metallic materials of the metallic source layers 22 and the metallic drain layers 28, and the channel-level insulating layers 32C can include silicon oxide.

Figure 19:
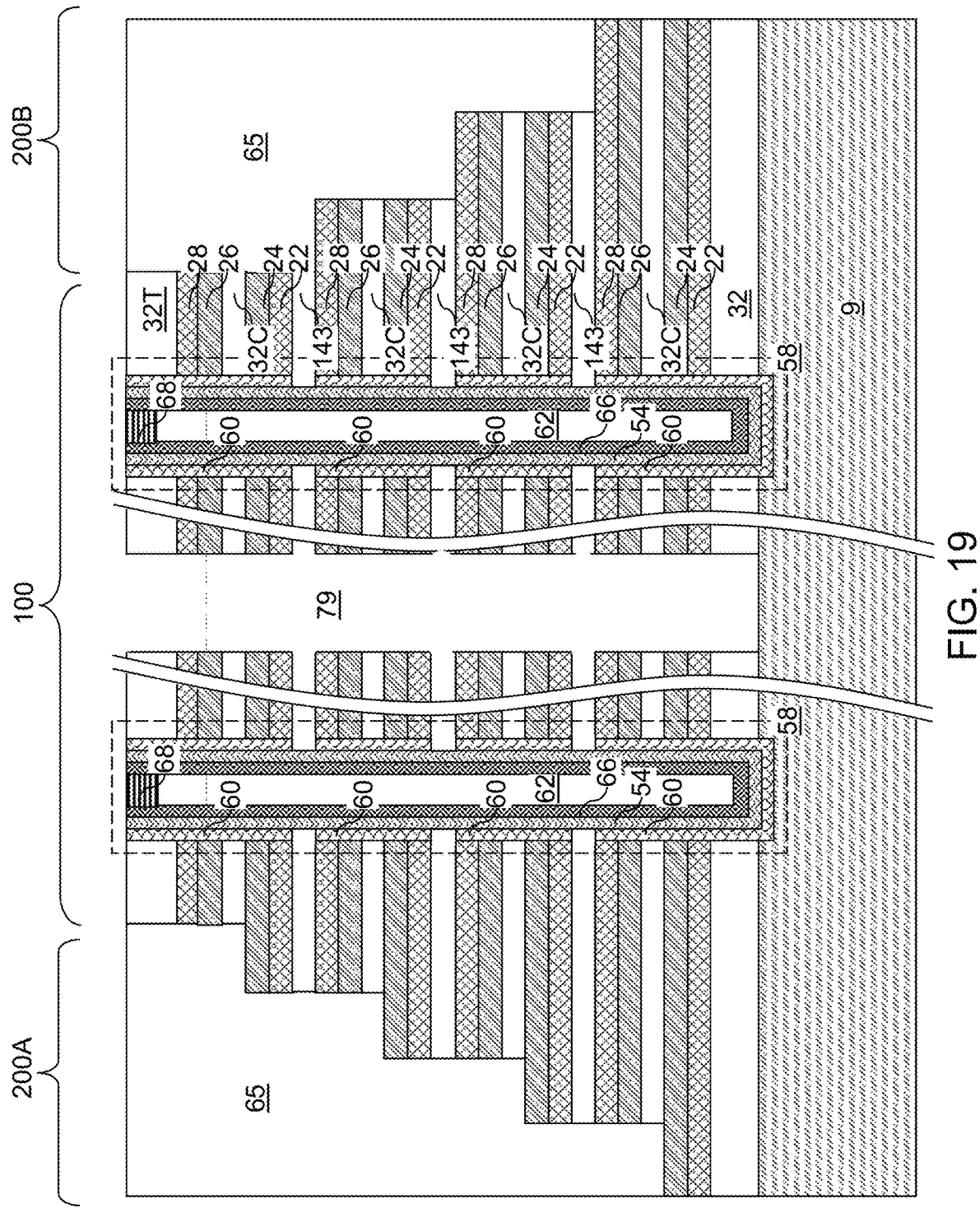
FIG. 19 is a vertical cross-sectional view of the second exemplary structure after dividing each continuous semiconductor channel layer into a set of discrete semiconductor channels that are vertically spaced apart from each other according to the second embodiment of the present disclosure.

Referring to FIG. 19, an isotropic etch process can be performed to remove physically exposed portions of the continuous semiconductor channel layers 60L that are exposed in the inter-transistor backside recesses 143. Removal of the physically exposed portions of the continuous semiconductor channel layers 60L may be selective to the materials of the doped semiconductor source layers 24 and the doped semiconductor drain layers 26. For example, the continuous semiconductor channel layers 60L can include amorphous silicon including dopants of the second conductivity type (e.g., p-type) at an atomic concentration in a range from $1.0 \times 10^{14}/cm^3$ to $3.0 \times 10^{17}/cm^3$, and the doped semiconductor source layers 24 and the doped semiconductor drain layers 26 can include polysilicon or amorphous silicon including dopants of the first conductivity type (e.g., n-type) at an atomic concentration in a range from $5.0 \times 10^{19}/cm^3$ to $2.0 \times 10^{21}/cm^3$. In this case, an isotropic etch process that etches the physically exposed portions of the continuous semiconductor channel layers 60L can employ a wet etch process employing hot trimethyl-2 hydroxyethyl ammonium hydroxide ("hot TMY") or tetramethyl ammonium hydroxide (TMAH). Alternatively, physically exposed surface portions of the doped semiconductor source layers 24 and the doped semiconductor drain layers 26 may be collaterally etched during removal of the physically exposed portions of the continuous semiconductor channel layers 60L.

Portions of each continuous semiconductor channel layer 60L that are physically exposed to the inter-transistor-level backside recesses 143 can be removed by the isotropic etch process. Thus, the isotropic etch process can divide each continuous semiconductor channel layer 60L into a set of discrete semiconductor channels 60 that are vertically spaced apart from each other. In other words, the remaining portions of each continuous semiconductor channel layer 60L include a set of discrete semiconductor channels 60 that are not in direct contact with each other. Each of the discrete semiconductor channels 60 contacts a cylindrical vertical surface of a respective one of the source layers (22, 24) and a cylindrical vertical surface of a respective one of the drain layers (26, 28).

Figure 20:
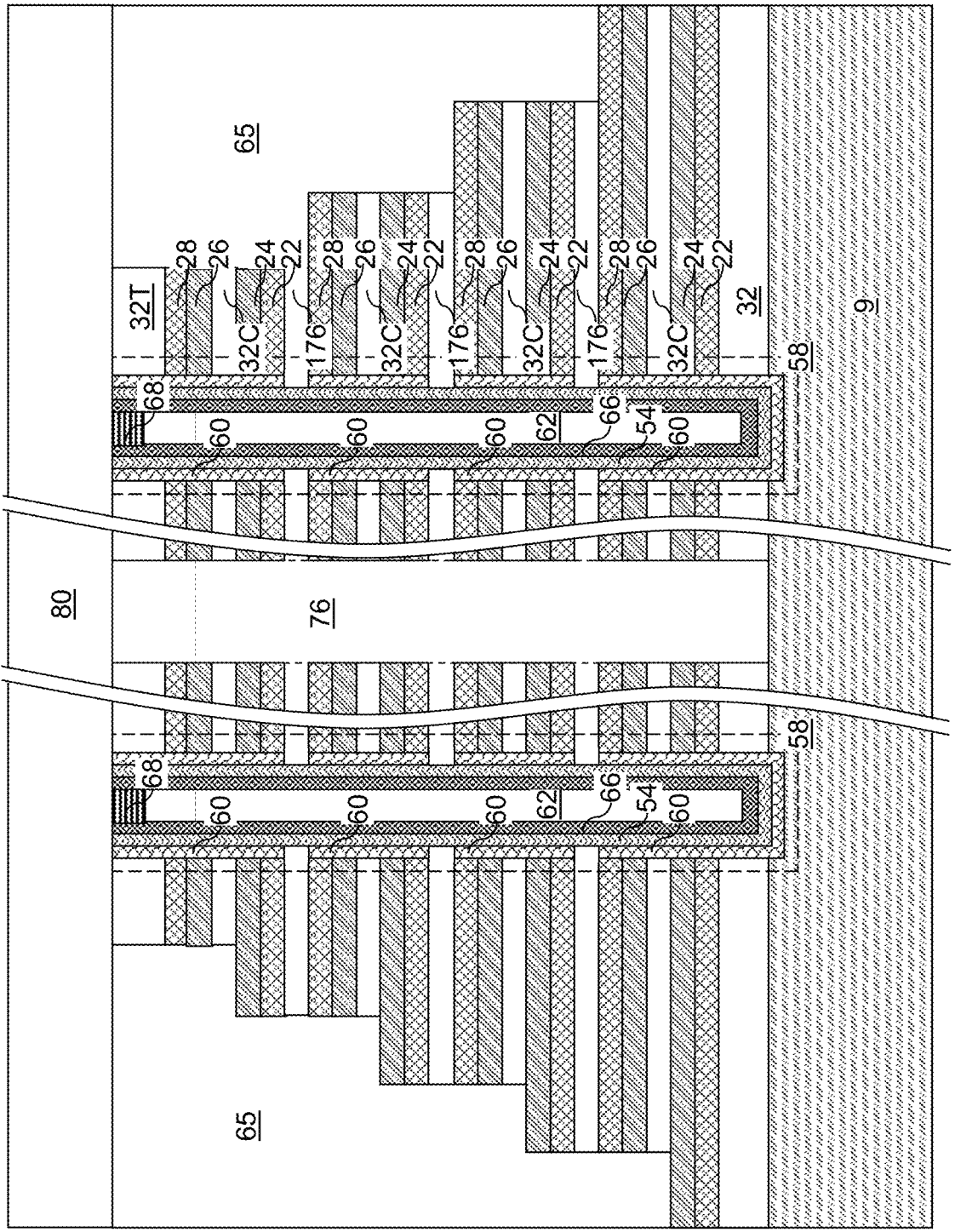
FIG. 20 is a vertical cross-sectional view of the second exemplary structure after deposition of a replacement insulating layer in the inter-transistor backside recesses and formation of a backside trench fill structure according to the second embodiment of the present disclosure.

Referring to FIG. 20, a dielectric material can be deposited in the inter-transistor backside recesses 143 by a conformal deposition process. Portions of the dielectric material that fill the inter-transistor-level backside recesses 143 constitute replacement insulating layers, which are herein referred to as inter-transistor-level insulating layers 176. Portions of the dielectric material that fills the backside trenches 79 constitute backside trench fill structures 76. Portions of the dielectric fill material that overlies the topmost insulating layer 32T constitutes a contact-level dielectric layer 80. The dielectric material of the inter-transistor-level insulating layers 176, the backside trench fill structure 76, and the contact-level dielectric layer 80 can have a uniform material composition throughout, and can include a doped silicate glass, an undoped silicate glass, or organosilicate glass.

Insulating layers (32C, 176) are provided between each vertically neighboring pair of a source layer (22, 24) and a drain layer (26, 28). In one embodiment, the insulating layers (32C, 176) can have a same dielectric material composition throughout, which may be the composition of a doped silicate glass, undoped silicate glass, or organosilicate glass. In another embodiment, the channel-level insulating layers 32C may have a different composition than the inter-transistor-level insulating layers 176. For example, channel-level insulating layers 32C in contact with a sidewall of a respective one of the semiconductor channels 60 can have a first dielectric material composition, and inter-transistor-level insulating layers 176 that do not contact the sidewalls of the semiconductor channels 60 can have a second dielectric material composition that is different from the first dielectric material composition. In one embodiment, each semiconductor channel 60 contacts a cylindrical sidewall of a respective channel-level insulating layer 32C located between a respective vertically neighboring pair of a source layer (22, 24) and a drain layer (26, 28).

Figure 21:
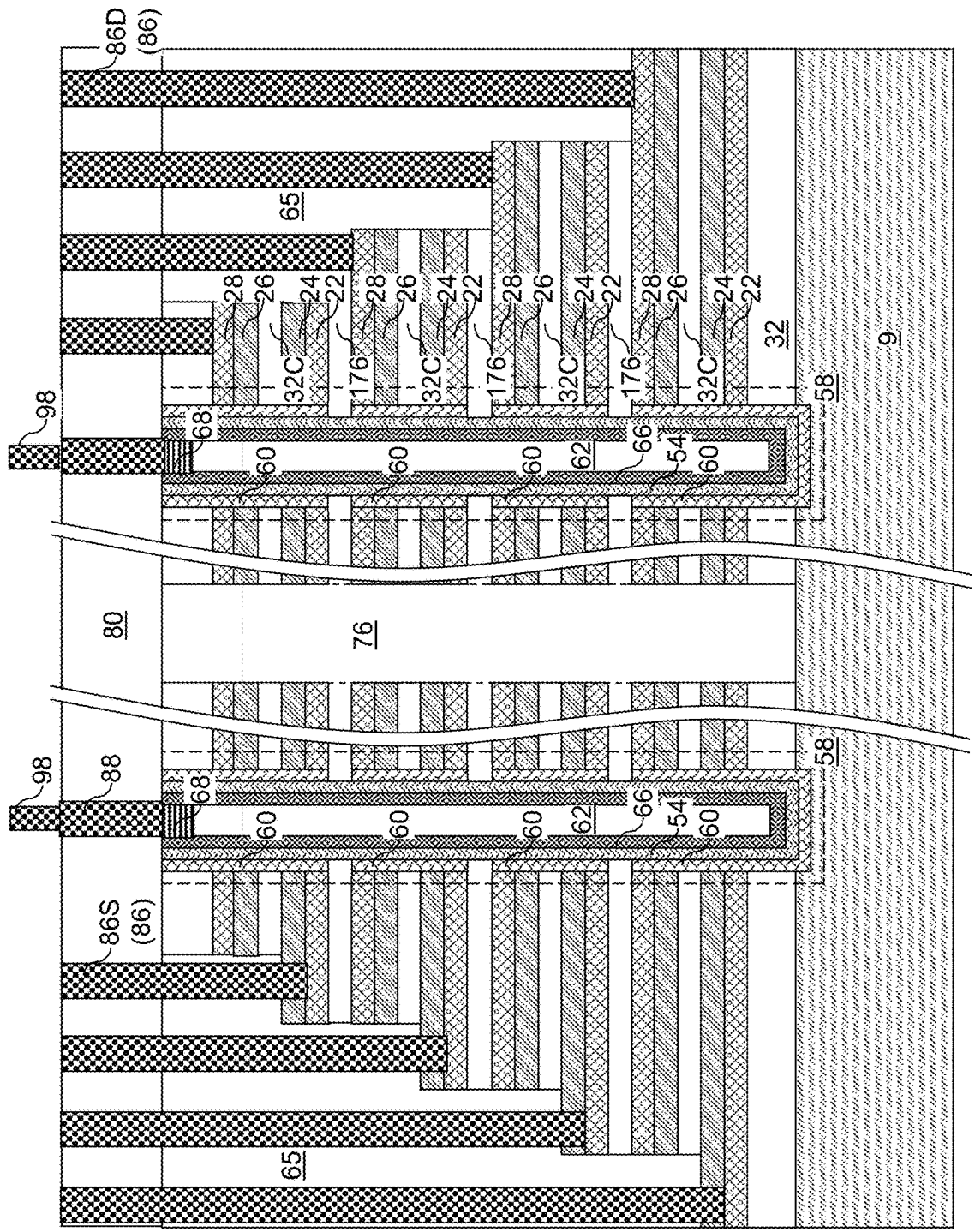
FIG. 21 is a schematic vertical cross-sectional view of the second exemplary structure after formation of contact via structures according to the second embodiment of the present disclosure.

Referring to FIG. 21, the processing steps of FIG. 9A can be performed to form The contact via structures (88, 86) through the contact-level dielectric layer 80 and optionally through a retro-stepped dielectric material portion 65. The contact via structures (88, 86) include word line contact via structures 88 each of which contacts a respective one of the contact pad structures 68, and is electrically connected to a respective gate electrode 66. Further, the contact via structures (88, 86) include layer contact via structures 86 (e.g., 86S, 86D) that contact a respective one of the source layers (22, 24) and the drain layers (26, 28) within the respective staircase regions (200A, 200B). Specifically, each of the layer contact via structures (86S, 86D) can contact a horizontal surface of a respective one of the source layers (22, 24) or one of the drain layers (26, 28) exposed in the stepped surfaces in the staircase regions (200A, 200B). Word lines 98 are then formed over the contact-level dielectric layer 80 (and over gate electrodes 66, the source layers (22, 24) and the drain layers (26, 28)) and in electrical contact with the gate electrodes 66 through the contact via structures 88 and the optional contact pad structures 68.

Referring to all drawings of the first exemplary structure and the second exemplary structure of the first and second embodiments, a three-dimensional memory device is provided, which comprises: an alternating stack of source layers (24 and optionally 22) and drain layers (26 and optionally 28) located over a substrate 9; gate electrodes 66 vertically extending through each of the source layers (24 and optionally 22) and the drain layers (26 and optionally 28) of the alternating stack; memory films 54, each laterally surrounding a respective one of the gate electrodes 66; and semiconductor channels (60 or portions of layer 60L), each laterally surrounding a respective one of the memory films 54 and contacting sidewalls of a respective vertically neighboring pair of a source layer (24 and optionally 22) of the source layers (24 and optionally 22) and a drain layer (26 and optionally 28) of the drain layers (26 and optionally 28).

In one embodiment, word lines 98 are located over the gate electrodes 66 and over the alternating stack of the source layers and the drain layers, wherein the word lines are electrically connected to the gate electrodes. An array of memory openings 49, such as cylindrical memory openings, can vertically extend through the alternating stack, and each of the gate electrodes 66 is located within a respective one of the memory openings 49. Each of the semiconductor channels may have a hollow cylinder shape.

Each gate electrode 66 may extend through the alternating stack of at least four source layers (24 and optionally 22) and at least four drain layers (26 and optionally 28) located over a substrate 9.

Insulating layers {(32C, 32I) or (32C, 176)} can be located between each vertically neighboring pair of the first source layer (24 and optionally 22) and the drain layer (26 and optionally 28). In one embodiment, the insulating layers {(32C, 32I) or (32C, 176)} have a same dielectric material composition throughout. In another embodiment, the insulating layers {(32C, 32I) or (32C, 176)} comprise: channel-level insulating layers 32C in contact with a respective one of the semiconductor channels (60 or portions of layer 60L) and having a first dielectric material composition; and inter-transistor-level insulating layers 176 that do not contact any of the semiconductor channels (60 or portions of layer 60L) and having a second dielectric material composition that is different from the first dielectric material composition.

In one embodiment, semiconductor channel comprises a respective portion of a continuous semiconductor channel layer 60L that extends through each source layer (24 and optionally 22) and each drain layer (26 and optionally 28) within the alternating stack.

In another embodiment, each of the semiconductor channels comprises one channel 60 of a set of discrete semiconductor channels 60 that are vertically spaced apart from each other. In one embodiment, each of the discrete semiconductor channels 60 comprises an annular top surface that contacts a bottom surface a respective overlying inter-transistor insulating layer 176 and an annular bottom surface that contacts a respective underlying inter-transistor insulating layer 176.

In one embodiment, each of the semiconductor channels (60 or portions of 60L) contacts a cylindrical sidewall of a respective channel-level insulating layer 32C located between a respective vertically neighboring pair of the source layer (24 and optionally 22) and the drain layer (26 and optionally 28).

In one embodiment, each of the source layers (24, 22) comprises a vertical stack of a doped semiconductor source layer 24 and a metallic source line 22; and each of the drain layers (26, 28) comprises a vertical stack of a doped semiconductor drain layer 26 and a metallic drain line 28.

In one embodiment, each of the memory films 54 comprises a nested layer stack including: a tunneling dielectric layer 542; a charge storage layer 544 contacting the tunneling dielectric layer 542; a blocking dielectric layer 546 contacting the charge storage layer 544. In another embodiment, each of the memory films 54 comprises, and/or consists of, a ferroelectric material layer.

In one embodiment, the three-dimensional memory device comprises: source layer contact via structures 86S contacting a respective one of the source layers (24 and optionally 22); and drain layer contact via structures 86D contacting a respective one of the drain layers (26 and optionally 28).

In one embodiment, the source layers (24 and optionally 22) in the alternating stack have different lateral extents that decrease with a vertical distance from the substrate 9; the drain layers (26 and optionally 28) in the alternating stack have different lateral extents that decrease with a vertical distance from the substrate 9; a first retro-stepped dielectric material portion 65 contacts horizontal surfaces of the source layers (24 and optionally 22) in the alternating stack and laterally surrounds the source layer contact via structures 86S; and a second retro-stepped dielectric material portion 65 contacts horizontal surfaces of the drain layers (26 and optionally 28) in the alternating stack and laterally surrounds the drain layer contact via structures 86D.

In one embodiment, the gate electrodes 66 are vertically spaced from the substrate 9 by horizontal portions of the memory films 54; each of the gate electrodes 66 laterally surrounds a respective dielectric core 62; and contact pad structures 68 contact a top end of a respective one of the gate electrodes 66.

Figure 22:
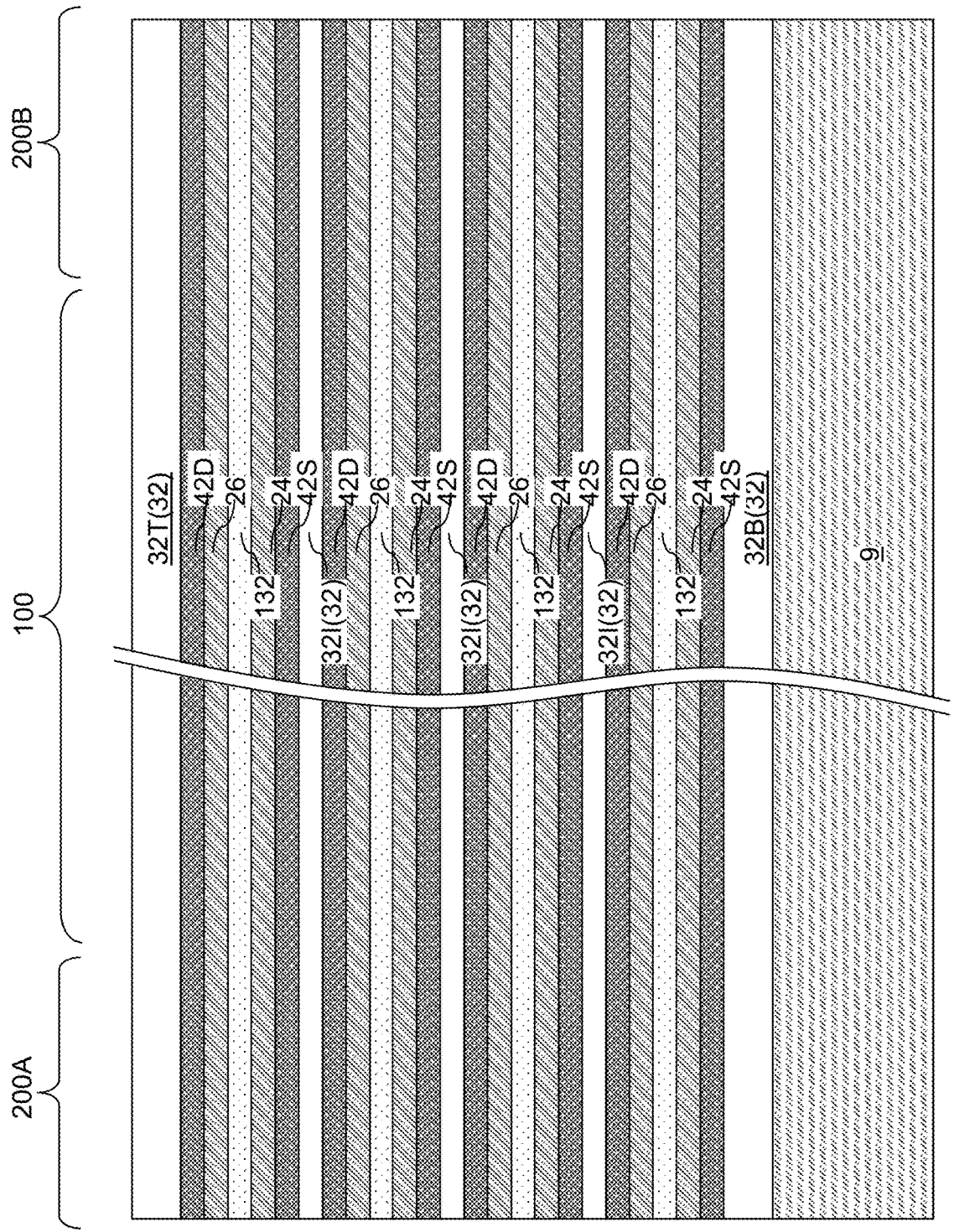
FIG. 22 is a schematic vertical cross-sectional view of a third exemplary structure after formation of multiple instances of a unit layer stack including a source sacrificial material layer, a doped semiconductor source layer, a channel-level insulating layer, a doped semiconductor drain layer, a drain sacrificial material layer, and an inter-transistor-level insulating layer over a substrate according to a third embodiment of the present disclosure.

Referring to FIG. 22, a third exemplary structure according to a third embodiment of the present disclosure can be derived from the first exemplary structure of FIG. 1 by replacing the channel-level insulating layers 32C with channel-level insulating layers 132 having a different material composition than the inter-transistor-level insulating layers 32I. Thus, each instance of the unit layer stack within the multiple instances of the unit layer stack includes a source sacrificial material layer 42S, a doped semiconductor source layer 24, a channel-level insulating layer 132, a doped semiconductor drain layer 26, a drain sacrificial material layer 42D, and an inter-transistor-level insulating layer 32I. In an alternative configuration, one or both of the source sacrificial material layers 42S and/or the drain sacrificial material layer 42D may be omitted.

The channel-level insulating layers 132 include a first insulating material and the inter-transistor-level insulating layers 32I include a second insulating material that can provide a lesser etch rate in an isotropic etch process. For example, the channel-level insulating layers 132 can include borosilicate glass or organosilicate glass, and the inter-transistor-level insulating layers 32I can include undoped silicate glass. In this case, the etch rate of the material of the channel-level insulating layers 132 in 100:1 diluted hydrofluoric acid can be at least 10 times, such as 100 or more times, the etch rate of the material of the inter-transistor-level insulating layers 32I in 100:1 diluted hydrofluoric acid. Each channel-level insulating layers 132 can have a thickness in a range from 5 nm to 50 nm, although lesser and greater thicknesses can also be employed. Alternatively, the channel-level insulating layers 132 can include aluminum oxide, and the inter-transistor-level insulating layers 32I can include undoped silicate glass (i.e., silicon oxide) if an aluminum oxide selective etch will be used.

The multiple instances of the unit layer stack include an alternating stack of doped semiconductor source layers 24 and doped semiconductor drain layers 26. The channel-level insulating layers 132 are formed at levels of semiconductor channels to be subsequently formed. For example, the channel-level insulating layers 132 can be formed between each vertically neighboring pair of an underlying doped semiconductor source layer 24 and an overlying doped semiconductor drain layer 26. The inter-transistor-level insulating layers 32I can be provided at levels of inter-transistor gaps to be subsequently formed. For example, the inter-transistor-level insulating layers 32I can be formed between vertically neighboring pairs of an overlying doped semiconductor source layer 24 and an underlying doped semiconductor drain layer 26. Thus, insulating layers (131, 32I) are formed between each vertically neighboring pair of a doped semiconductor source layer 24 and a doped semiconductor drain layer 26.

Figure 23:
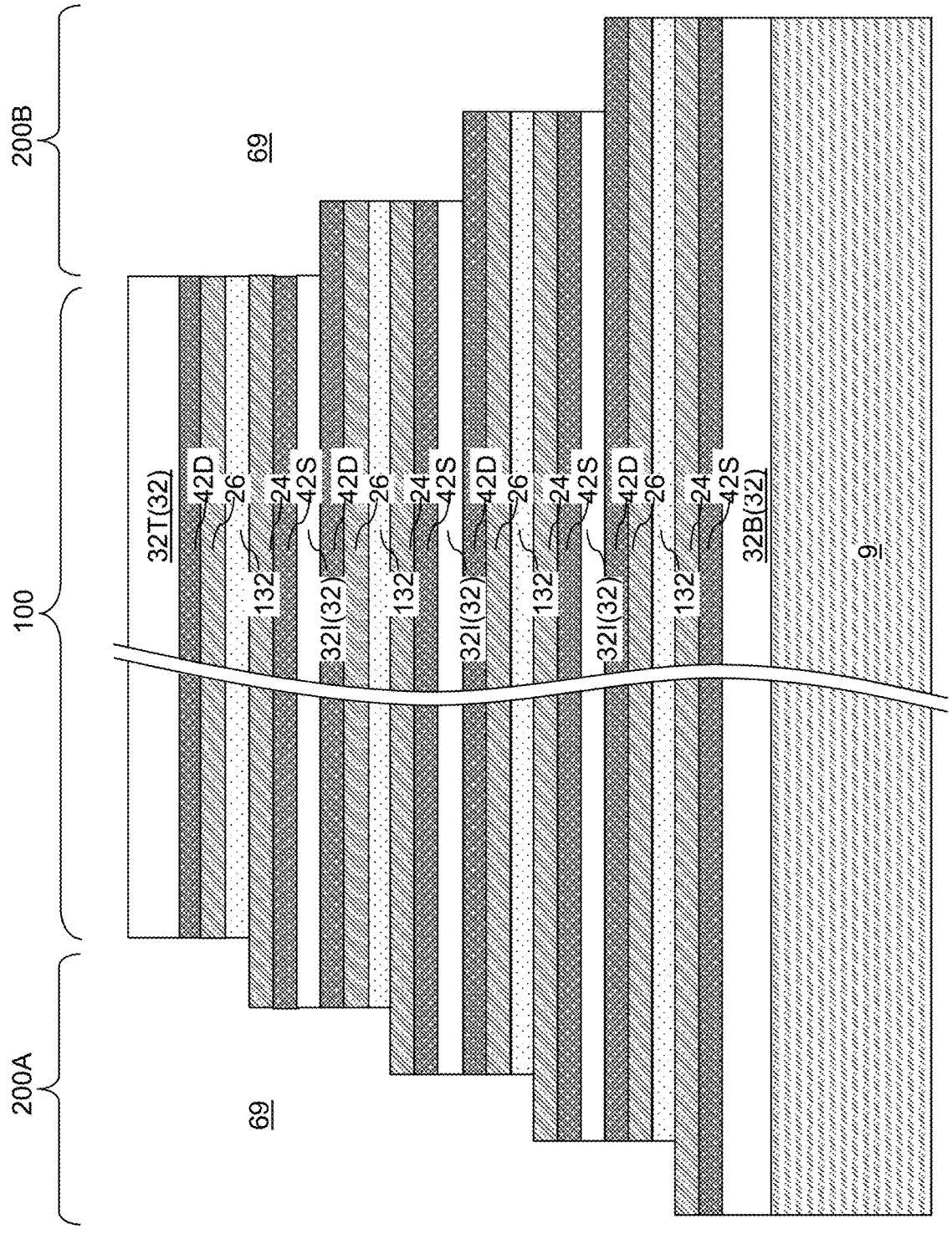
FIG. 23 is a schematic vertical cross-sectional view of the third exemplary structure after formation of stepped surfaces according to the third embodiment of the present disclosure.

Referring to FIG. 23, the processing steps of FIG. 2 can be performed to form stepped cavities 69 in the staircase regions (200A, 200B). Stepped surfaces are formed in the staircase regions (200A, 200B). Steps of the anisotropic etch processes for forming the stepped surfaces can be modified to provide an etch chemistry that effectively etches the channel-level insulating layers 132.

Figure 24A:
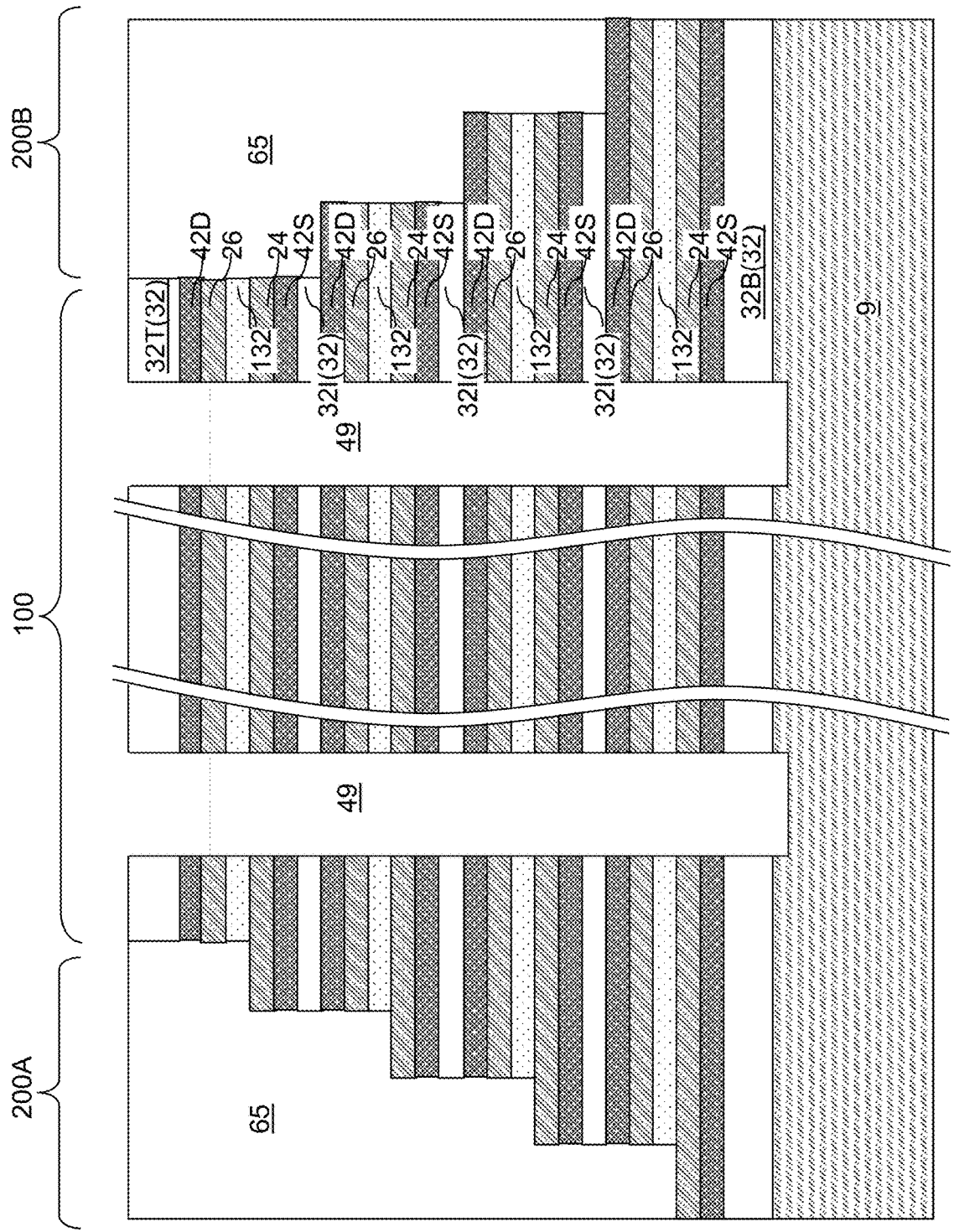
FIG. 24A is a schematic vertical cross-sectional view of the third exemplary structure after formation of retro-stepped dielectric material portions and an array of memory openings according to the third embodiment of the present disclosure.

Referring to FIGS. 24A and 24B, the processing steps of FIGS. 3A and 3B can be performed to form memory openings 49 through each layer in the multiple instances of the unit layer stack. As discussed above, the unit layer stack of the second exemplary structure can include a source sacrificial material layer 42S, a doped semiconductor source layer 24, a channel-level insulating layer 132, a doped semiconductor drain layer 26, a drain sacrificial material layer 42D, and an inter-transistor-level insulating layer 32I. Steps of the anisotropic etch processes for forming the memory openings 49 can be modified to provide an etch chemistry that effectively etches the channel-level insulating layers 132.

Figure 25:
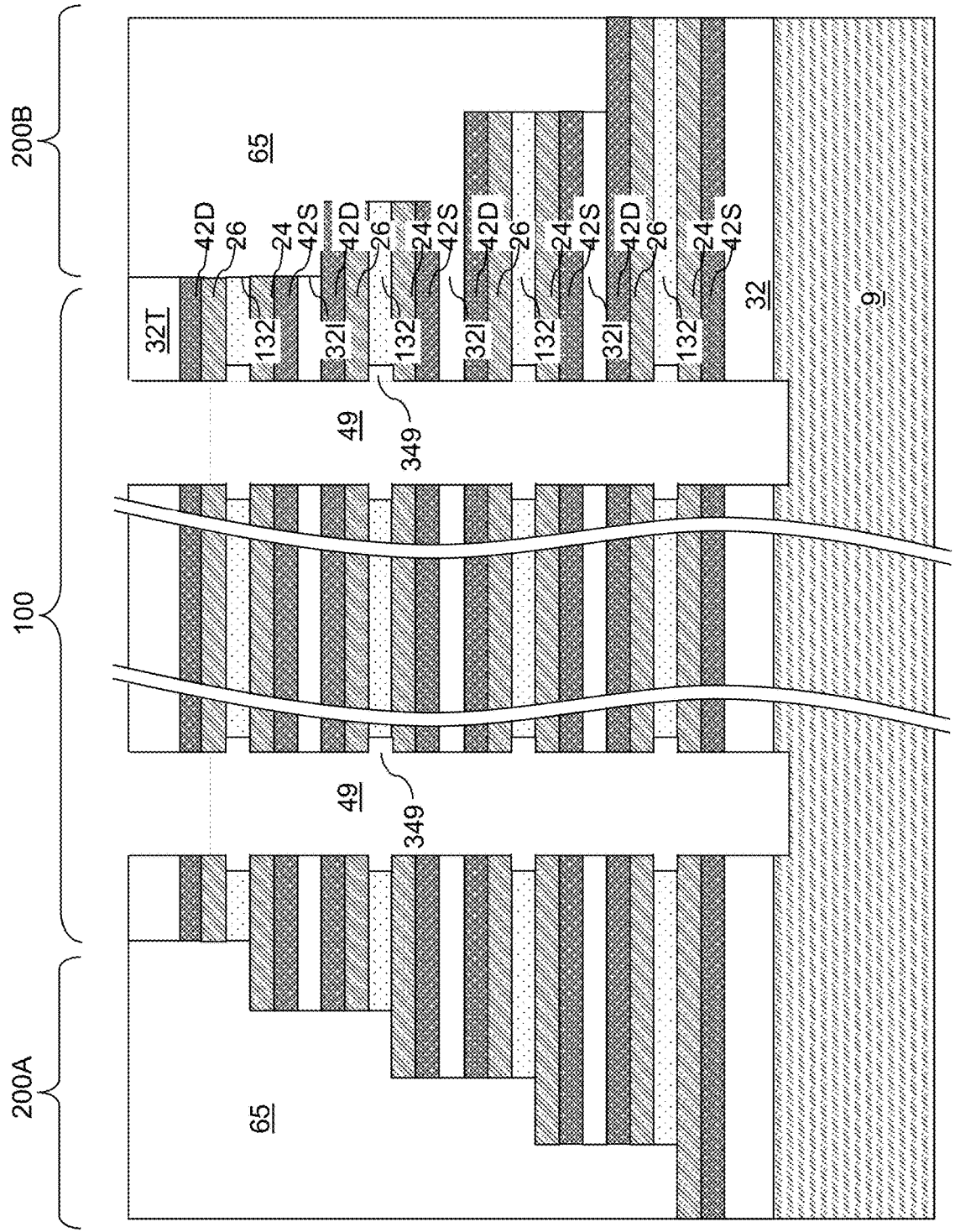
FIG. 25 is a schematic vertical cross-sectional view of the third exemplary structure after formation of annular cavities at each level of the channel-level insulating layers according to the third embodiment of the present disclosure.

Referring to FIG. 25, lateral annular cavities 349 can be formed at each level of the channel-level insulating layers 132 by laterally recessing the channel-level insulating layers 132 relative to the inter-transistor-level insulating layers 32I, the doped semiconductor source layers 24, the doped semiconductor drain layers 26, the source sacrificial material layers 42S, and the drain sacrificial material layers 42D. As discussed above, the first insulating material of the channel-level insulating layers 132 provides a greater etch rate than the second insulating material of the inter-transistor-level insulating layers 32I in an isotropic etch process. In one embodiment, the first insulating material of the channel-level insulating layers 132 can include borosilicate glass or organosilicate glass, and the second insulating material of the inter-transistor-level insulating layers 32I can include undoped silicate glass. In this case, the etch rate of the first insulating material of the channel-level insulating layers 132 in 100:1 diluted hydrofluoric acid can be at least 10 times, such as 100 or more times, the etch rate of the second insulating material of the inter-transistor-level insulating layers 32I in 100:1 diluted hydrofluoric acid. The isotropic etch process can be a wet etch process employing 100:1 dilute hydrofluoric acid. The lateral recess distance for each of the annular cavities 349 can be in a range from 5 nm to 100 nm, such as from 10 nm to 50 nm, although lesser and greater lateral recess distances can also be employed.

Figure 26:
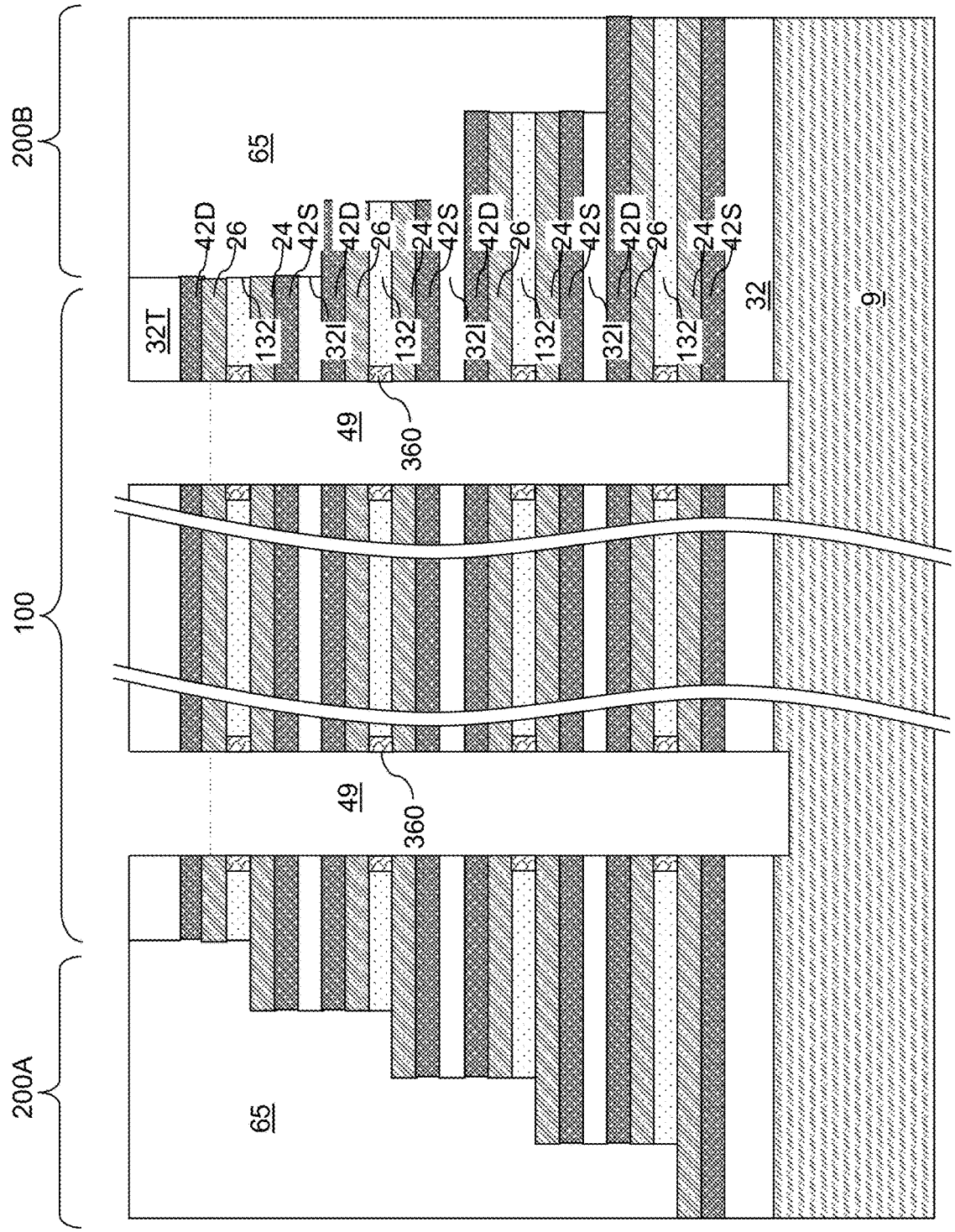
FIG. 26 is a schematic vertical cross-sectional view of the third exemplary structure after formation of vertical stacks of discrete semiconductor channels according to the third embodiment of the present disclosure.

Referring to FIG. 26, a semiconductor material can be deposited in the annular cavities 349 by a conformal deposition process such as a chemical vapor deposition process. The semiconductor material deposited in the annular cavities 349 can have the same material composition as the continuous semiconductor channel layers 60L used in the first exemplary structure. Portions of the conformally deposited semiconductor material can be removed from outside the annular cavities 349 by performing an anisotropic etch process. Remaining portions of the conformally deposited semiconductor material in the annular cavities 349 constitute vertical stacks of semiconductor channels 360. Each vertical stack of semiconductor channels 360 is formed as a set of discrete semiconductor channels located in the annular cavities 349 and vertically spaced apart from each other, i.e., without direct contact with each other. Each semiconductor channel 360 can have an annular shape (e.g., a hollow disc shape). For example, each semiconductor channel 360 can have an inner cylindrical sidewall, an outer cylindrical sidewall, a top annular surface, and a bottom annular surface.

Each of the discrete semiconductor channels 360 contacts a cylindrical sidewall of a respective one of the channel-level insulating layers 132. The insulating layers (132, 32I) in the multiple instances of the unit layer stack include channel-level insulating layers 132 in contact with a sidewall of a respective one of the semiconductor channels 360, and inter-transistor-level insulating layers 32I that do not contact any of the semiconductor channels 360. Sidewalls of the channel-level insulating layers 132 are laterally recessed outward relative to sidewalls of the inter-transistor-level insulating layers 32I and relative to sidewalls of the doped semiconductor source layers 24 and the doped semiconductor drain layers 26 around each memory opening 49. Each of the channel-level insulating layers 132 can be in direct contact with horizontal surfaces of a respective one of the doped semiconductor source layers 24 and a respective one of the doped semiconductor drain layers 26.

Each of the semiconductor channels 360 is formed on horizontal surfaces of a respective vertically neighboring pair of a doped semiconductor source layer 24 and a doped semiconductor drain layer 26 prior to formation of the memory films and the gate electrodes. A vertical stack of semiconductor channels 360 is formed in each of the memory openings 49. Each of the semiconductor channels 360 is connected to a respective vertically neighboring pair of a doped semiconductor source layer 24 and a doped semiconductor drain layer 26.

In one embodiment, an entirety of an outer sidewall of each semiconductor channel 360 contacts a cylindrical sidewall of a respective channel-level insulating layer 132 located between a respective vertically neighboring pair of a doped semiconductor source layer 24 and a doped semiconductor drain layer 26. In one embodiment, the outer sidewall includes an upper periphery contacting a horizontal surface of one of the doped semiconductor source layer 24 and the doped semiconductor drain layer 26 in the respective vertically neighboring pair, and includes a lower periphery contacting a horizontal surface of another of the doped semiconductor source layer 24 and the doped semiconductor drain layer 26 in the respective vertically neighboring pair.

Figure 27:
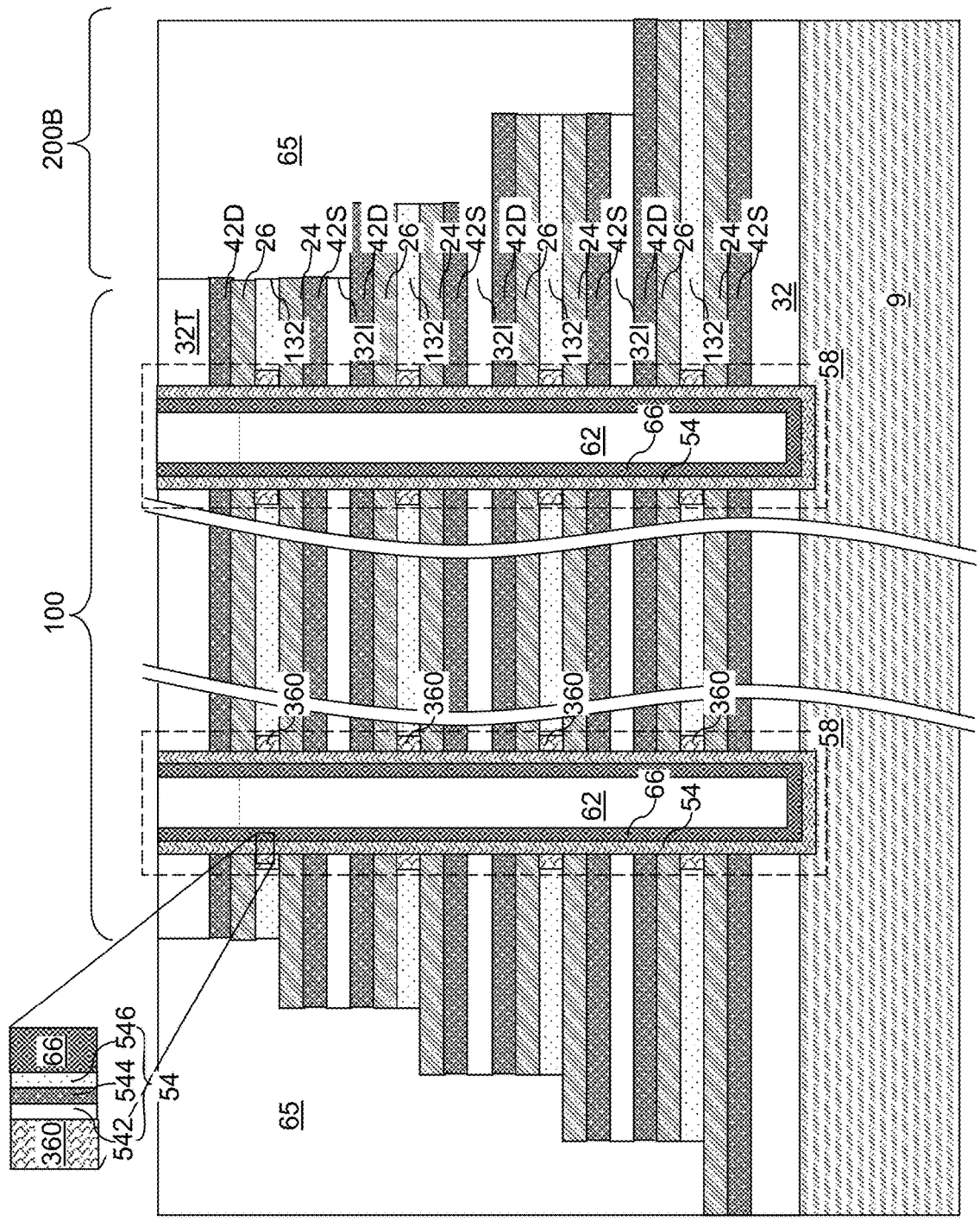
FIG. 27 is a schematic vertical cross-sectional view of the third exemplary structure after formation of memory opening fill structures according to the third embodiment of the present disclosure.

Referring to FIG. 27, continuous material layers can be sequentially deposited in each of the memory openings 49. The continuous material layers can include a continuous memory film, a continuous conductive material layer, and an optional dielectric fill material layer. Excess portions of the continuous material layers can be removed from above the horizontal plane including the top surface of the topmost insulating layers 32T and the top surfaces of the retro-stepped dielectric material portions by a planarization process. The planarization process can employ chemical mechanical planarization and/or at least one recess etch process. Each portion of the continuous material layers that remain in a memory opening 49 constitutes a memory opening fill structure 58.

Each memory opening fill structure 58 includes a memory film 54, a gate electrode 66, and an optional dielectric core 62. Each memory film 54 is a remaining portion of the continuous memory film after the planarization process. Each gate electrode 66 is a remaining portion of the continuous conductive material layer after the planarization process. Each dielectric core 62 is a remaining portion of the dielectric fill material layer. Each vertical stack of semiconductor channels 360 laterally surrounds a respective memory film 54 and a respective gate electrode 66.

The memory film 54 includes at least one material layer that can store data bits in the form of trapped electrical charges, polarization, or magnetic moments. In one embodiment, the memory film each of the memory films comprises a layer stack including, from outside to inside, a tunneling dielectric layer 542, a charge storage layer 544 contacting the tunneling dielectric layer 542, and a blocking dielectric layer 546 contacting the charge storage layer 544. The tunneling dielectric layer 542 can include a tunneling dielectric material such as silicon oxide or an ONO stack (i.e., a stack of a silicon oxide layer, a silicon nitride layer, and a silicon oxide layer). The charge storage layer 544 can include a charge storage material such as silicon nitride. The blocking dielectric layer 546 can include a blocking dielectric material such as silicon oxide and/or a dielectric metal oxide. In another embodiment, each of the memory films 54 comprises a ferroelectric material layer (not shown) and at least one optional dielectric material layer (such as a silicon oxide layer) that can contact the semiconductor channels 360 or the gate electrode 66.

Each gate electrode 66 includes a conductive material such as a metallic material. For example, each gate electrode 66 can include a layer stack of a metallic nitride liner including a conductive metallic nitride (such as TiN, TaN, or WN) and a metal layer including a metal (such as W, Co, Mo, Ru, Cu, or an alloy thereof).

Each dielectric core 62 includes a dielectric fill material such as silicon oxide. In one embodiment, the dielectric cores 62 can include a dielectric material that has a higher etch rate than the topmost insulating layer 32T in an etch process. For example, the dielectric cores 62 can include borosilicate glass, organosilicate glass, or phosphosilicate glass, and the topmost insulating layer 32T can include densified undoped silicate glass. In this case, the material of the dielectric cores 62 can be subsequently recessed relative to the material of the topmost insulating layer 32T.

A memory film 54 is formed on each of the vertical stacks of semiconductor channels 360, and a gate electrode 66 is formed on each of the memory films 54. Each of the memory films 54 vertically extends through each of the doped semiconductor source layers 24 and the doped semiconductor drain layers 26 of the alternating stack of doped semiconductor source layers 24 and doped semiconductor drain layers 26. Each of the gate electrodes 66 vertically extends through each of the doped semiconductor source layers 24 and the doped semiconductor drain layers 26 of the alternating stack. Each gate electrode 66 extends through each doped semiconductor source layer 24 and each doped semiconductor drain layer 26 within the alternating stack of the doped semiconductor source layers 24 and the doped semiconductor drain layers 26.

Each memory film 54 includes a cylindrical portion and a bottom cap portion that adjoins a bottom periphery of the cylindrical portion. Each gate electrode 66 can include a cylindrical portion and a bottom cap portion that adjoins a bottom periphery of the cylindrical portion. The gate electrodes 66 can be vertically spaced from the substrate 9 by horizontal portions of the memory films 54. Each of the gate electrodes 66 can laterally surround a respective dielectric core 62.

Figure 28:
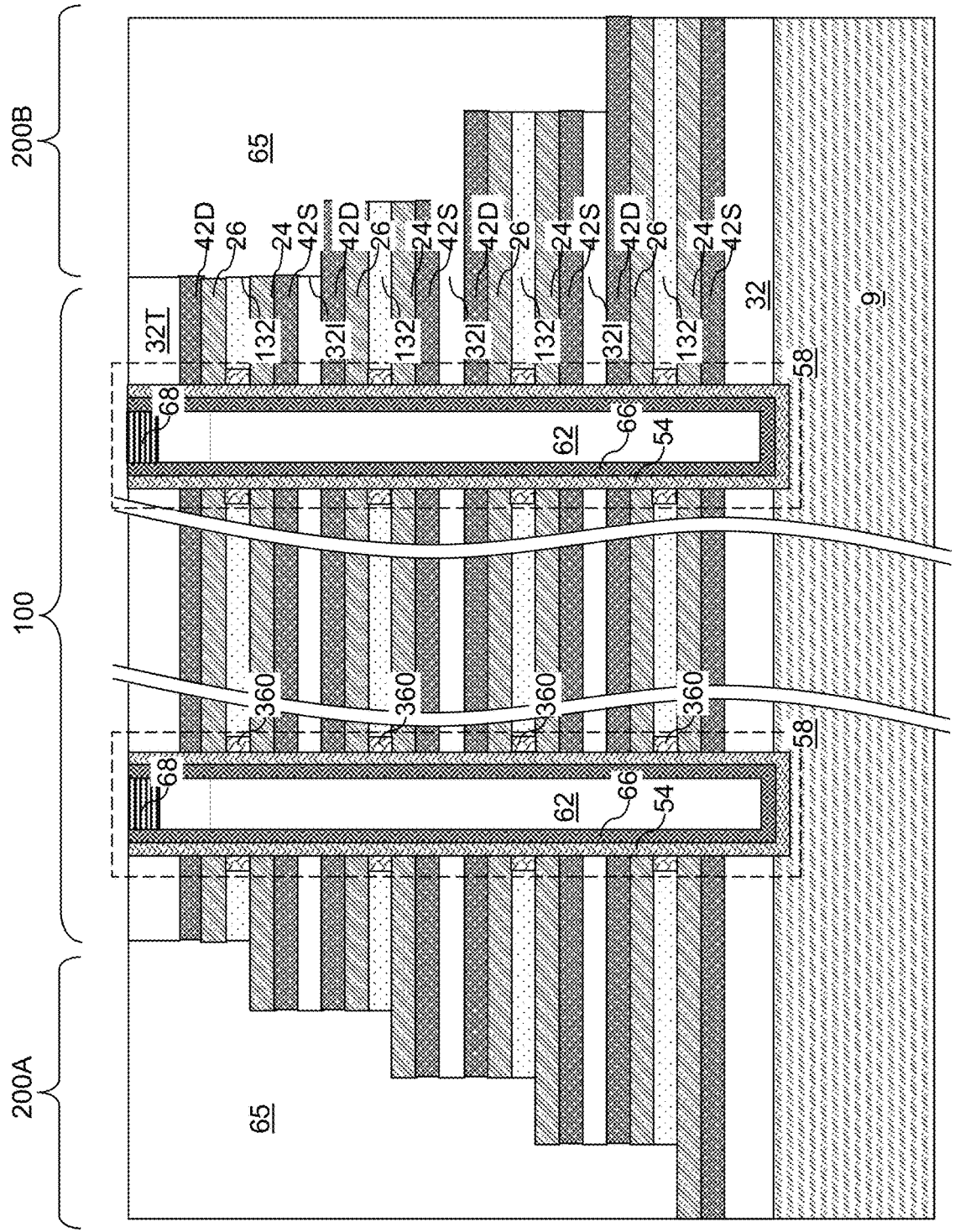
FIG. 28 is a schematic vertical cross-sectional view of the third exemplary structure after formation of contact pad structures according to the third embodiment of the present disclosure.

Referring to FIG. 28, the processing steps of FIG. 5 can be performed to form contact pad structures 68. Each memory opening fill structure 58 can include a respective contact pad structure 68 that contacts a top end of a respective one of the gate electrodes 66.

Figure 29A:
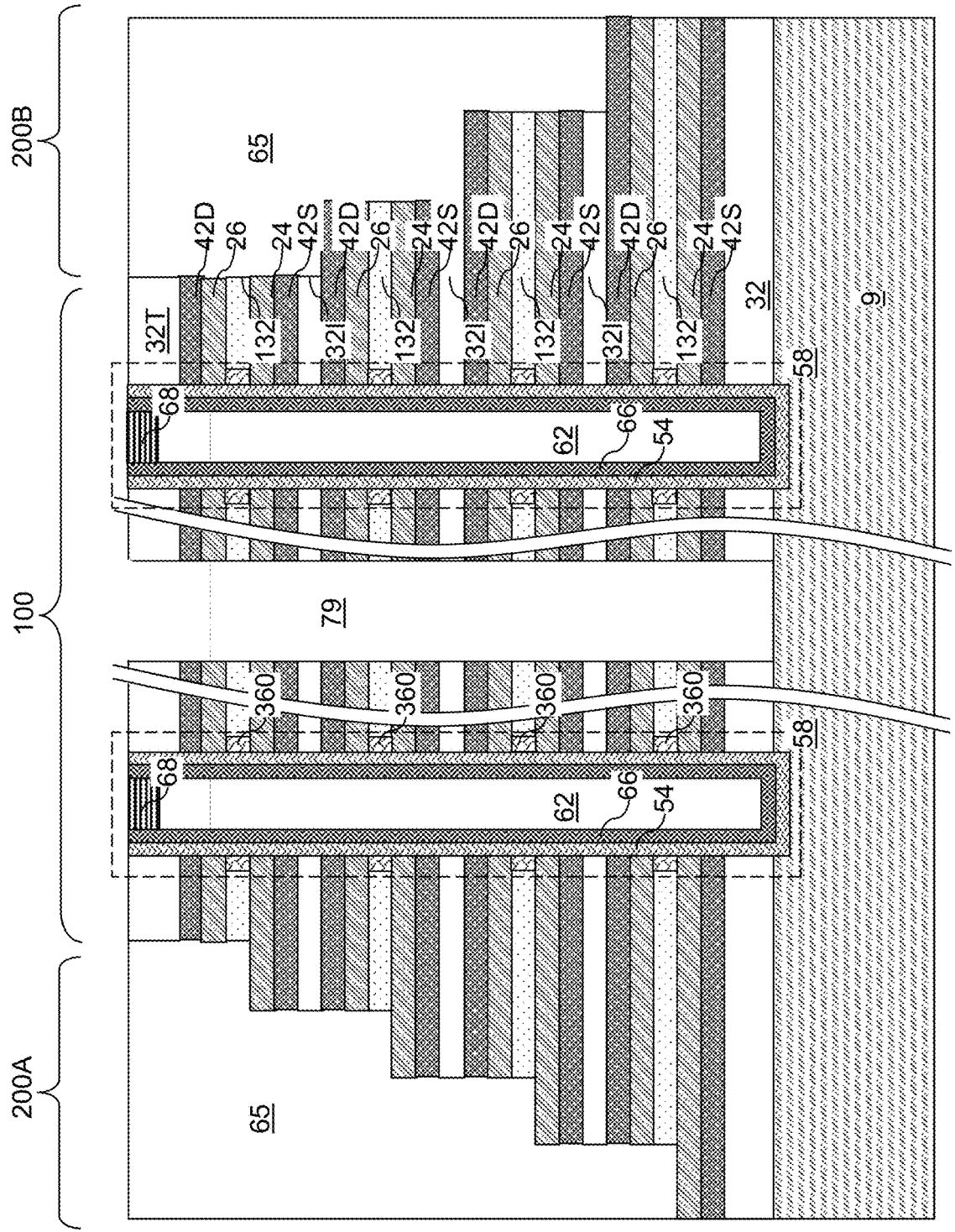
FIG. 29A is a schematic vertical cross-sectional view of the third exemplary structure after formation of a backside trench according to the third embodiment of the present disclosure.

Referring to FIGS. 29A and 29B, the processing steps of FIGS. 6A and 6B can be performed to form backside trenches 79 through the multiple instances of the unit layer stack. Steps of the anisotropic etch processes for forming the backside trenches 79 can be modified to provide an etch chemistry that effectively etches the channel-level insulating layers 132.

Figure 30:
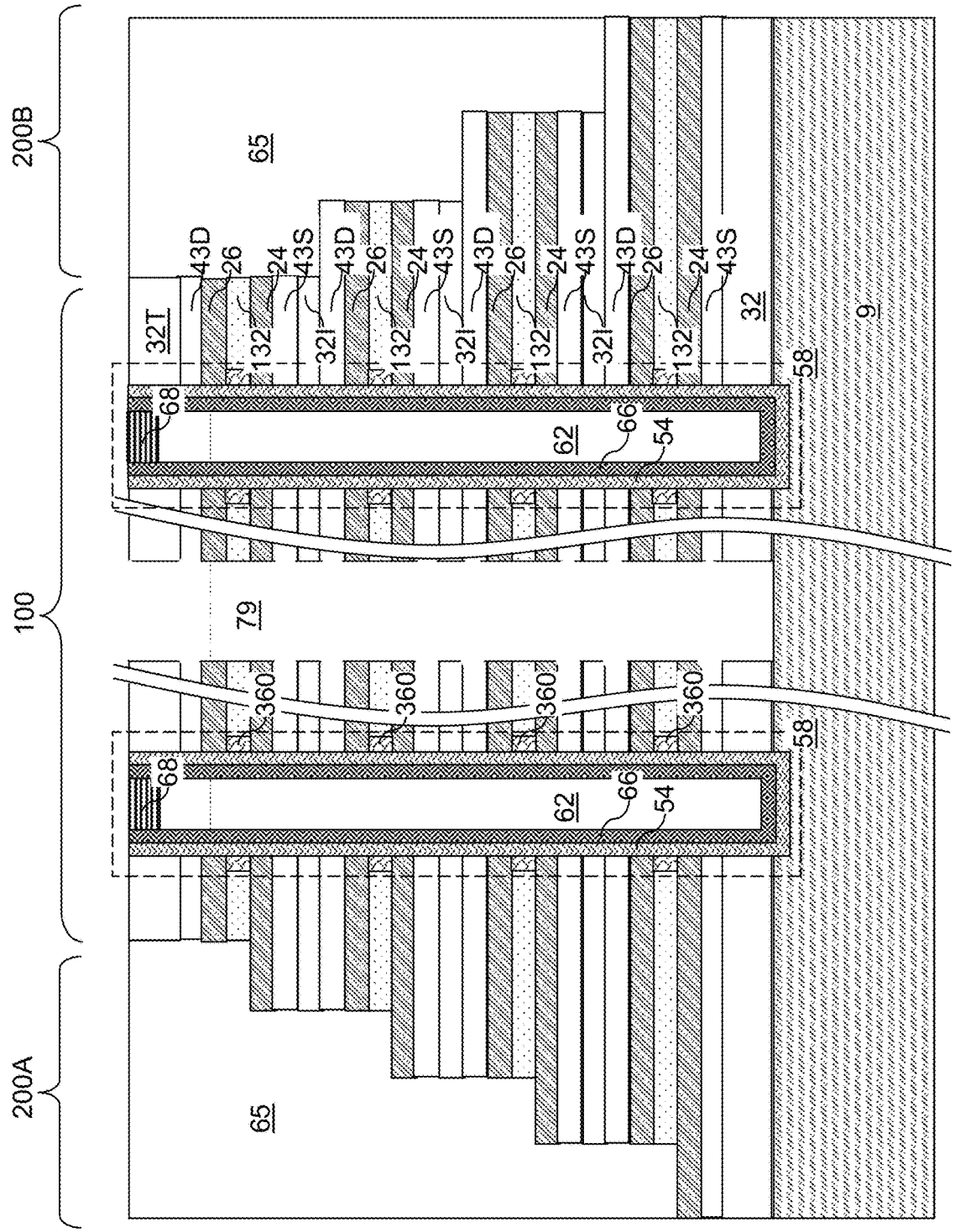
FIG. 30 is a schematic vertical cross-sectional view of the third exemplary structure after formation of source-level backside recesses and drain-level backside recesses according to the third embodiment of the present disclosure.

Referring to FIG. 30, an etchant that selectively etches the materials of the source sacrificial material layer 42S and drain sacrificial material layers 42D with respect to the materials of the insulating layers (132, 32I), the doped semiconductor source layers 24, the doped semiconductor drain layers 26, the retro-stepped dielectric material portions 65, and the semiconductor channels 360 can be introduced into the backside trenches 79, for example, employing an etch process. Source-level backside recesses 43S and drain-level backside recesses 43D are formed in volumes from which the source sacrificial material layer 42S and drain sacrificial material layers 42D are removed, respectively. In one embodiment, the source sacrificial material layer 42S and drain sacrificial material layers 42D can include silicon nitride, and the materials of the channel-level insulating layers 132, the inter-transistor-level insulating layers 32I, and the retro-stepped dielectric material portion 65 can include silicate glass materials such as undoped silicate glass, a doped silicate glass, and/or organosilicate glass.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials employed in the art.

Figure 31:
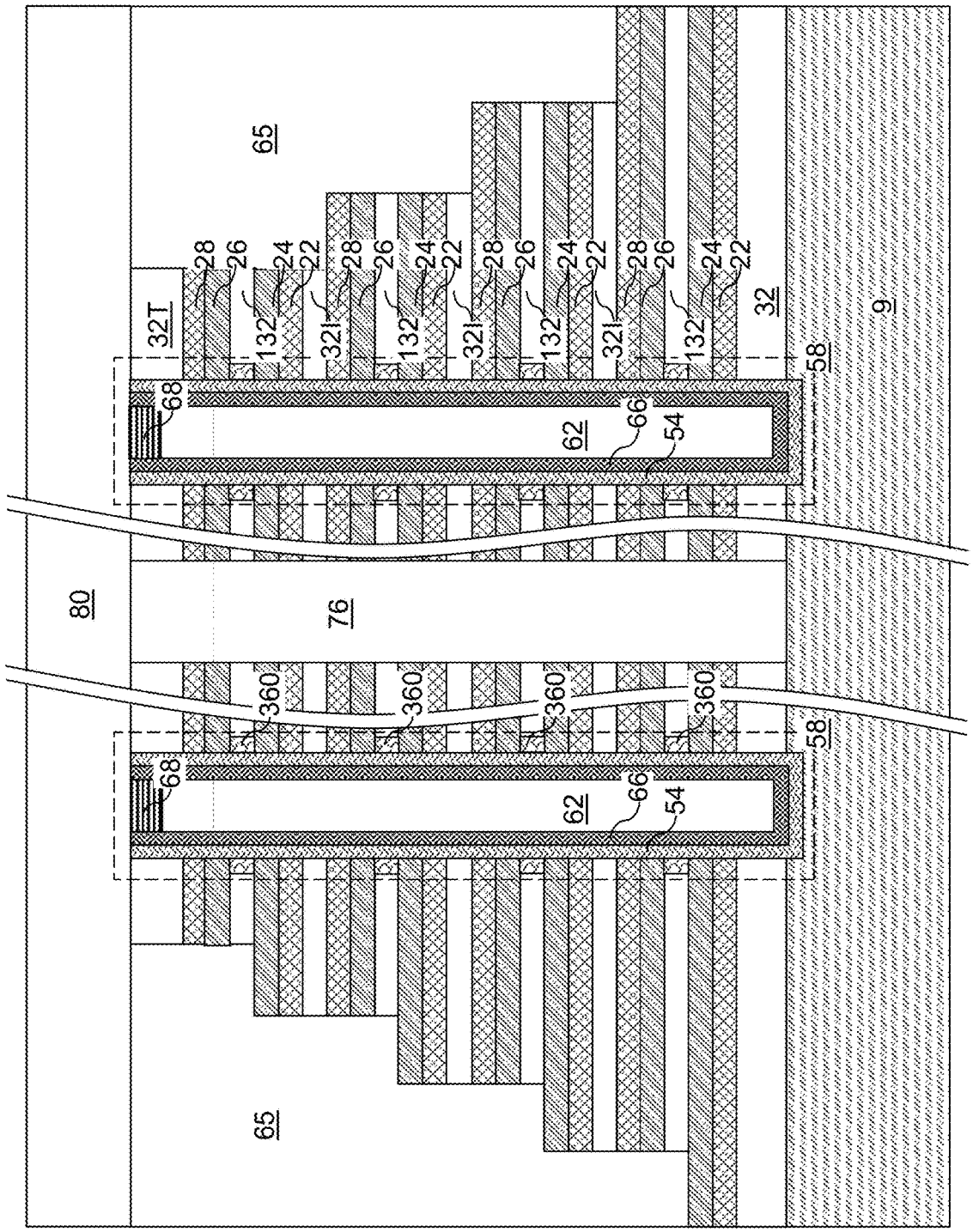
FIG. 31 is a schematic vertical cross-sectional view of the third exemplary structure after formation of metallic source layers, metallic drain layers, and a backside trench fill structure according to the third embodiment of the present disclosure.

Referring to FIG. 31, at least one metallic material can be deposited in the source-level backside recesses 43S and the drain-level backside recesses 43D. The at least one metallic material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. The at least one metallic material fills all volumes of the source-level backside recesses 43S and the drain-level backside recesses 43D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22. Remaining portions of the at least one metallic material that fills the drain-level backside recesses 43D constitute metallic drain layers 28. Each contiguous combination of a doped semiconductor source layer 24 and a metallic source layer 22 constitutes a source layer (22, 24) that functions as source regions and a source line for a respective two-dimensional array of vertical field effect transistors. Each contiguous combination of a doped semiconductor drain layer 26 and a metallic drain layer 28 constitutes a drain layer (26, 28) that functions as drain regions and a bit line for a respective two-dimensional array of vertical field effect transistors.

The source sacrificial material layer 42S and the drain-level sacrificial material layers 42D are optional elements that may be omitted. In case the source sacrificial material layer 42S and the drain-level sacrificial material layers 42D are present, the source sacrificial material layer 42S and the drain-level sacrificial material layers 42D are replaced with the metallic source layers 22 and the metallic drain layers 28, respectively. In this case, each of the source layers (22, 24) comprises a vertical stack of a doped semiconductor source layer 24 and a metallic source layer 22, and each of the drain layers (26, 28) comprises a vertical stack of a doped semiconductor drain layer 26 and a metallic drain layer 28. In case the source sacrificial material layer 42S and the drain-level sacrificial material layers 42D are omitted, each of the source layers consists of a doped semiconductor source layer 24 or a doped semiconductor drain layer 26.

A dielectric material can be deposited in the backside trenches 79 and over the topmost insulating layer 32T. Portions of the dielectric material that fills the backside trenches 79 constitute backside trench fill structures 76. Portions of the dielectric fill material that overlies the topmost insulating layer 32T constitutes a contact-level dielectric layer 80.

Figure 32:
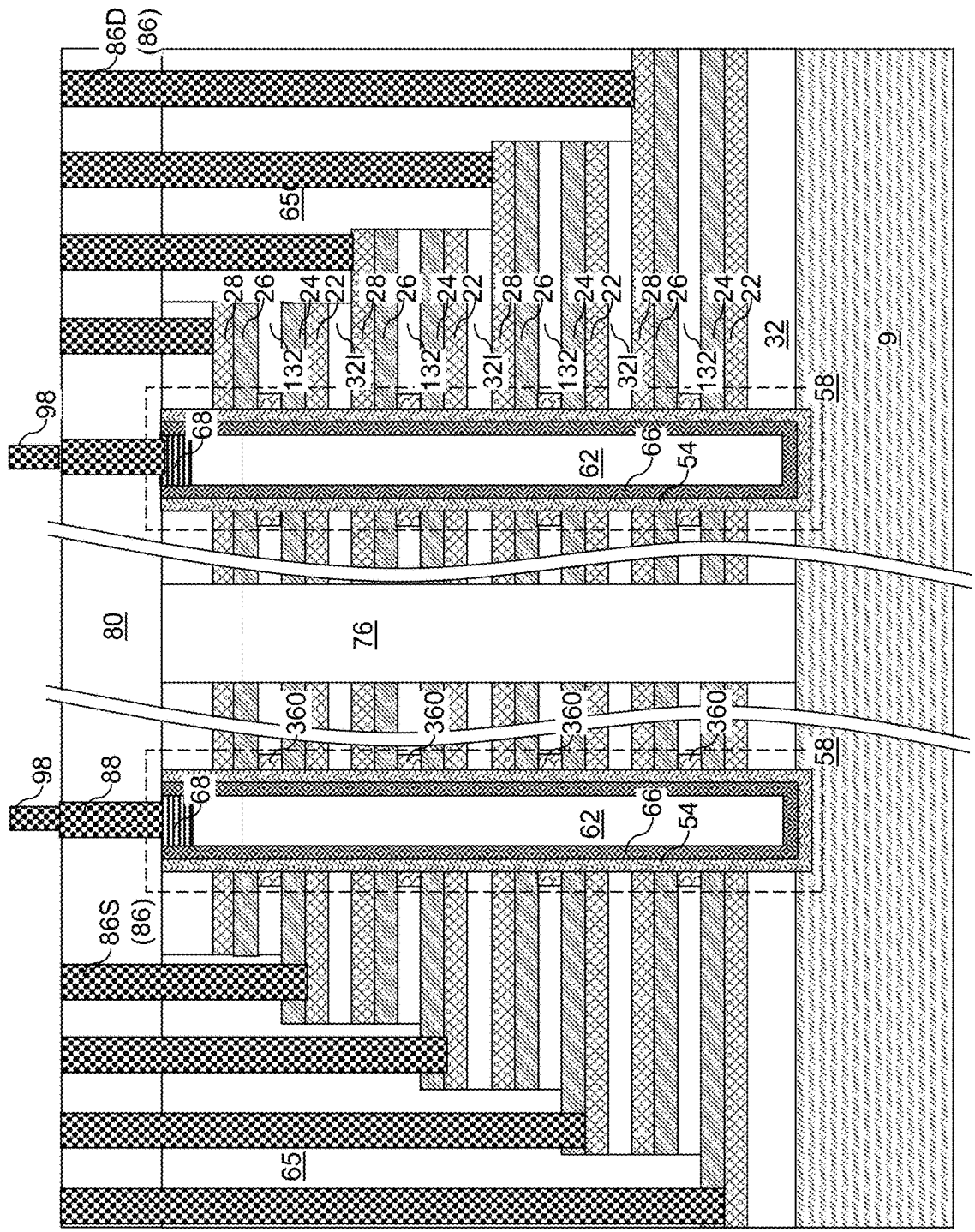
FIG. 32 is a schematic vertical cross-sectional view of the third exemplary structure after formation of contact via structures according to the third embodiment of the present disclosure.

Referring to FIG. 32, the processing steps of FIG. 9A can be performed to form contact via structures (88, 86) through the contact-level dielectric layer 80 and optionally through a retro-stepped dielectric material portion 65. The contact via structures (88, 86) include word line contact via structures 88 each of which contacts a respective one of the contact pad structures 68, and is electrically connected to a respective gate electrode 66. Further, the contact via structures (88, 86) include layer contact via structures 86 (e.g., 86S, 86D) that contact a respective one of the source layers (22, 24) and the drain layers (26, 28) within the respective staircase regions (200A, 200B). Specifically, each of the layer contact via structures (86S, 86D) can contact a horizontal surface of a respective one of the source layers (22, 24) or one of the drain layers (26, 28) exposed in the stepped surfaces in the staircase regions (200A, 200B). Word lines 98 are then formed over the contact-level dielectric layer 80 (and over gate electrodes 66, the source layers (22, 24) and the drain layers (26, 28)) and in electrical contact with the gate electrodes 66 through the contact via structures 88 and the optional contact pad structures 68.

Figure 33:
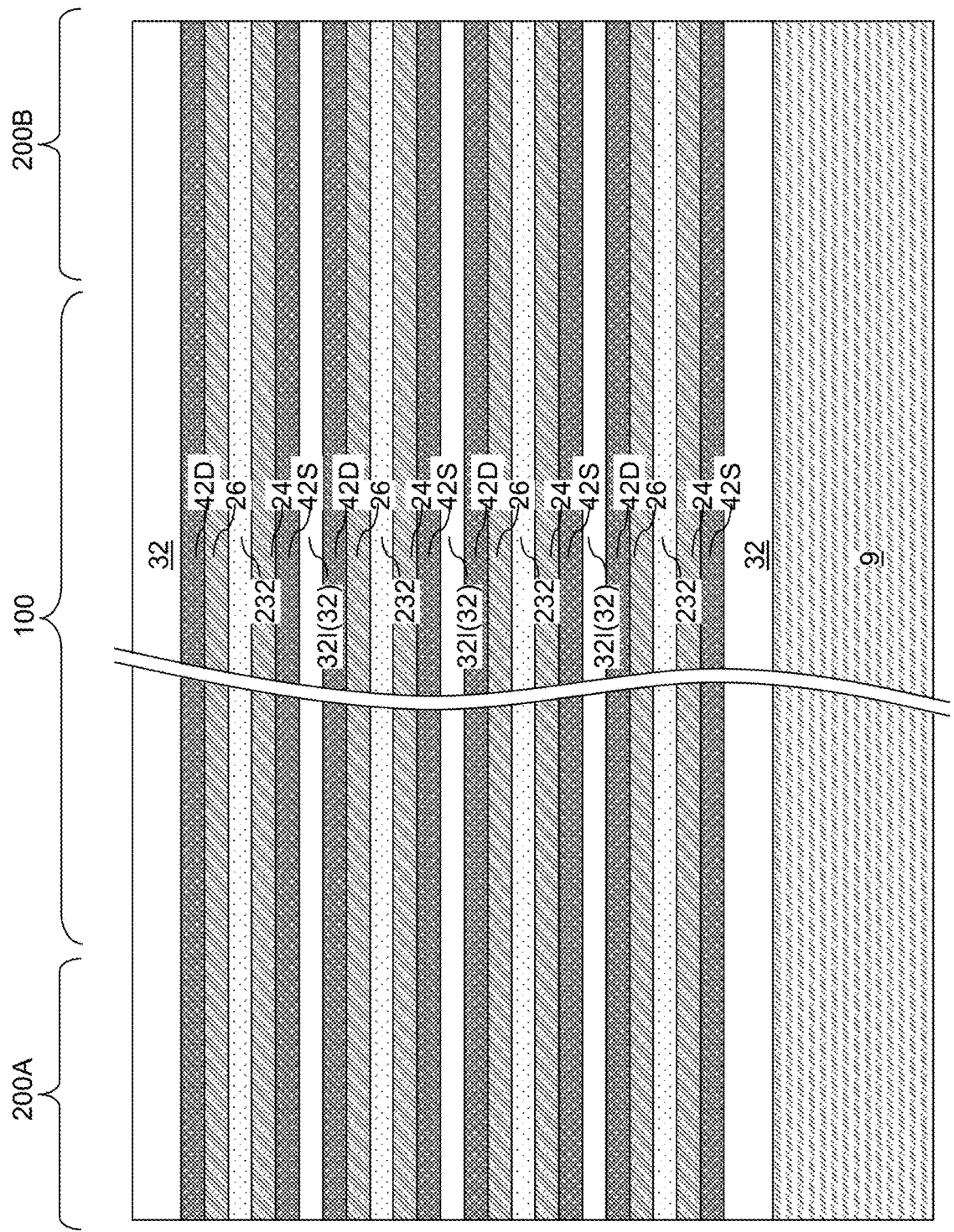
FIG. 33 is a schematic vertical cross-sectional view of a fourth exemplary structure after formation of multiple instances of a unit layer stack including a source sacrificial material layer, a doped semiconductor source layer, a channel-level sacrificial material layer, a doped semiconductor drain layer, a drain sacrificial material layer, and an inter-transistor-level insulating layer over a substrate according to a fourth embodiment of the present disclosure.

Referring to FIG. 33, a fourth exemplary structure according to a fourth embodiment of the present disclosure can be derived from the first exemplary structure of FIG. 1 by replacing the channel-level insulating layers 32C with channel-level sacrificial material layers 232. Thus, each instance of the unit layer stack within the multiple instances of the unit layer stack includes a source sacrificial material layer 42S, a doped semiconductor source layer 24, a channel-level sacrificial material layers 232, a doped semiconductor drain layer 26, a drain sacrificial material layer 42D, and an inter-transistor-level insulating layer 32I.

The channel-level sacrificial material layers 232 include a material that can be removed selective to the materials of the doped semiconductor source layers 24, doped semiconductor drain layers 26, and the inter-transistor-level insulating layers 32I, and selective to the metallic materials to be employed for metallic source layers and metallic drain layers that subsequently replace the source sacrificial material layers 42S and the drain sacrificial material layers 42D. For example, the channel-level sacrificial material layers 232 can include a material such as a dielectric metal oxide (e.g., aluminum oxide), a silicon-germanium alloy having an atomic concentration of germanium greater than 20%, a polymer material, or a metallic material that is different from the metallic materials to be employed for metallic source layers and metallic drain layers that subsequently replace the source sacrificial material layers 42S and the drain sacrificial material layers 42D. Each channel-level sacrificial material layers 232 can have a thickness in a range from 5 nm to 50 nm, although lesser and greater thicknesses can also be employed.

The multiple instances of the unit layer stack include an alternating stack of doped semiconductor source layers 24 and doped semiconductor drain layers 26. The channel-level sacrificial material layers 232 are formed at levels of semiconductor channels to be subsequently formed. For example, the channel-level sacrificial material layers 232 can be formed between each vertically neighboring pair of an underlying doped semiconductor source layer 24 and an overlying doped semiconductor drain layer 26. The inter-transistor-level insulating layers 32I can be provided at levels of inter-transistor gaps to be subsequently formed. For example, the inter-transistor-level insulating layers 32I can be formed between vertically neighboring pairs of an overlying doped semiconductor source layer 24 and an underlying doped semiconductor drain layer 26.

Figure 34:
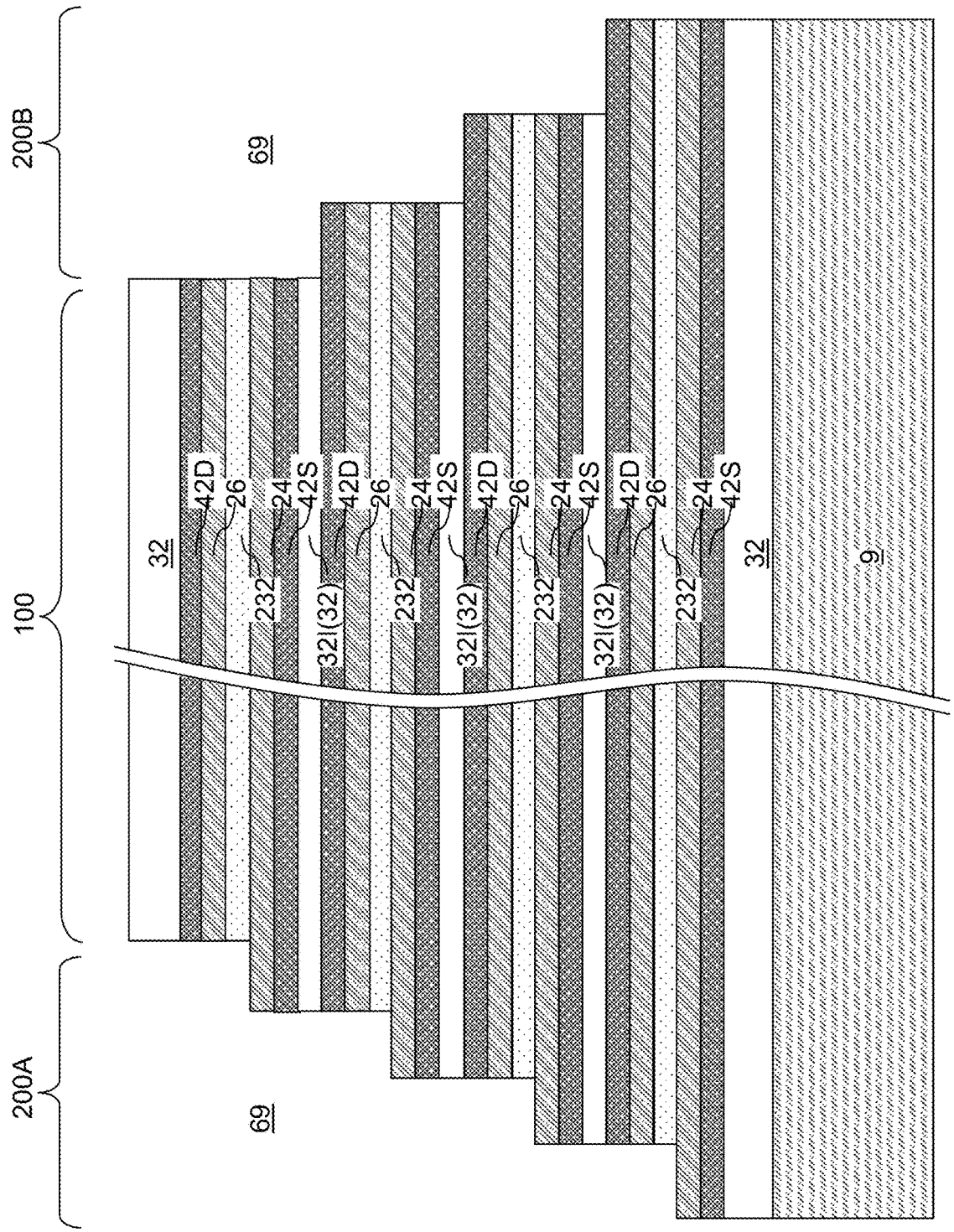
FIG. 34 is a schematic vertical cross-sectional view of the fourth exemplary structure after formation of stepped surfaces according to the fourth embodiment of the present disclosure.

Referring to FIG. 34, the processing steps of FIG. 2 can be performed to form stepped cavities 69 in the staircase regions (200A, 200B). Stepped surfaces are formed in the staircase regions (200A, 200B). Steps of the anisotropic etch processes for forming the stepped surfaces can be modified to provide an etch chemistry that effectively etches the channel-level sacrificial material layers 232.

Figure 35A:
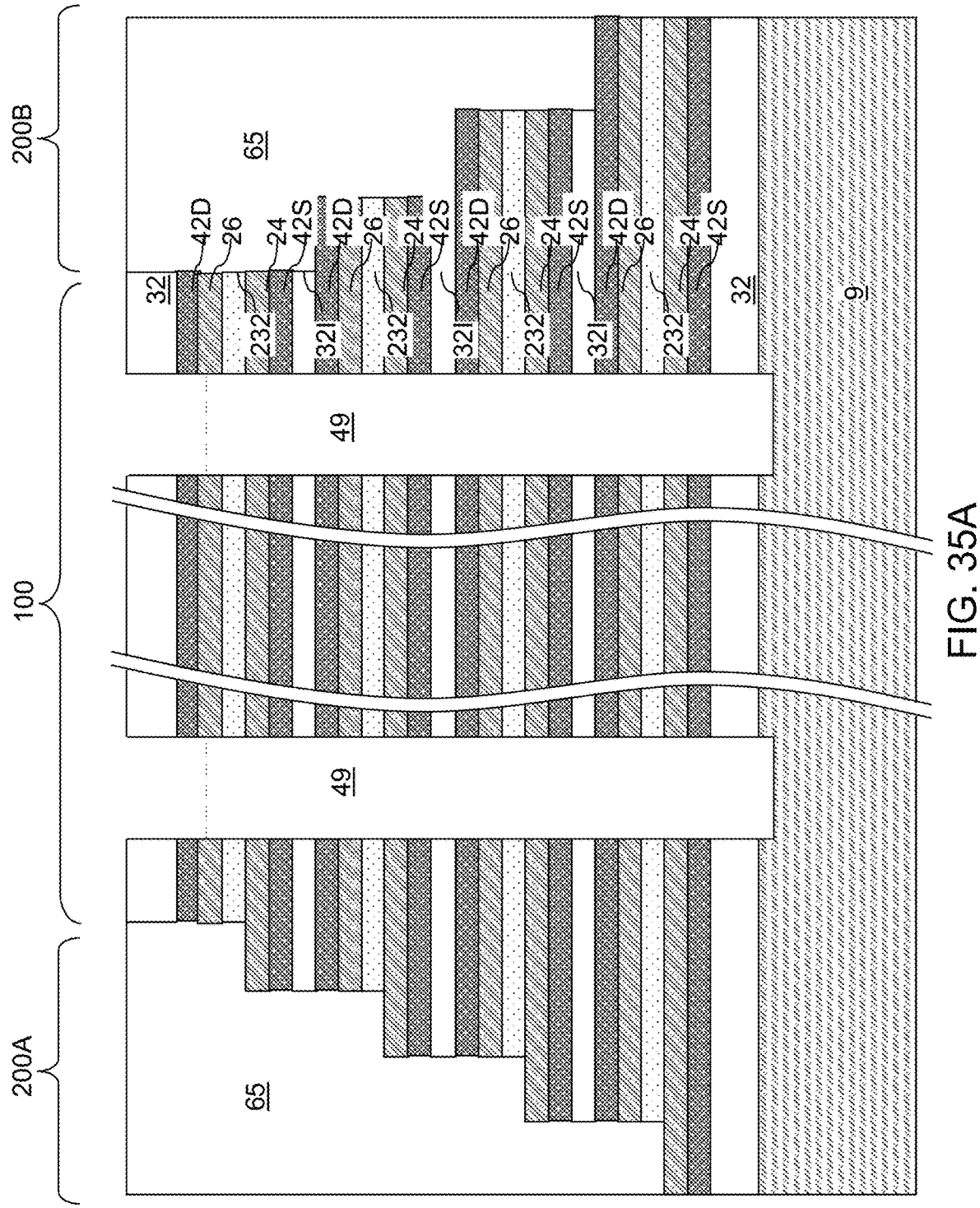
FIG. 35A is a schematic vertical cross-sectional view of the fourth exemplary structure after formation of retro-stepped dielectric material portions and an array of memory openings according to the fourth embodiment of the present disclosure.
Figure 35B:
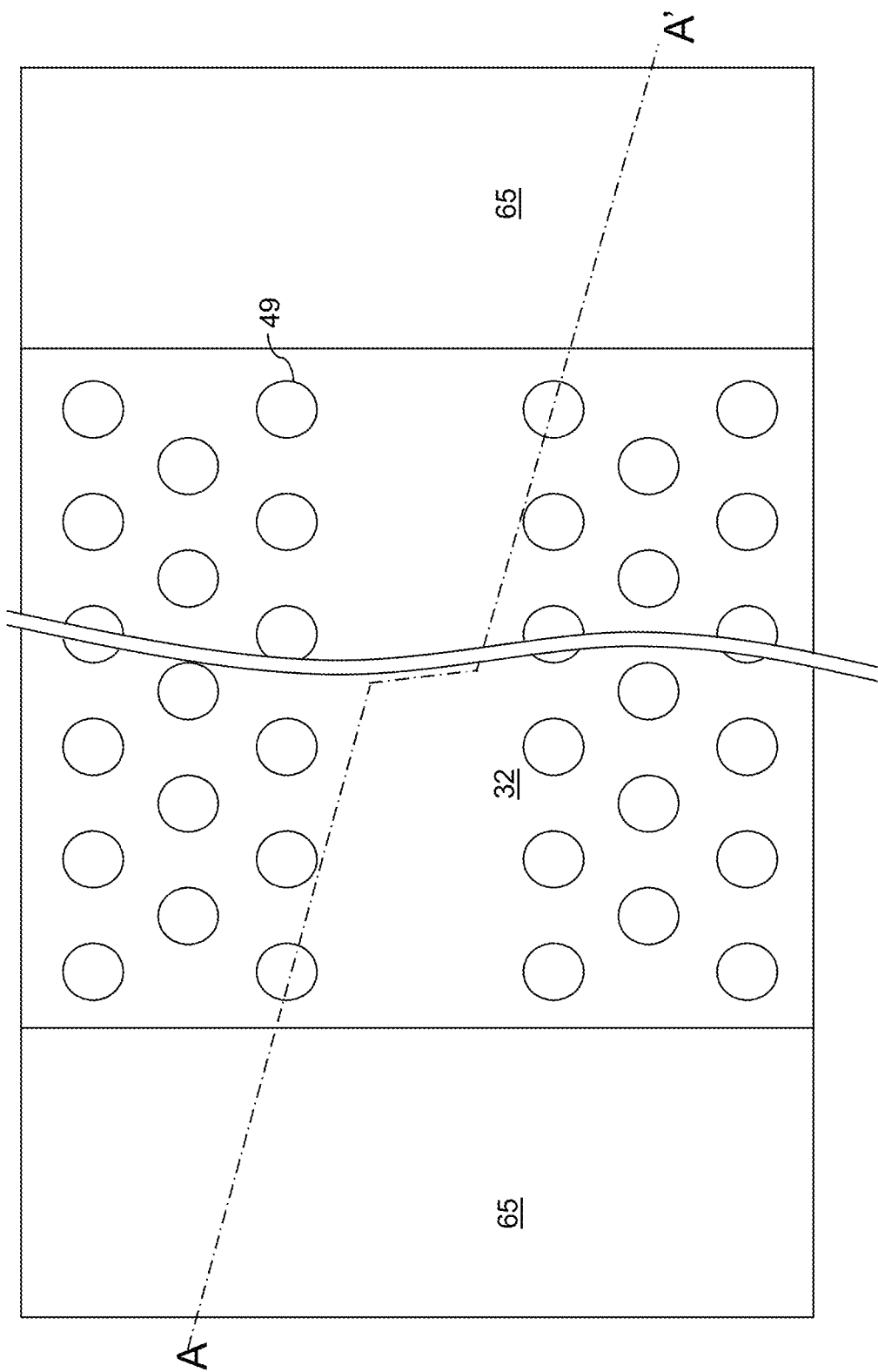
FIG. 35B is a top-down view of the fourth exemplary structure of FIG. 35A. The vertical plane A-A' is the plane of the cross-section for FIG. 35A.

Referring to FIGS. 35A and 35B, the processing steps of FIGS. 3A and 3B can be performed to form memory openings 49 through each layer in the multiple instances of the unit layer stack. As discussed above, the unit layer stack of the second exemplary structure can include a source sacrificial material layer 42S, a doped semiconductor source layer 24, a channel-level sacrificial material layers 232, a doped semiconductor drain layer 26, a drain sacrificial material layer 42D, and an inter-transistor-level insulating layer 32I. Steps of the anisotropic etch processes for forming the memory openings 49 can be modified to provide an etch chemistry that effectively etches the channel-level sacrificial material layers 232.

Figure 36:
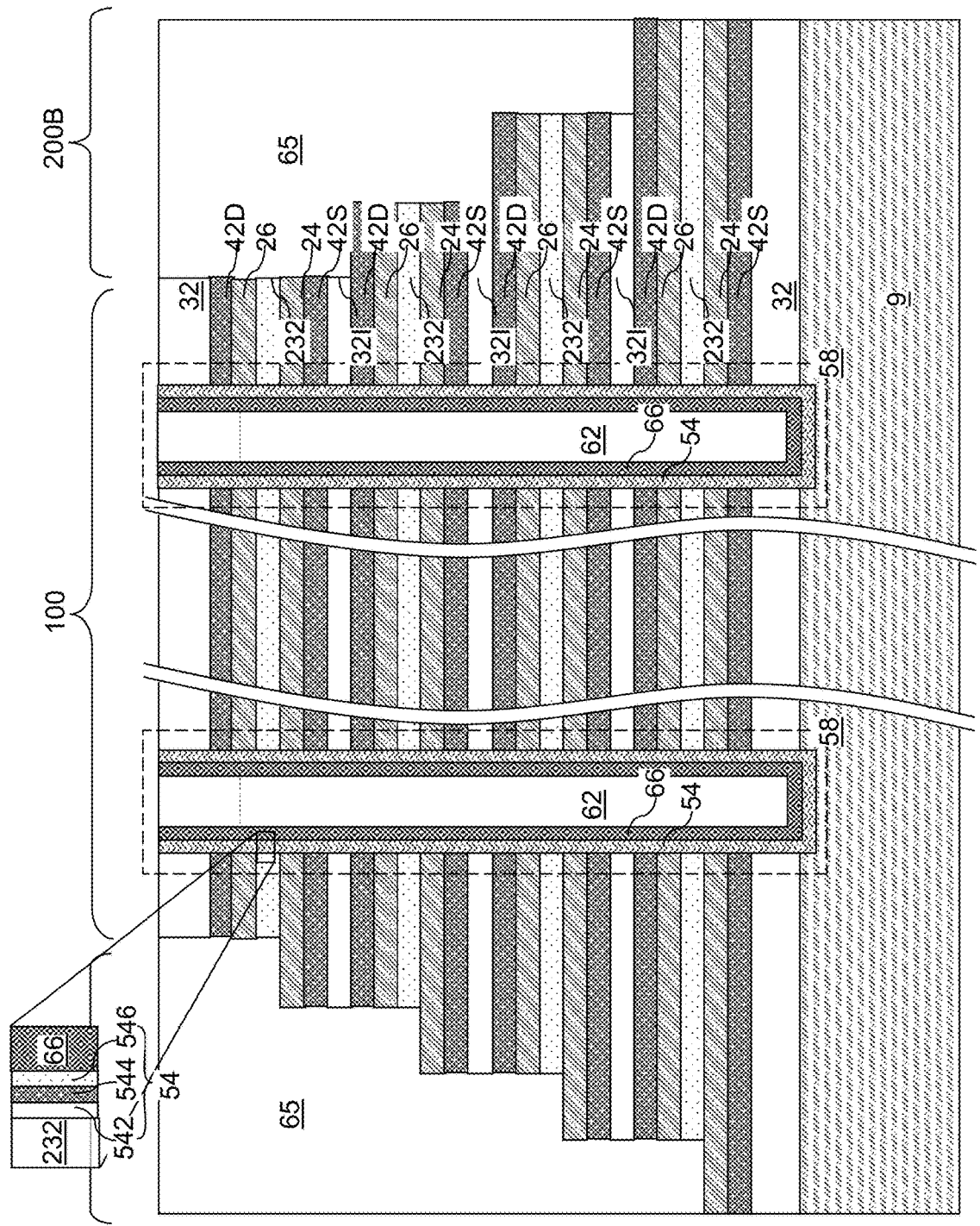
FIG. 36 is a schematic vertical cross-sectional view of the fourth exemplary structure after formation of memory opening fill structures according to the fourth embodiment of the present disclosure.

Referring to FIG. 36, continuous material layers can be sequentially deposited in each of the memory openings 49. The continuous material layers can include a continuous memory film, a continuous conductive material layer, and an optional dielectric fill material layer. Excess portions of the continuous material layers can be removed from above the horizontal plane including the top surface of the topmost insulating layers 32T and the top surfaces of the retro-stepped dielectric material portions by a planarization process. The planarization process can employ chemical mechanical planarization and/or at least one recess etch process. Each portion of the continuous material layers that remain in a memory opening 49 constitutes a memory opening fill structure 58.

Each memory opening fill structure 58 includes a memory film 54, a gate electrode 66, and an optional dielectric core 62. Each memory film 54 is a remaining portion of the continuous memory film after the planarization process. Each gate electrode 66 is a remaining portion of the continuous conductive material layer after the planarization process. Each dielectric core 62 is a remaining portion of the dielectric fill material layer.

The memory film 54 includes at least one material layer that can store data bits in the form of trapped electrical charges, polarization, or magnetic moments. In one embodiment, the memory film each of the memory films comprises a layer stack including, from outside to inside, a tunneling dielectric layer 542, a charge storage layer 544 contacting the tunneling dielectric layer 542, and a blocking dielectric layer 546 contacting the charge storage layer 544. The tunneling dielectric layer 542 can include a tunneling dielectric material such as a silicon oxide layer or an ONO stack (i.e., a stack of a silicon oxide layer, a silicon nitride layer, and a silicon oxide layer). The charge storage layer 544 can include a charge storage material such as silicon nitride. The blocking dielectric layer 546 can include a blocking dielectric material such as silicon oxide and/or a dielectric metal oxide. In another embodiment, each of the memory films 54 comprises a ferroelectric material layer (not shown) and at least one optional dielectric material layer (such as a silicon oxide layer) that can contact the channel-level sacrificial material layers 232 or the gate electrode 66.

Each gate electrode 66 includes a conductive material such as a metallic material. For example, each gate electrode 66 can include a layer stack of a metallic nitride liner including a conductive metallic nitride (such as TiN, TaN, or WN) and a metal layer including a metal (such as W, Co, Mo, Ru, Cu, or an alloy thereof).

Each dielectric core 62 includes a dielectric fill material such as silicon oxide. In one embodiment, the dielectric cores 62 can include a dielectric material that has a higher etch rate than the topmost insulating layer 32T in an etch process. For example, the dielectric cores 62 can include borosilicate glass, organosilicate glass, or phosphosilicate glass, and the topmost insulating layer 32T can include densified undoped silicate glass. In this case, the material of the dielectric cores 62 can be subsequently recessed relative to the material of the topmost insulating layer 32T.

A memory film 54 can be formed on sidewalls of each layer of the multiple repetitions of the unit layer stack, and a gate electrode 66 can be formed on each of the memory films 54. Each of the memory films 54 vertically extends through each of the doped semiconductor source layers 24 and the doped semiconductor drain layers 26 of the alternating stack of doped semiconductor source layers 24 and doped semiconductor drain layers 26. Each of the gate electrodes 66 vertically extends through each of the doped semiconductor source layers 24 and the doped semiconductor drain layers 26 of the alternating stack.

Each memory film 54 includes a cylindrical portion and a bottom cap portion that adjoins a bottom periphery of the cylindrical portion. Each gate electrode 66 can include a cylindrical portion and a bottom cap portion that adjoins a bottom periphery of the cylindrical portion. The gate electrodes 66 can be vertically spaced from the substrate 9 by horizontal portions of the memory films 54. Each of the gate electrodes 66 can laterally surround a respective dielectric core 62.

Figure 37:
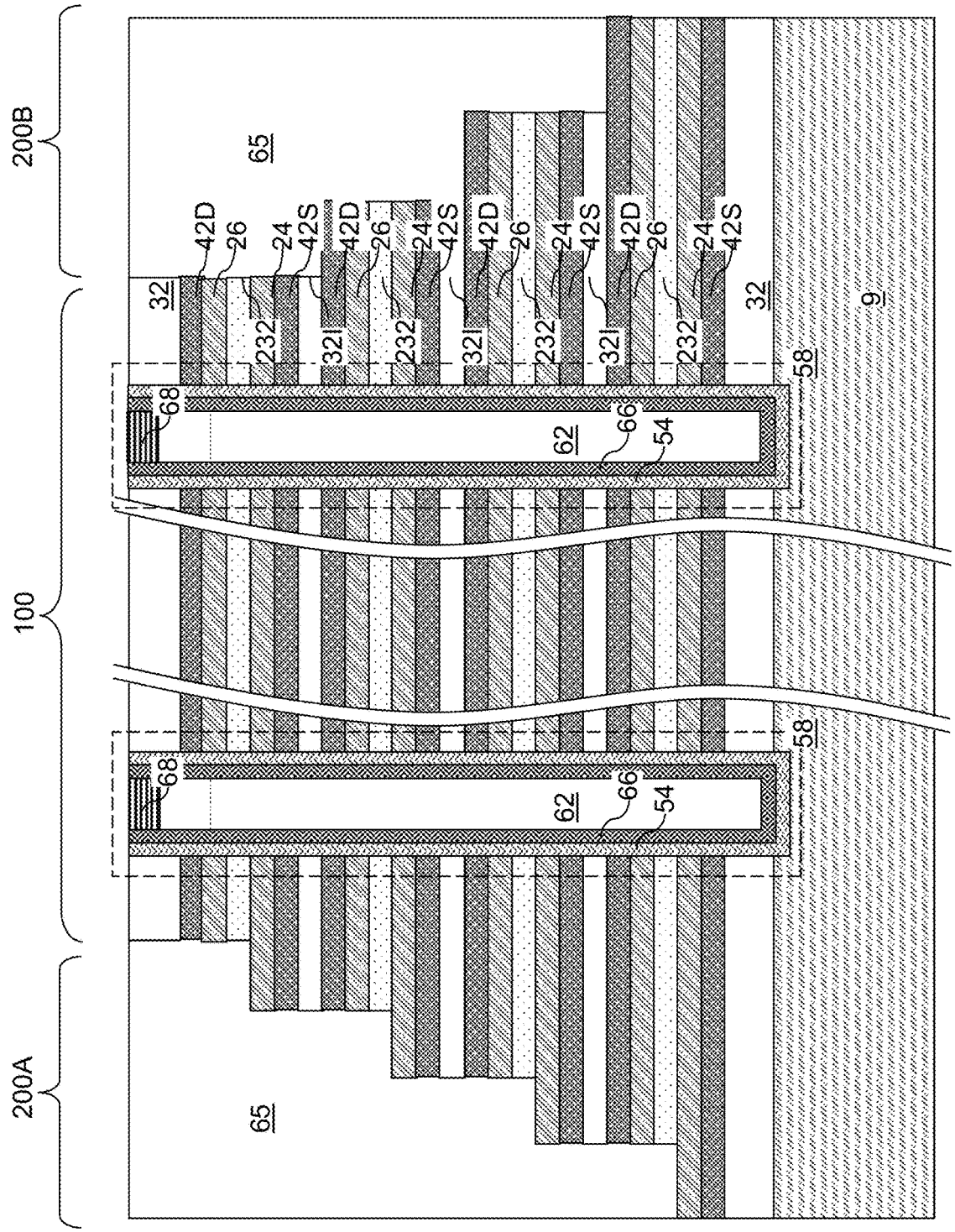
FIG. 37 is a schematic vertical cross-sectional view of the fourth exemplary structure after formation of contact pad structures according to the fourth embodiment of the present disclosure.

Referring to FIG. 37, the processing steps of FIG. 5 can be performed to form contact pad structures 68. Each memory opening fill structure 58 can include a respective contact pad structure 68 that contacts a top end of a respective one of the gate electrodes 66.

Figure 38A:
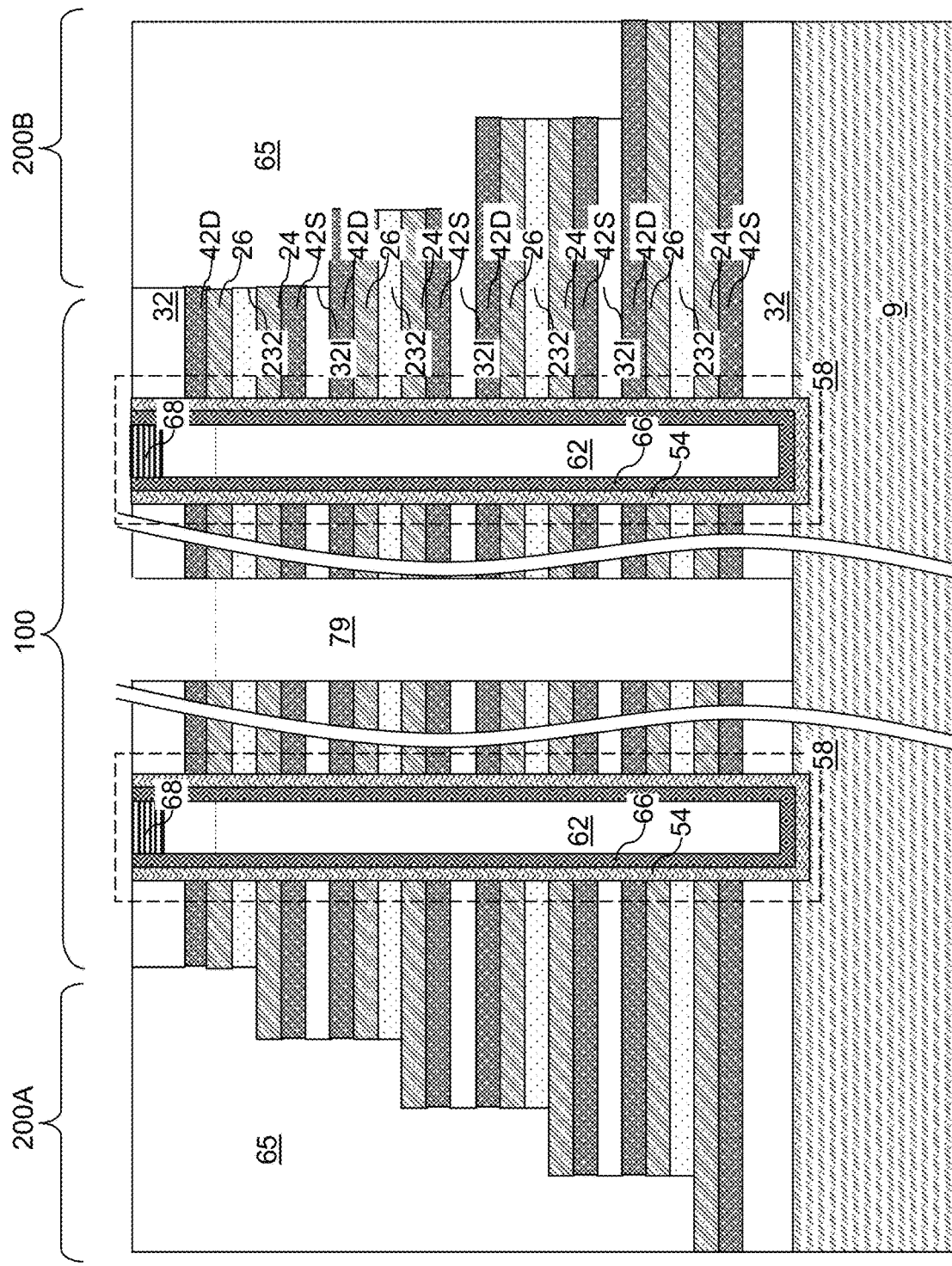
FIG. 38A is a schematic vertical cross-sectional view of the fourth exemplary structure after formation of a backside trench according to the fourth embodiment of the present disclosure.

Referring to FIGS. 38A and 38B, the processing steps of FIGS. 6A and 6B can be performed to form backside trenches 79 through the multiple instances of the unit layer stack. Steps of the anisotropic etch processes for forming the backside trenches 79 can be modified to provide an etch chemistry that effectively etches the channel-level sacrificial material layers 232.

Figure 39:
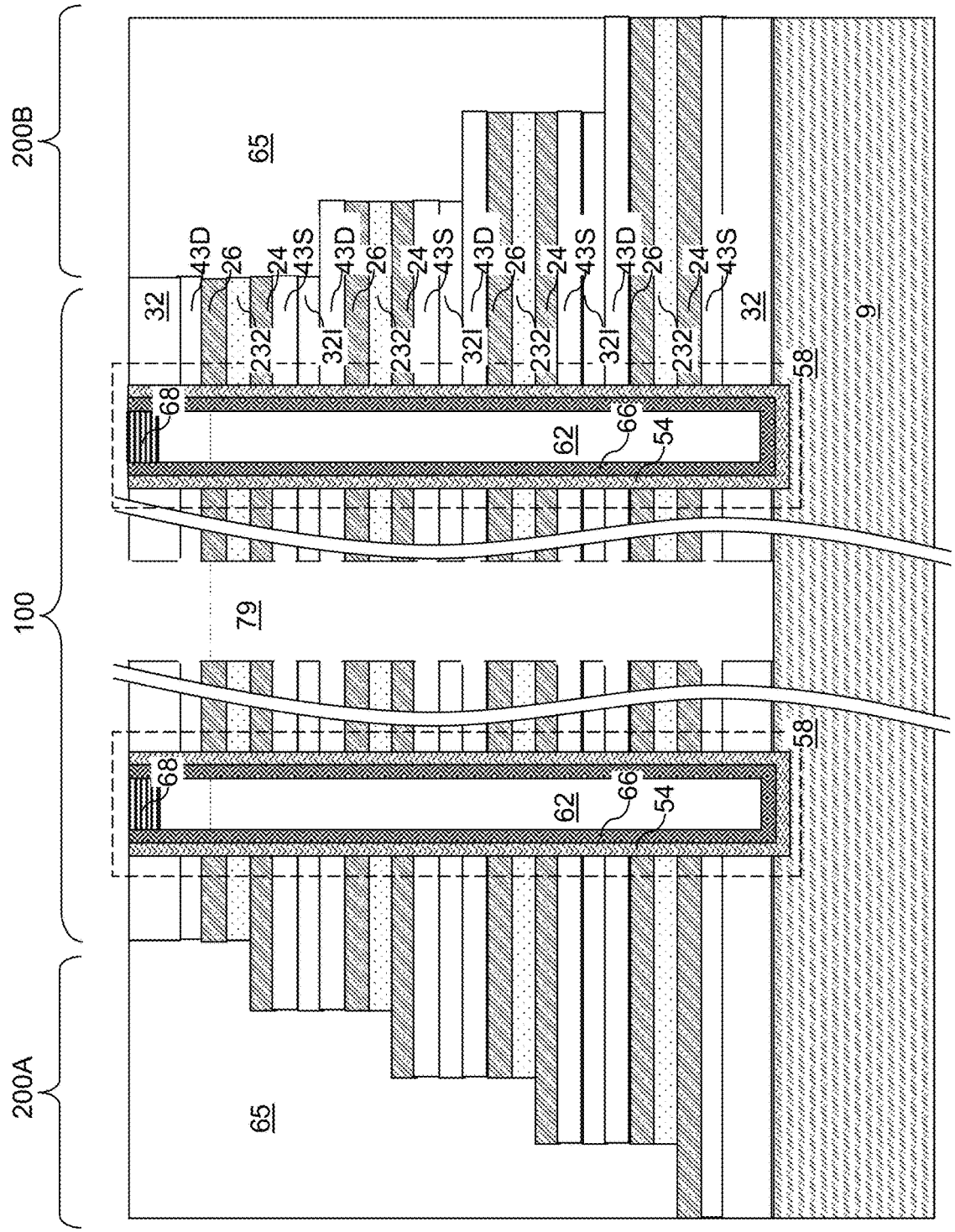
FIG. 39 is a schematic vertical cross-sectional view of the fourth exemplary structure after formation of source-level backside recesses and drain-level backside recesses according to the fourth embodiment of the present disclosure.

Referring to FIG. 39, an etchant that selectively etches the materials of the source sacrificial material layer 42S and drain sacrificial material layers 42D with respect to the materials of the channel-level sacrificial material layers 232, the inter-transistor-level insulating layers 32I, the doped semiconductor source layers 24, the doped semiconductor drain layers 26, and the retro-stepped dielectric material portions 65 can be introduced into the backside trenches 79, for example, employing an etch process. Source-level backside recesses 43S and drain-level backside recesses 43D are formed in volumes from which the source sacrificial material layer 42S and drain sacrificial material layers 42D are removed, respectively. In one embodiment, the source sacrificial material layer 42S and drain sacrificial material layers 42D can include silicon nitride, and the materials of the inter-transistor-level insulating layers 32I, and the retro-stepped dielectric material portion 65 can include silicate glass materials such as undoped silicate glass, a doped silicate glass, and/or organosilicate glass, and the material of the channel-level sacrificial material layers 232 can include a material such as a dielectric metal oxide (e.g., aluminum oxide), a silicon-germanium alloy having an atomic concentration of germanium greater than 20%, a polymer material, or a metallic material that is different from the metallic materials to be employed for metallic source layers and metallic drain layers that subsequently replace the source sacrificial material layers 42S and the drain sacrificial material layers 42D.

The etch process can be a wet etch process employing a wet etch solution, or can be a gas phase (dry) etch process in which the etchant is introduced in a vapor phase into the backside trenches 79. For example, if the source sacrificial material layer 42S and the drain sacrificial material layers 42D include silicon nitride, the etch process can be a wet etch process in which the exemplary structure is immersed within a wet etch tank including phosphoric acid, which etches silicon nitride selective to silicon oxide, silicon, and various other materials employed in the art.

Figure 40:
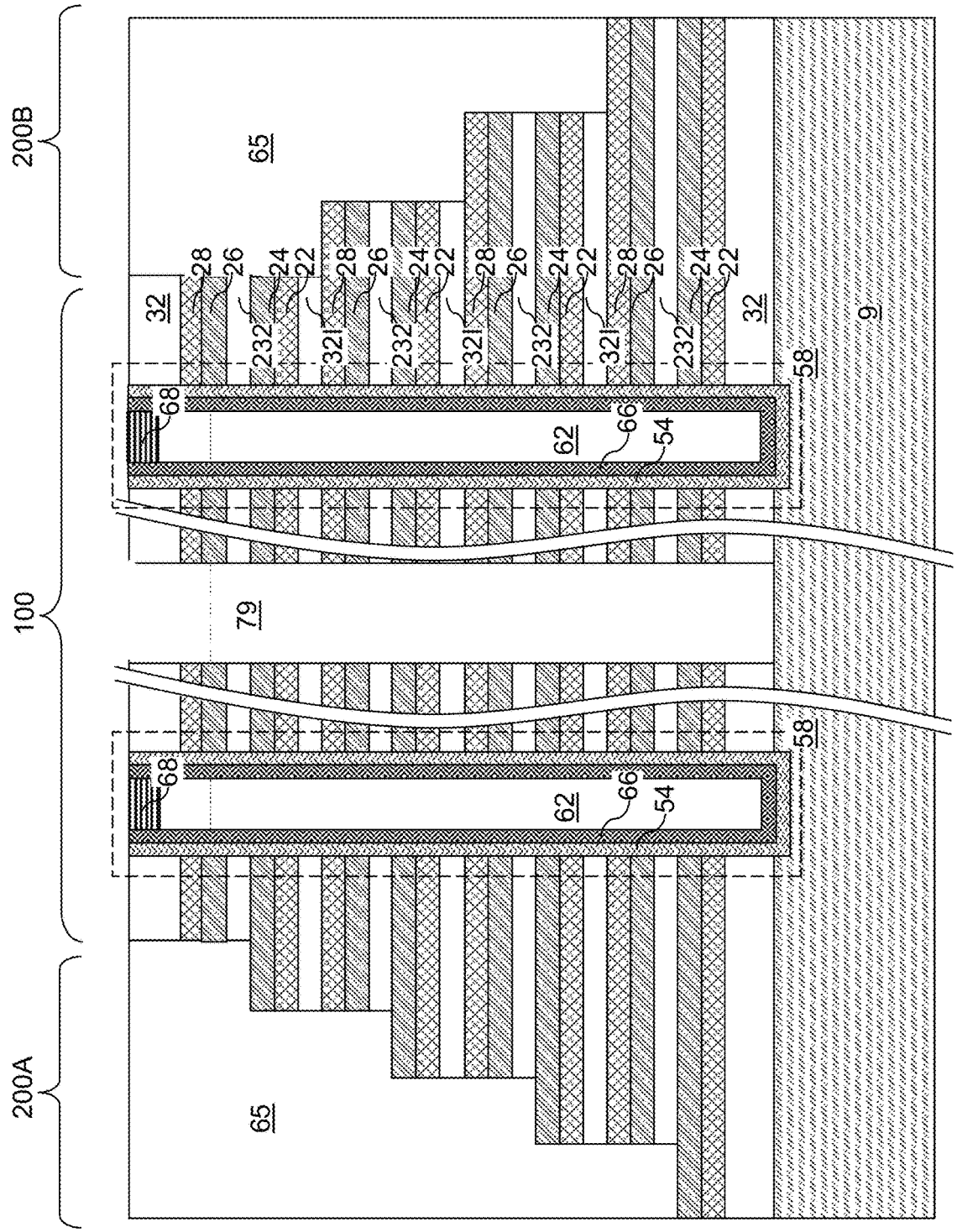
FIG. 40 is a schematic vertical cross-sectional view of the fourth exemplary structure after formation of metallic source layers, metallic drain layers, and a backside trench fill structure according to the fourth embodiment of the present disclosure.

Referring to FIG. 40, at least one metallic material can be deposited in the source-level backside recesses 43S and the drain-level backside recesses 43D. The at least one metallic material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. The at least one metallic material fills all volumes of the source-level backside recesses 43S and the drain-level backside recesses 43D. Portions of the at least one metallic material deposited at peripheral portions of the backside trenches 79 or above the topmost insulating layer 32T can be removed by an etch process, which may include an isotropic etch process and/or an anisotropic etch process. Remaining portions of the at least one metallic material that fills the source-level backside recesses 43S constitute metallic source layers 22. Remaining portions of the at least one metallic material that fills the drain-level backside recesses 43D constitute metallic drain layers 28. Each contiguous combination of a doped semiconductor source layer 24 and a metallic source layer 22 constitutes a source layer (22, 24) that functions as source regions and source line for a respective two-dimensional array of vertical field effect transistors. Each contiguous combination of a doped semiconductor drain layer 26 and a metallic drain layer 28 constitutes a drain layer (26, 28) that functions as drain regions and a bit line for a respective two-dimensional array of vertical field effect transistors.

The source sacrificial material layer 42S and the drain-level sacrificial material layers 42D are optional elements that may be omitted. In case the source sacrificial material layer 42S and the drain-level sacrificial material layers 42D are present, the source sacrificial material layer 42S and the drain-level sacrificial material layers 42D are replaced with the metallic source layers 22 and the metallic drain layers 28, respectively. In this case, each of the source layers (22, 24) comprises a vertical stack of a doped semiconductor source layer 24 and a metallic source layer 22, and each of the drain layers (26, 28) comprises a vertical stack of a doped semiconductor drain layer 26 and a metallic drain layer 28. In case the source sacrificial material layer 42S and the drain-level sacrificial material layers 42D are omitted, each of the source layers consists of a doped semiconductor source layer 24 or a doped semiconductor drain layer 26, as will be described in more detail with respect to FIGS. 45 to 47 below. If layers 42S and 42D are omitted, then channel-level sacrificial material layers 232 may comprise silicon nitride.

Figure 41:
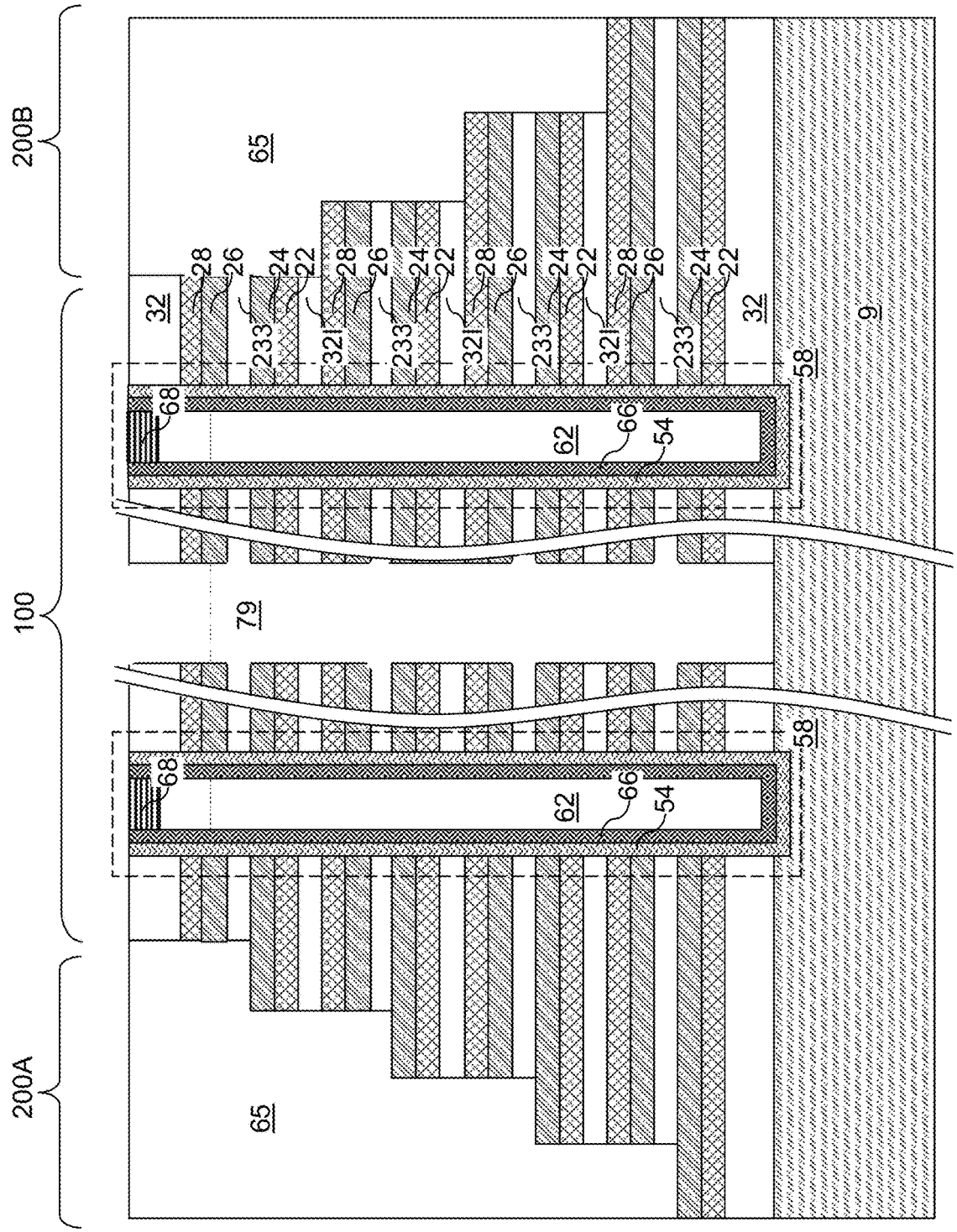
FIG. 41 is a schematic vertical cross-sectional view of the fourth exemplary structure after formation of channel-level backside recesses by removal of the channel-level sacrificial material layers according to the fourth embodiment of the present disclosure.

Referring to FIG. 41, channel-level backside recesses 233 can be formed by removing the channel-level sacrificial material layers 232 selective to the materials of the doped semiconductor source layers 24, the doped semiconductor drain layers 26, the inter-transistor-level insulating layers 32I, the optional metallic source layers 22, the optional metallic drain layers 28, and physically exposed to surfaces of the substrate 9 (which can be semiconductor surfaces). In one embodiment, the channel-level sacrificial material layers 232 can include a material such as a dielectric metal oxide (e.g., aluminum oxide), a silicon-germanium alloy having an atomic concentration of germanium greater than 20%, a polymer material, or a metallic material that is different from the metallic materials of the metallic source layers 22 and the metallic drain layers 28, and the inter-transistor-level insulating layers 32I can include silicon oxide. Alternatively, if the metallic source layers 22 and the metallic drain layers 28 are omitted, then the channel-level sacrificial material layers 232 may comprise silicon nitride, and may be selectively removed by a phosphoric acid etch.

Figure 42:
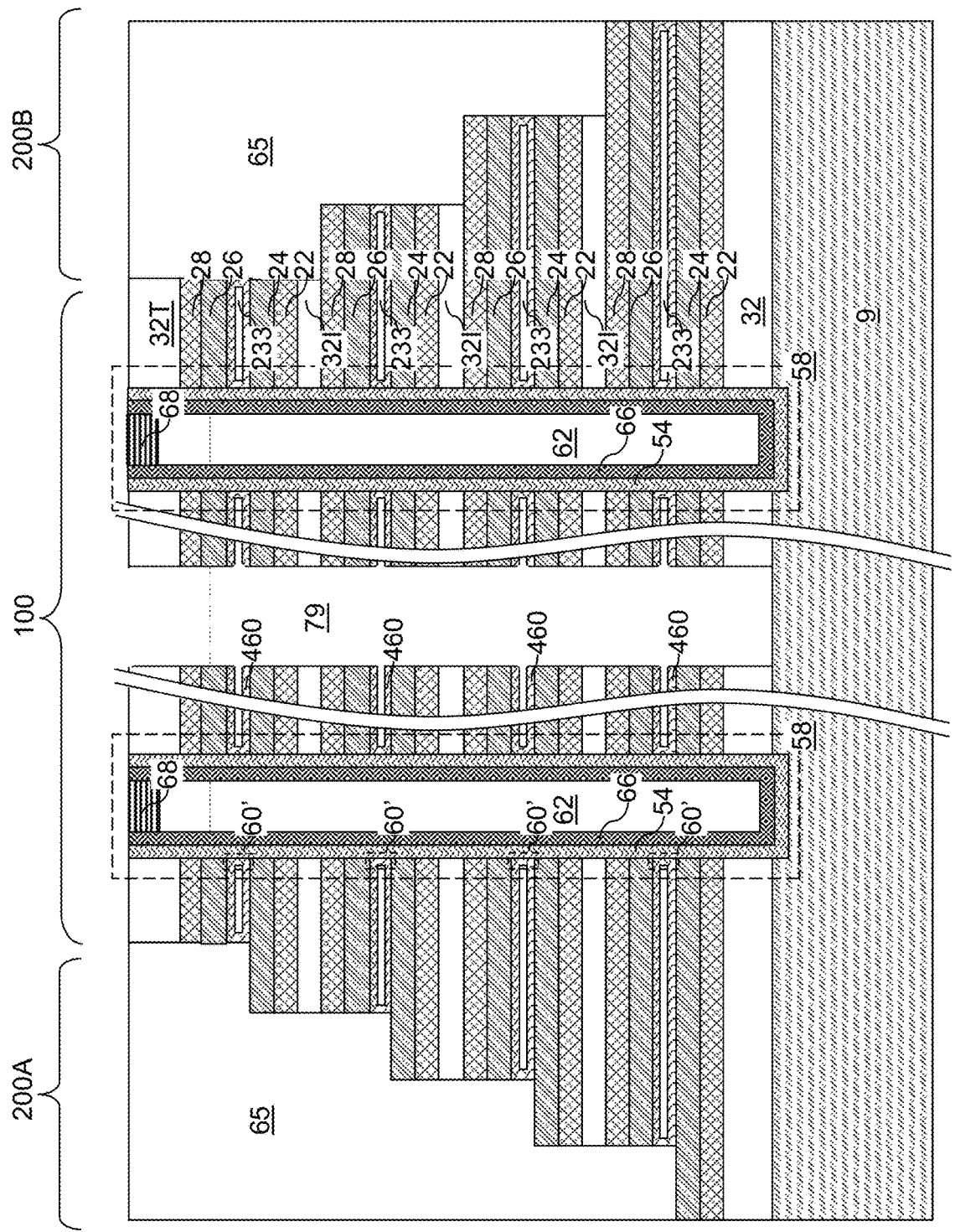
FIG. 42 is a schematic vertical cross-sectional view of the fourth exemplary structure after formation of semiconductor channel material layers according to the fourth embodiment of the present disclosure.

Referring to FIG. 42, a continuous doped semiconductor material layer can be conformally deposited in the channel-level backside recesses 233, at peripheral regions of the backside trenches 79, and over the top surface of the topmost insulating layer 32T. The continuous doped semiconductor material layer includes a semiconductor material having a doping of a second conductivity type, which is the opposite of the first conductivity type. The semiconductor material in the continuous doped semiconductor material layer can include silicon, a silicon-germanium alloy, or a compound semiconductor material. The atomic concentration of dopants of the second conductivity type in the continuous doped semiconductor material layer can be in a range from $1.0 \times 10^{14}/cm^3$ to $3.0 \times 10^{17}/cm^3$, although lesser and greater atomic concentrations can also be employed. The thickness of the continuous doped semiconductor material layer can be less than one half of the minimum height of the channel-level backside recesses 233, and can be in a range from 1 nm to 20 nm, such as from 3 nm to 10 nm, although lesser and greater thicknesses can also be employed.

An anisotropic etch process can be performed to remove portions of the continuous doped semiconductor material layer that are formed in the backside trenches 79 and over the topmost insulating layer 32T. Each remaining portion of the continuous doped semiconductor material layer in the channel-level backside recesses 233 constitutes a semiconductor channel material layer 460. The semiconductor channel material layers 460 can be conformal material layers located entirely within a respective one of the channel-level backside recess 233. Each cylindrical portion of the semiconductor channel material layers 460 that laterally surround a memory film 54 constitutes a semiconductor channel 60'. Each vertical semiconductor channel 60' contacts a bottom surface of an overlying doped semiconductor layer such as a doped semiconductor drain layer 26, and contacts a top surface of an underlying doped semiconductor layer such as a doped semiconductor source layer 24. A vertical stack of semiconductor channels 60' can be formed on horizontal surfaces of a respective vertically neighboring pair of a doped semiconductor source layer and a doped semiconductor drain layer 26 after formation of the memory films 54 and the gate electrodes 66. Each vertical stack of semiconductor channels 60' laterally surrounds a respective memory film 54 and a respective gate electrode 66.

Figure 43:
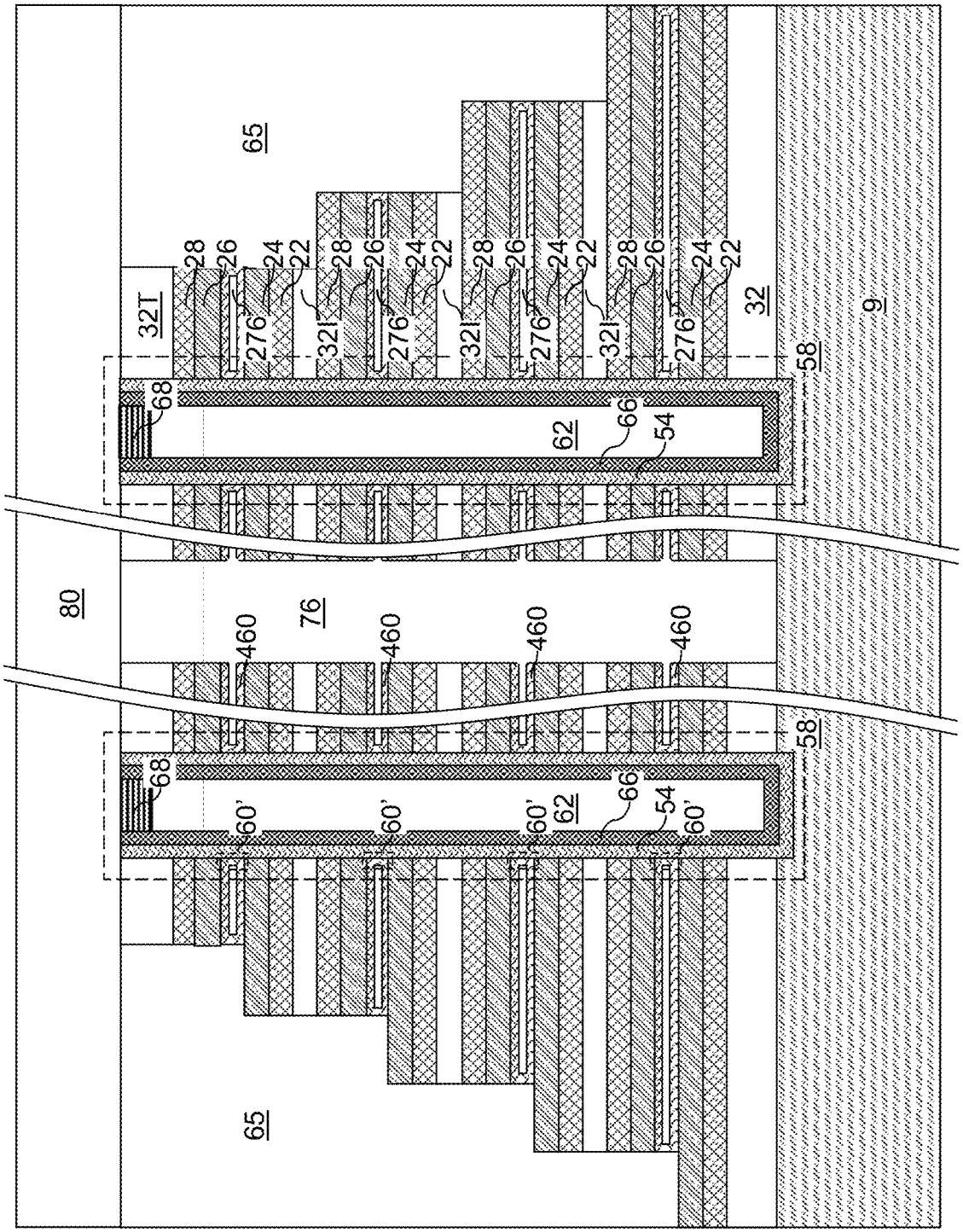
FIG. 43 is a schematic vertical cross-sectional view of the fourth exemplary structure after formation of channel-level insulating layers and backside trench fill structures according to the fourth embodiment of the present disclosure.

Referring to FIG. 43, a dielectric material can be deposited in the remaining volumes of the channel-level backside recesses 233 by a conformal deposition process. Portions of the dielectric material that fill the channel-level backside recesses 233 constitute replacement insulating layers, which are herein referred to as channel-level insulating layers 276. Portions of the dielectric material that fills the backside trenches 79 constitute backside trench fill structures 76. Portions of the dielectric fill material that overlies the topmost insulating layer 32T constitutes a contact-level dielectric layer 80. The dielectric material of the channel-level insulating layers 276, the backside trench fill structure 76, and the contact-level dielectric layer 80 can have a uniform material composition throughout, and can include a doped silicate glass, an undoped silicate glass, or organosilicate glass.

Insulating layers (276, 32I) are provided between each vertically neighboring pair of a source layer (22, 24) and a drain layer (26, 28). In one embodiment, the insulating layers (276, 32I) can have a same dielectric material composition throughout, which may be the composition of a doped silicate glass, undoped silicate glass, or organosilicate glass. In another embodiment, the channel-level insulating layers 276 may have a different composition than the inter-transistor-level insulating layers 32I. For example, channel-level insulating layers 276 in contact with a respective one of the semiconductor channels 60' can have a first dielectric material composition, and inter-transistor-level insulating layers 32I that do not contact any of the semiconductor channels 60' can have a second dielectric material composition that is different from the first dielectric material composition. In one embodiment, each semiconductor channel of a vertical stack of semiconductor channels 60' contacts a cylindrical sidewall of a respective channel-level insulating layer 276 located between a respective vertically neighboring pair of a source layer (22, 24) and a drain layer (26, 28).

Figure 44:
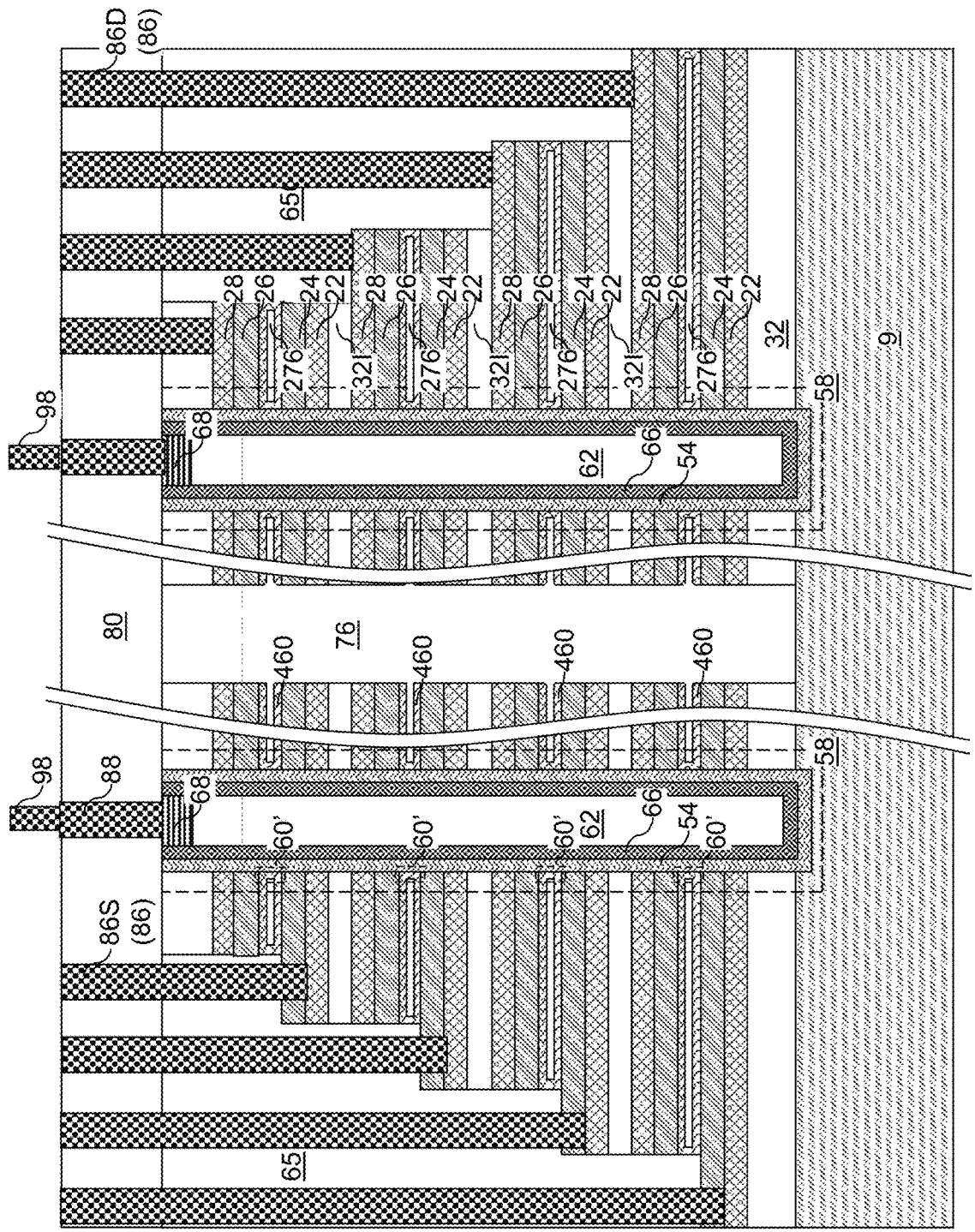
FIG. 44 is a schematic vertical cross-sectional view of the fourth exemplary structure after formation of contact via structures according to the fourth embodiment of the present disclosure.

Referring to FIG. 44, the processing steps of FIG. 9A can be performed to form contact via structures (88, 86) through the contact-level dielectric layer 80 and optionally through a retro-stepped dielectric material portion 65. The contact via structures (88, 86) include word line contact via structures 88 each of which contacts a respective one of the contact pad structures 68, and is electrically connected to a respective gate electrode 66. Further, the contact via structures (88, 86) include layer contact via structures 86 (e.g., 86S, 86D) that contact a respective one of the source layers (22, 24) and the drain layers (26, 28) within the respective staircase regions (200A, 200B). Specifically, each of the layer contact via structures (86S, 86D) can contact a horizontal surface of a respective one of the source layers (22, 24) or one of the drain layers (26, 28) exposed in the stepped surfaces in the staircase regions (200A, 200B). Word lines 98 are then formed over the contact-level dielectric layer 80 (and over gate electrodes 66, the source layers (22, 24) and the drain layers (26, 28)) and in electrical contact with the gate electrodes 66 through the contact via structures 88 and the optional contact pad structures 68.

Figure 45:
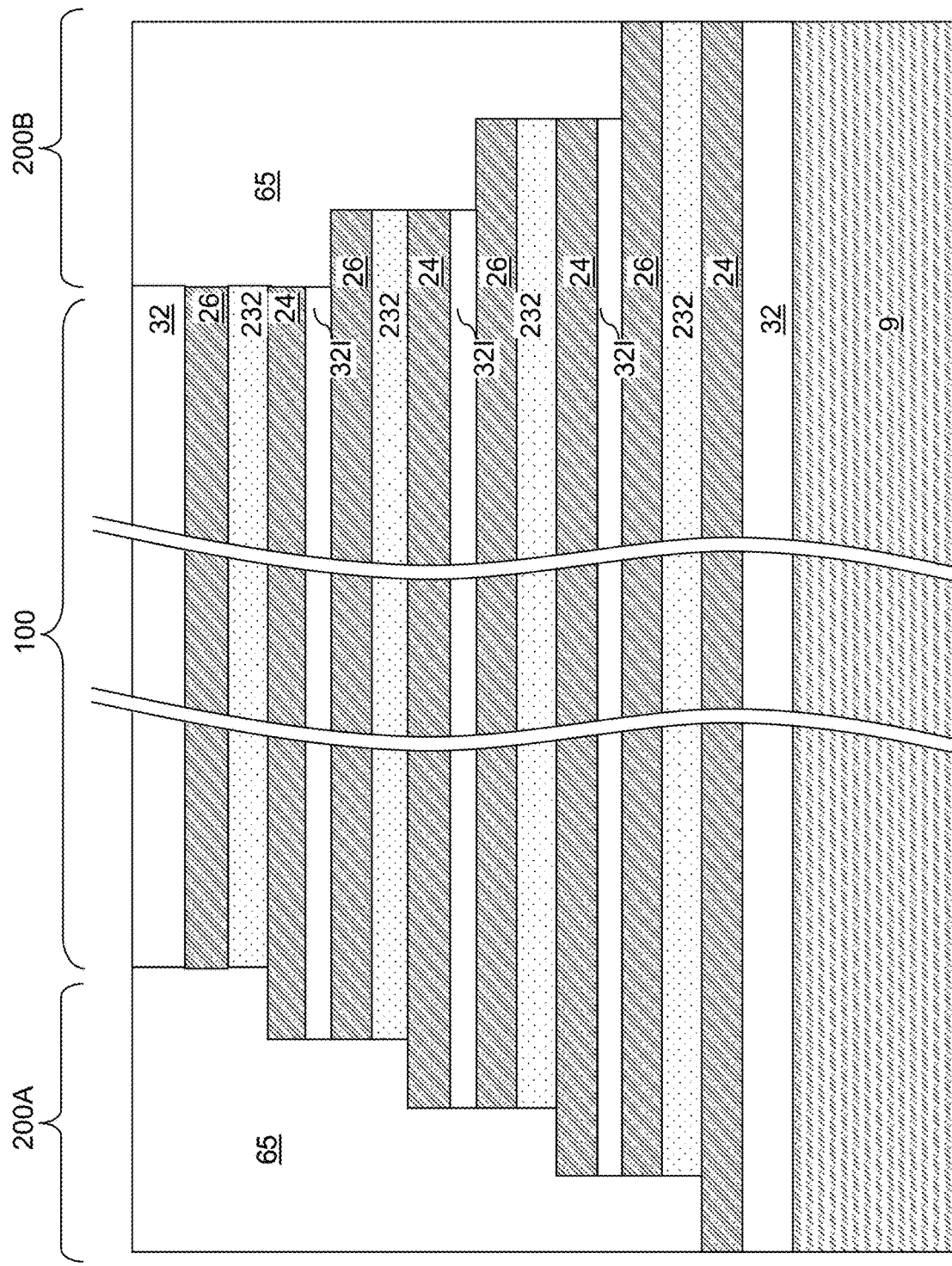
FIG. 45 is a schematic vertical cross-sectional view of an alternative embodiment of the fourth exemplary structure formed by omission of the source sacrificial layers and drain sacrificial layers at a processing step corresponding to the processing steps of FIG. 34 according to the fourth embodiment of the present disclosure.

Referring to FIG. 45, an alternative embodiment of the fourth exemplary structure formed by omission of the source sacrificial layers 42S and drain sacrificial layers 42D is illustrated at a processing step corresponding to the processing steps of FIG. 34 according to the fourth embodiment of the present disclosure. In this embodiment, the channel-level sacrificial material layers 232 may comprise silicon nitride.

Figure 46:
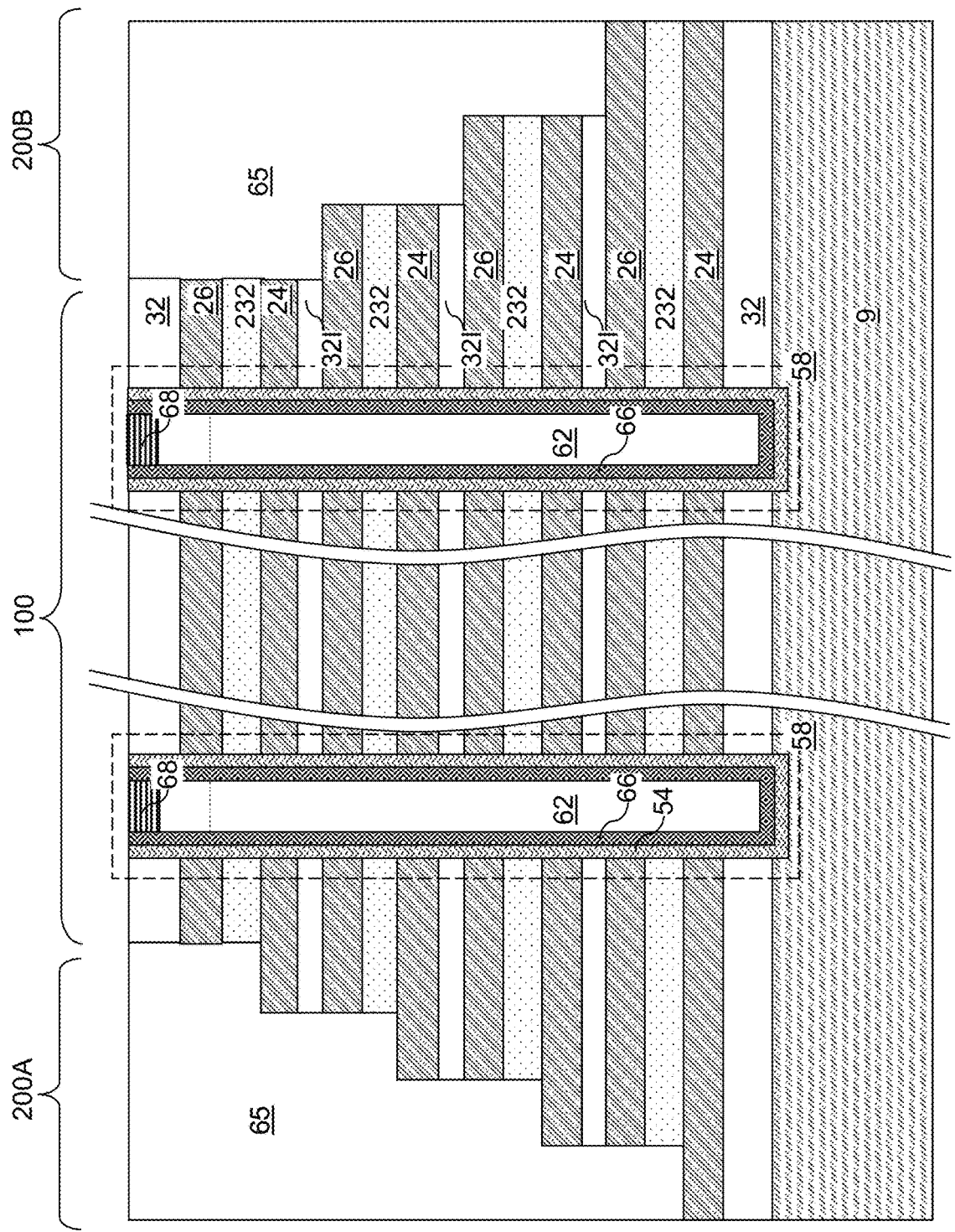
FIG. 46 is a schematic vertical cross-sectional view of the alternative embodiment of the fourth exemplary structure at a processing step corresponding to the processing steps of FIG. 37 according to the fourth embodiment of the present disclosure.

Referring to FIG. 46, the alternative embodiment of the fourth exemplary is illustrated at a processing step corresponding to the processing steps of FIG. 37.

Figure 47:
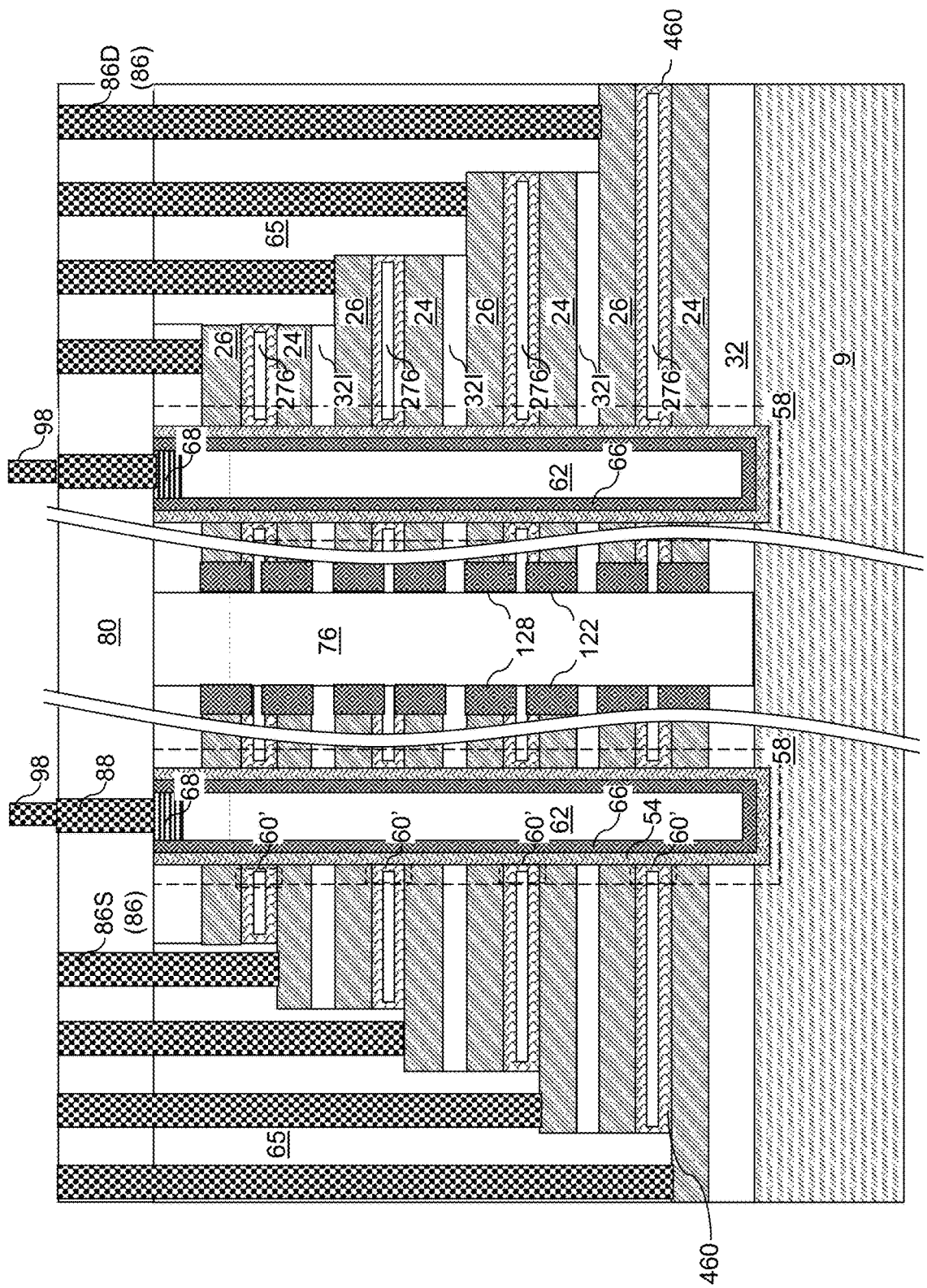
FIG. 47 is a schematic vertical cross-sectional view of the alternative embodiment of the fourth exemplary structure at a processing step corresponding to the processing steps of FIG. 44 according to the fourth embodiment of the present disclosure.

Referring to FIG. 47, the alternative embodiment of the fourth exemplary structure is illustrated at a processing step corresponding to the processing steps of FIG. 44, in which the channel-level sacrificial material layers 232 are removed by selective etching (e.g., by phosphoric acid etching) and replaced with vertical semiconductor channels 60'. Optionally, the vertical semiconductor channels 60' and the doped semiconductor source layers 24 and drain layers 26 may be recessed by a selective etch through the backside trenches 79 using a selective etch which etches the semiconductor materials (e.g., silicon) relative to the remaining insulating layers in the stack. A metal is then formed in the recesses to form the electrically conductive source line 122 and electrically conductive drain line 128 in contact with the respective semiconductor source layers 24 and drain layers 26. The metal may comprise tungsten, nickel or cobalt. If desired, a silicidation anneal may be conducted to react the metal with the respective semiconductor source layers 24 and drain layers 26 and to convert all or part of the electrically conductive source line 122 and electrically conductive drain line 128 to a metal silicide, such as tungsten silicide, nickel silicide or cobalt silicide. The electrically conductive source line 122 and electrically conductive drain line 128 may contact the semiconductor channel material layer 460 or may be formed such that they do not contact the semiconductor channel material layer 460.

Referring to all drawings of the third exemplary structure and the fourth exemplary structure, a three-dimensional memory device is provided, which comprises: an alternating stack of source layers (24 and optionally 22) and drain layers (26 and optionally 28) located over a substrate 9, an array of memory openings 49 vertically extending through the alternating stack, gate electrodes 66 each of which is located within a respective one of the array of memory openings 49 and vertically extending through each of the source layers (24 and optionally 22) and the drain layers (26 and optionally 28) of the alternating stack; memory films 54, each located in one of the array of memory openings 49 and laterally surrounding a respective one of the gate electrodes 66, and vertical stacks of semiconductor channels (360, 60') laterally surrounding a respective one of the memory films 54, wherein each of the vertical semiconductor channels (360, 60') contacts horizontal surfaces of a respective vertically neighboring pair of a source layer (24 and optionally 22) of the source layers (24 and optionally 22) and a drain layer (26 and optionally 28) of the drain layers (26 and optionally 28).

In one embodiment, word lines 98 are located over the gate electrodes 66 and over the alternating stack of the source layers and the drain layers, wherein the word lines 98 are electrically connected to the gate electrodes 66.

In one embodiment, insulating layers (132, 270, 32I) located between each vertically neighboring pair of the source layer (24 and optionally 22) and the drain layer (26 and optionally 28).

In one embodiment, the insulating layers (132, 270, 32I) comprise: channel-level insulating layers (132, 270) in contact with a respective one of the semiconductor channels (360, 60'); and inter-transistor-level insulating layers 32I that do not contact any of the semiconductor channels (360, 60').

In one embodiment, sidewalls of the channel-level insulating layers 132 are laterally recessed outward relative to sidewalls of the inter-transistor-level insulating layers 32I and relative to sidewalls of the source layers (24 and optionally 22) and the drain layers (26 and optionally 28) around each memory opening 49.

In one embodiment, each of the channel-level insulating layers 132 is in direct contact with horizontal surfaces of a respective one of the source layers (24 and optionally 22) and a respective one of the drain layers (26 and optionally 28).

In one embodiment, each of the channel-level insulating layers 270 do not contact, and is vertically spaced at least by a respective semiconductor channel material layer 460 from, the source layers (24 and optionally 22) and the drain layers (26 and optionally 28).

In one embodiment, each of the vertical stacks of semiconductor channels (360, 60') comprises a set of discrete semiconductor channels (360, 60') that are vertically spaced apart from each other without direct contacting each other.

In one embodiment, an entirety of an outer sidewall of each semiconductor channel (360, 60') contacts a cylindrical sidewall of a respective channel-level insulating layer (132, 270) located between a respective vertically neighboring pair of the source layer (24 and optionally 22) and the drain layers (26 and optionally 28).

In the third embodiment, the outer sidewall of each semiconductor channel 360 includes an upper periphery contacting a horizontal surface of one of the source layer (24 and optionally 22) and the drain layer (26 and optionally 28) in the respective vertically neighboring pair, and includes a lower periphery contacting a horizontal surface of another one of the source layer (24 and optionally 22) and the drain layer (26 and optionally 28) in the respective vertically neighboring pair.

In the fourth embodiment, each of the semiconductor channels 60' comprises a hollow cylindrical segment of a semiconductor channel material layer 460 that comprises: an upper semiconductor channel material layer segment adjoined to an upper end of a respective semiconductor channel 60'; and a lower semiconductor channel material layer segment adjoined to a lower end of the respective semiconductor channel 60'. The upper semiconductor channel material layer segment is an upper horizontal portion of the semiconductor channel material layer 460 contacting an overlying doped semiconductor material layer such as a doped semiconductor drain layer 26 at a first p-n junction. The lower semiconductor channel material layer segment is a lower horizontal portion of the semiconductor channel material layer 460 contacting an underlying doped semiconductor material layer such as a doped semiconductor source layer 24 at a second p-n junction.

In one embodiment, the semiconductor channel material layer 460 comprises a set of semiconductor channels 60' comprising the hollow cylindrical segment and additional cylindrical segments that laterally surround the gate electrodes 66.

In one embodiment, each of the source layers (24, 22) comprises a vertical stack of a doped semiconductor source layer 24 and a metallic source line 22; and each of the drain layers (26, 28) comprises a vertical stack of a doped semiconductor drain layer 26 and a metallic bit line 28.

In one embodiment, each of the memory films 54 comprises a nested layer stack including: a tunneling dielectric layer 542; a charge storage layer 544 contacting the tunneling dielectric layer 542; and a blocking dielectric layer 546 contacting the charge storage layer 544. In another embodiment, each of the memory films 54 comprises, and/or consists of, a ferroelectric material layer.

In one embodiment, the three-dimensional memory device comprises: source layer contact via structures 86S contacting a respective one of the source layers (24 and optionally 22); and drain layer contact via structures 86D contacting a respective one of the drain layers (26 and optionally 28).

In one embodiment, the source layers (24 and optionally 22) in the alternating stack have different lateral extents that decrease with a vertical distance from the substrate 9; the drain layers (26 and optionally 28) in the alternating stack have different lateral extents that decrease with a vertical distance from the substrate 9; a first retro-stepped dielectric material portion 65 contacts horizontal surfaces of the source layers (24 and optionally 22) in the alternating stack and laterally surrounds the source layer contact via structures 86S; and a second retro-stepped dielectric material portion 65 contacts horizontal surfaces of the drain layers (26 and optionally 28) in the alternating stack and laterally surrounds the drain layer contact via structures 86D.

In one embodiment, the gate electrodes 66 are vertically spaced from the substrate 9 by horizontal portions of the memory films 54; each of the gate electrodes 66 laterally surrounds a respective dielectric core 62; and contact pad structures 68 contact a top end of a respective one of the gate electrodes 66.

Figure 48:
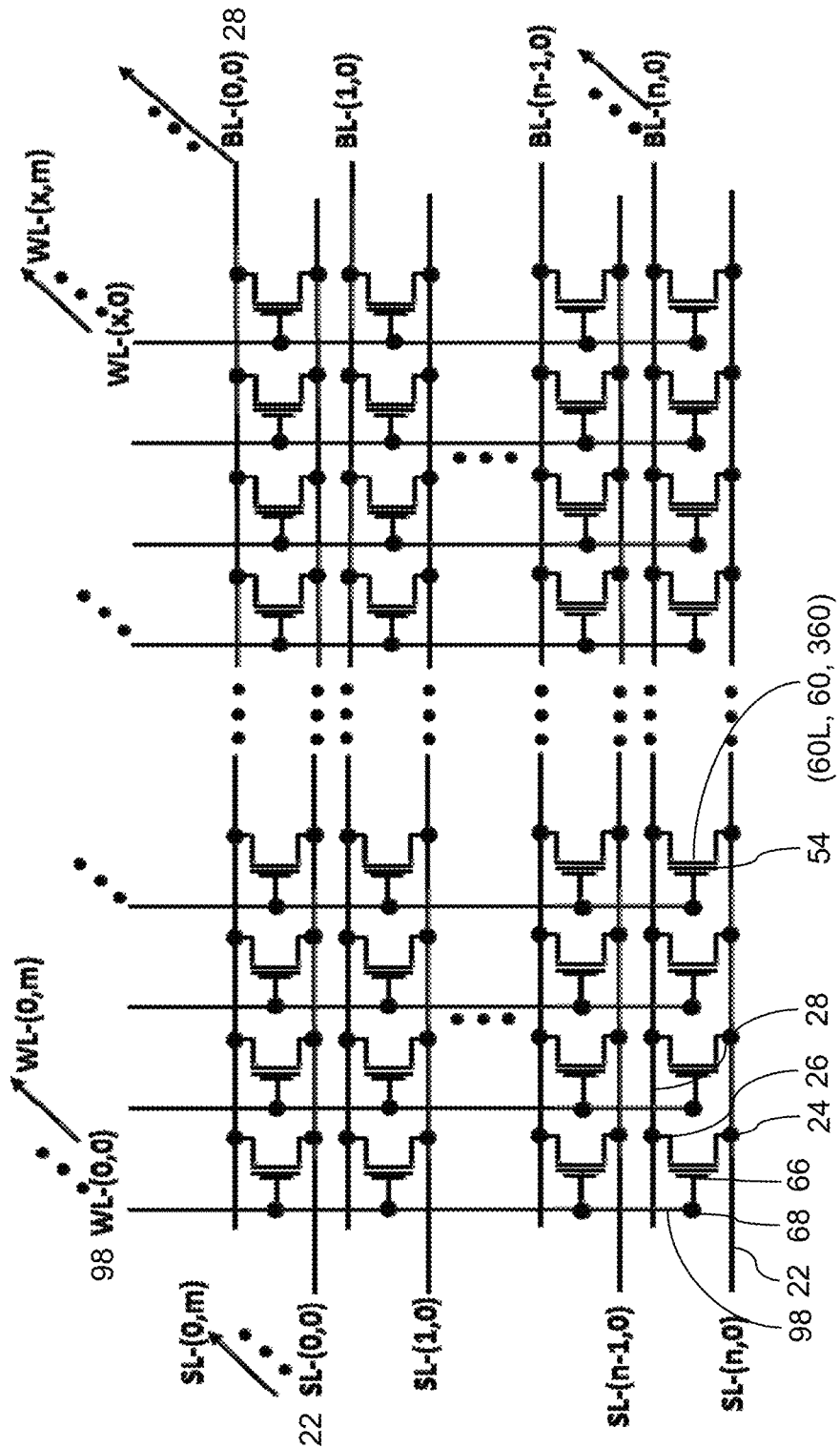
FIG. 48 is a circuit schematic of the three-dimensional memory device according to various embodiments of the present disclosure.

Referring to FIG. 48, a circuit diagram for the various embodiments of the three-dimensional memory device of the present disclosure is illustrated. Each source layer (24, 22) can be laterally bounded by a respective neighboring pair of backside trenches 79, and includes a source line (22, 122) ("SL"). The source lines SL are arranged as a three-dimensional array that extends along the vertical direction and along a horizontal direction that is parallel to the lengthwise direction of the backside trenches 79. As such, the source lines SL can be numbered with a two-dimensional coordinate (i, j), in which i refers to the level of the respective source line and j refers to the space determined by a respective neighboring pair of backside trenches 79. For example, if (n+1) source layers (24, 22) and (n+1) drain layers (26, 28) are present between each neighboring pair of backside trenches 79 with a respective distance from the substrate 9, the index i can range from 0 to n. If (m+2) backside trenches 79 are present, (m+1) source layers (24, 22) are provided per each source level and (m+1) drain layers (26, 28) are provided per each drain level. The index j can range from 0 to m.

Each drain layer (26, 28) can be laterally bounded by a respective neighboring pair of backside trenches 79, and includes a bit line (28, 128) ("BL"). The bit lines BL are arranged as a three-dimensional array that extends along the vertical direction and along the horizontal direction that is parallel to the lengthwise direction of the backside trenches 79. As such, the bit lines BL can be numbered with the same two-dimensional coordinate (i, j) as a corresponding source line SL(i, j).

The gate electrodes 66 can be arranged as a two-dimensional array and function as control gate electrodes of the memory vertical field effect transistors. Each transistor includes a respective semiconductor channel, which may comprise a portion of a semiconductor channel layer 60L, or may comprise a discrete semiconductor channel (60, 360), or may comprise a semiconductor channel 60' which is a portion of a semiconductor channel material layer 460. The gate electrodes 66 can be arranged as a two-dimensional array, which may be a hexagonal array or a rectangular array. The gate electrodes 66 extending through a same set of source lines SL and bit lines BL located between a respective neighboring pair of backside trenches 79 in the same memory block constitute a group of gate electrodes. Each gate electrode 66 in the same group (i.e., in the same memory block) electrically contacts a different word line 98 (WL).

The word lines 98 (WL) are arranged as a two-dimensional array that extends along the horizontal direction that is perpendicular to the lengthwise direction of the backside trenches 79 (and perpendicular to the direction of the source lines SL and bit lines SL). The total number of groups can be (m+1). Each gate electrode 66 within a group of gate electrodes can be individually numbered. If (x+1) gate electrodes are present within each group of electrodes, then the gate electrodes can be labeled employing a two-dimensional coordinate system (k, j), in which k is an index that runs from 0 to x and identifies an individual gate electrode within a group, and j is an index that runs from 0 to m and identifies the group to which the gate electrode belongs. Thus, a three-dimensional coordinate (i, j, k) can uniquely identify a memory cell.

In the first embodiment, the semiconductor channel is continuous in the vertical direction. Thus, activating one word line 98 activates the respective gate electrodes 66 that are electrically connected to the activated word line 98. A portion of the memory film 54 adjacent to a portion of the semiconductor channel layer 60L between a pair of activated source and drain regions is activated (e.g., programmed, erased or read) is activated. The pair of source and drain regions may be activated by applying a different voltage to the source region than to the drain region. The remaining, unselected source and drain regions (and their optional respective source and drain lines) are set to the source voltage of the selected memory cell to avoid activating the unselected memory cells.

In the second through fourth embodiments, the semiconductor channels are discontinuous in the vertical direction. In these embodiments, one word line 98 is activated to activate the respective gate electrodes 66 that are electrically connected to the activated word line 98. All memory films 54 may be activated in these embodiments.

The embodiments of the present disclosure provide a bit addressable, high density three dimensional memory array. The semiconductor channel may be made wider, which provides a tighter threshold voltage distribution. The individual source lines (22, 122) and bit lines (28, 128) for each memory cell provide a higher cell current for increased memory speed.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their pentirety.

What is claimed is:

1. A three-dimensional memory device comprising:
   an alternating stack of source layers and drain layers located over a substrate;
   an array of memory openings vertically extending through the alternating stack;
   gate electrodes, each gate electrode located in one of the array of memory openings and vertically extending through each of the source layers and the drain layers of the alternating stack;
   memory films, each located in one of the array of memory openings and laterally surrounding a respective one of the gate electrodes; and
   vertical stacks of semiconductor channels laterally surrounding a respective one of the memory films, wherein each of the vertical semiconductor channels contacts horizontal surfaces of a respective vertically neighboring pair of a source layer of the source layers and a drain layer of the drain layers.

2. The three-dimensional memory device of claim 1, further comprising word lines located over the gate electrodes and over the alternating stack of the source layers and the drain layers, wherein the word lines are electrically connected to the gate electrodes.

3. The three-dimensional memory device of claim 1, further comprising insulating layers located between each vertically neighboring pair of the source layer the drain layer.

4. The three-dimensional memory device of claim 3, wherein the insulating layers comprise:
   channel-level insulating layers in contact with a respective one of the semiconductor channels; and
   inter-transistor-level insulating layers that do not contact any of the semiconductor channels.

5. The three-dimensional memory device of claim 4, wherein sidewalls of the channel-level insulating layers are laterally recessed outward relative to sidewalls of the inter-transistor-level insulating layers and relative to sidewalls of the source layers and the drain layers around each memory opening.

6. The three-dimensional memory device of claim 4, wherein each of the channel-level insulating layers is in direct contact with horizontal surfaces of a respective one of the source layers and a respective one of the drain layers.

7. The three-dimensional memory device of claim 4, wherein each of the channel-level insulating layers do not contact, and is vertically spaced at least by a respective semiconductor channel material layer from the source layers and the drain layers.

8. The three-dimensional memory device of claim 1, wherein each of the vertical stacks of semiconductor channels comprises a set of discrete semiconductor channels that are vertically spaced apart from each other without directly contacting each other.

9. The three-dimensional memory device of claim 8, wherein an entirety of an outer sidewall of each semiconductor channel contacts a cylindrical sidewall of a respective channel-level insulating layer located between a respective vertically neighboring pair of the source layer and the drain layer.

10. The three-dimensional memory device of claim 9, wherein the outer sidewall includes an upper periphery contacting a horizontal surface of one of the source layer and the drain layer in the respective vertically neighboring pair, and includes a lower periphery contacting a horizontal surface of another one of the source layer and the drain layer in the respective vertically neighboring pair.

11. The three-dimensional memory device of claim 9, wherein each of the semiconductor channels comprises a hollow cylindrical segment of a semiconductor channel material layer that comprises:
   an upper semiconductor channel material layer segment adjoined to an upper end of a respective semiconductor channel; and
   a lower semiconductor channel material layer segment adjoined to a lower end of the respective semiconductor channel.

12. The three-dimensional memory device of claim 11, wherein the semiconductor channel material layer comprises a set of semiconductor channels comprising the hollow cylindrical segment and additional cylindrical segments that laterally surround the gate electrodes.

13. The three-dimensional memory device of claim 1, wherein:
   each of the source layers comprises a vertical stack of a doped semiconductor source layer and a metallic source line; and
   each of the drain layers comprises a vertical stack of a doped semiconductor drain layer and a metallic bit line.

14. The three-dimensional memory device of claim 1, wherein each of the memory films comprises a layer stack including:
   a tunneling dielectric layer;
   a charge storage layer contacting the tunneling dielectric layer; and
   a blocking dielectric layer contacting the charge storage layer.

15. The three-dimensional memory device of claim 1, wherein each of the memory films comprises a ferroelectric material layer.

16. A method of forming a three-dimensional memory device, comprising:
   forming an alternating stack of doped semiconductor source layers and doped semiconductor drain layers over a substrate;
   forming memory openings vertically extending through the alternating stack;
   forming a memory film and a gate electrode in each memory opening, wherein the memory film and the gate electrode vertically extend through each of the doped semiconductor source layers and the doped semiconductor drain layers of the alternating stack; and
   forming a vertical stack of semiconductor channels on horizontal surfaces of a respective vertically neighboring pair of a doped semiconductor source layer of the doped semiconductor source layers and a doped semiconductor drain layer of the doped semiconductor drain layers prior to, or after, formation of the memory film and the gate electrode, wherein each vertical stack of semiconductor channels laterally surrounds the respective memory film and the respective gate electrode.

17. The method of claim 16, further comprising forming insulating layers between each vertically neighboring pair of a doped semiconductor source layer of the doped semiconductor source layers and a doped semiconductor drain layer of the doped semiconductor drain layers, wherein the insulating layers comprise:
   channel-level insulating layers formed at levels of the semiconductor channels; and
   inter-transistor-level insulating layers that are vertically spaced from the semiconductor channels.

18. The method of claim 17, wherein:

the inter-transistor-level insulating layers and the channel-level insulating layers are formed prior to formation of the memory openings; and the method further comprises:

forming annular cavities by laterally recessing sidewalls of the channel-level insulating layers relative to sidewalls of the doped semiconductor source layers, doped semiconductor drain layers, and inter-transistor-level insulating layers;

conformally depositing a semiconductor material in the annular cavities; and removing portions of the conformally deposited semiconductor material from outside the annular cavities, wherein remaining portions of the conformally deposited semiconductor material in the annular cavities constitute the vertical stacks of semiconductor channels.

19. The method of claim 17, wherein:

forming the inter-transistor-level insulating layers and channel-level sacrificial material layers occurs prior to formation of the memory openings, wherein the channel-level sacrificial material layers are formed at levels at which the channel-level insulating layers are subsequently formed;

forming backside recesses by removing the channel-level sacrificial material layers selective to the doped semiconductor source layers, doped semiconductor drain layers, and the inter-transistor-level insulating layers; and depositing a semiconductor channel material layer in each backside recess, wherein each cylindrical portion of the semiconductor channel material layers that laterally surround a memory film constitutes one of the semiconductor channels.

20. The method of claim 19, wherein the channel-level insulating layers are formed by depositing an insulating material in volumes of the backside recesses that are not filled after formation of the semiconductor channel material layers.

\* \* \* \* \*